(12) United States Patent
Nakamura

(10) Patent No.: US 11,767,431 B2
(45) Date of Patent: *Sep. 26, 2023

(54) COLORING COMPOSITION, METHOD FOR PRODUCING COLORING COMPOSITION, COLOR FILTER, PATTERN FORMING METHOD, SOLID-STATE IMAGING DEVICE, AND IMAGE DISPLAY DEVICE

(71) Applicant: FUJIFILM Corporation, Tokyo (JP)

(72) Inventor: Shoichi Nakamura, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 236 days.

This patent is subject to a terminal disclaimer.

(21) Appl. No.: 17/205,014

(22) Filed: Mar. 18, 2021

(65) Prior Publication Data

US 2021/0199864 A1 Jul. 1, 2021

Related U.S. Application Data

(63) Continuation of application No. 16/021,940, filed on Jun. 28, 2018, now Pat. No. 11,002,895, which is a continuation of application No. PCT/JP2017/000076, filed on Jan. 5, 2017.

(30) Foreign Application Priority Data

Jan. 8, 2016 (JP) .................................. 2016-002746

(51) Int. Cl.
| | |
|---|---|
| *G02B 5/20* | (2006.01) |
| *G02B 5/22* | (2006.01) |
| *G03F 7/00* | (2006.01) |
| *C09B 67/22* | (2006.01) |
| *C09B 67/46* | (2006.01) |
| *C09B 67/08* | (2006.01) |
| *C09D 133/14* | (2006.01) |
| *G03F 7/027* | (2006.01) |
| *G03F 7/105* | (2006.01) |
| *G03F 7/11* | (2006.01) |
| *G03F 7/20* | (2006.01) |
| *G03F 7/32* | (2006.01) |
| *C08F 220/06* | (2006.01) |
| *C08F 220/34* | (2006.01) |
| *C08F 222/10* | (2006.01) |

(52) U.S. Cl.
CPC ........ *C09B 67/0013* (2013.01); *C09B 67/009* (2013.01); *C09B 67/0034* (2013.01); *C09B 67/0035* (2013.01); *C09B 67/0085* (2013.01); *C09D 133/14* (2013.01); *G02B 5/20* (2013.01); *G02B 5/201* (2013.01); *G02B 5/223* (2013.01); *G03F 7/0007* (2013.01); *G03F 7/027* (2013.01); *G03F 7/105* (2013.01); *G03F 7/11* (2013.01); *G03F 7/20* (2013.01); *G03F 7/32* (2013.01); *C08F 220/06* (2013.01); *C08F 220/346* (2020.02); *C08F 222/106* (2020.02)

(58) Field of Classification Search
CPC .......... G02B 5/20; G02B 5/201; G02B 5/223; G03F 7/027; G03F 7/11; G03F 7/20; G03F 7/32; C09B 67/0013; C09B 67/0034; C09B 67/0035; C09B 67/0085; C09B 67/009; C08F 220/24; C09D 133/14

See application file for complete search history.

(56) References Cited

U.S. PATENT DOCUMENTS

| | | | |
|---|---|---|---|
| 11,002,895 B2 * | 5/2021 | Nakamura | .......... C09B 67/0085 |
| 2013/0012626 A1 | 1/2013 | Shimanaka et al. | |
| 2015/0192699 A1 | 7/2015 | Choi et al. | |
| 2016/0326348 A1 | 11/2016 | Aoyagi | |
| 2016/0327710 A1 * | 11/2016 | Murakami | ............. G02B 5/223 |
| 2017/0009075 A1 | 1/2017 | Sakamoto et al. | |
| 2018/0306953 A1 | 10/2018 | Nakamura | |

FOREIGN PATENT DOCUMENTS

| | | | |
|---|---|---|---|
| EP | 2 921 531 A1 | 9/2015 | |
| JP | H09-203808 A | 8/1997 | |
| JP | 2000-239594 A | 9/2000 | |
| JP | 2001-188120 A | 7/2001 | |
| JP | 2003-295427 A | 10/2003 | |
| JP | 2004-285163 A | 10/2004 | |
| JP | 2004-325735 A | 11/2004 | |
| JP | 2005-82751 A | 3/2005 | |
| JP | 2007-308712 A | 11/2007 | |
| JP | 2007308712 * | 11/2007 | ............. C09D 11/00 |
| JP | 2008-58683 A | 3/2008 | |
| JP | 2009-035671 A | 2/2009 | |

(Continued)

OTHER PUBLICATIONS

Office Action dated Jan. 5, 2022, issued by the Japanese Patent Office in Japanese application No. 2020-187765.

Communication dated Oct. 13, 2020, from the Japanese Patent Office in Japanese application No. 2017-560392.

Communication dated Oct. 17, 2019, issued by the Korean Intellectual Property Office in Korean Application No. 10-2018-7018803.

Office Action dated Aug. 25, 2020 from Taiwanese Patent Office in TW Application No. 105143253.

Communication dated Apr. 27, 2020 from the Taiwanese Patent Office in TW Application No. 105143253.

(Continued)

*Primary Examiner* — Bijan Ahvazi
(74) *Attorney, Agent, or Firm* — Sughrue Mion, PLLC

(57) ABSTRACT

Provided are a coloring composition capable of producing a film having excellent light fastness, and the like, a method for producing a coloring composition, a color filter, a pattern forming method, a solid-state imaging device, and an image display device. The coloring composition includes a coated pigment in which at least a portion of a surface of a yellow pigment is coated with a resin, a halogenated phthalocyanine pigment, a dispersant having an acid value of 40 mgKOH/g or more, and a curable compound.

8 Claims, No Drawings

(56) References Cited

FOREIGN PATENT DOCUMENTS

| | | | | |
|---|---|---|---|---|
| JP | 2009-062457 A | 3/2009 | | |
| JP | 2009-84302 A | 4/2009 | | |
| JP | 2009-149849 A | 7/2009 | | |
| JP | 2010-84119 A | 4/2010 | | |
| JP | 2013-216714 A | 10/2013 | | |
| JP | 2014-012813 | * 1/2014 | ............ | C09B 67/46 |
| JP | 2014-12813 A | 1/2014 | | |
| JP | 2014-44362 A | 3/2014 | | |
| JP | 2014044362 | * 3/2014 | ............... | G02B 5/20 |
| JP | 2014-189614 A | 10/2014 | | |
| JP | 2015-96913 A | 5/2015 | | |
| JP | 2015-110711 A | 6/2015 | | |
| JP | 2015-120918 A | 7/2015 | | |
| JP | 2015-135476 A | 7/2015 | | |
| JP | 2015-145952 A | 8/2015 | | |
| JP | 2015-151467 A | 8/2015 | | |
| JP | 2015-151530 A | 8/2015 | | |
| JP | 2015-166445 A | 9/2015 | | |
| JP | 2015-197677 A | 11/2015 | | |
| JP | 2016-180020 A | 10/2016 | | |
| TW | 201527443 A | 7/2015 | | |
| TW | 201527881 A | 7/2015 | | |
| WO | 2011/118557 A1 | 9/2011 | | |
| WO | 2014/173487 A1 | 10/2014 | | |
| WO | 2015/118720 A1 | 8/2015 | | |
| WO | 2015/122286 A | 8/2015 | | |

OTHER PUBLICATIONS

Communication dated Apr. 21, 2020 from the Korean Intellectual Property Office in KR Application No. 10-2018-7018803.
Communication dated Apr. 9, 2019, from the Japanese Patent Office in Japanese application No. 2017-560392.
Communication dated Dec. 24, 2019 from Japanese Patent Office in Japanese Application No. 2017-560392.
International Search Report (ISR) dated Feb. 14, 2017, issued by the International Searching Authority in application No. PCT/JP2017/000076.
Written Opinion (WO) dated Feb. 14, 2017, issued by the International Searching Authority in application No. PCT/JP2017/000076.
International Preliminary Report on Patentability (IPRP) with translation of Written Opinion dated Jul. 10, 2018, issued by the International Searching Authority in application No. PCT/JP2017/000076.
Office Action dated Jan. 21, 2021, from the Taiwanese Intellectual Property Office in Taiwanese application No. 105143253.
Office Action from the Japanese Patent Office dated Aug. 4, 2020 in Japanese Application No. 2017-560392.

* cited by examiner

COLORING COMPOSITION, METHOD FOR PRODUCING COLORING COMPOSITION, COLOR FILTER, PATTERN FORMING METHOD, SOLID-STATE IMAGING DEVICE, AND IMAGE DISPLAY DEVICE

CROSS-REFERENCE TO RELATED APPLICATIONS

This application is a Continuation of U.S. application Ser. No. 16/021,940 filed Jun. 28, 2018, which is a Continuation of PCT International Application No. PCT/JP2017/000076 filed on Jan. 5, 2017, which claims priority under 35 U.S.C § 119(a) to Japanese Patent Application No. 2016-002746 filed on Jan. 8, 2016. Each of the above application(s) is hereby expressly incorporated by reference, in its entirety, into the present application.

BACKGROUND OF THE INVENTION

1. Field of the Invention

The present invention relates to a coloring composition. It further relates to a method for producing a coloring composition, and a color filter, a pattern forming method, a solid-state imaging device, and an image display device, each using the coloring composition.

2. Description of the Related Art

In recent years, as a digital camera, a mobile phone with a camera, and the like have been further spreading, there has been an increasing demand for a solid-state imaging device such as a charge coupled device (CCD) image sensor. A color filter has been used as a key device in a display or optical element.

For a coloring composition for a color filter, a pigment may be used as a coloring in some cases. For example, in JP2013-216714A and JP2009-149849A, it is described that a color filter and the like are produced using a coloring composition including a coated pigment in which at least a portion of a surface of the pigment is coated with a resin.

Moreover, as a coloring composition for producing a green color filter, a coloring composition including a halogenated phthalocyanine pigment and a yellow pigment, and the like are known. For example, in JP2015-151467A, it is described that a green color filter is produced using a coloring composition containing a halogenated zinc phthalocyanine pigment and a yellow pigment. In addition, in Examples of the publication, Color Index (C. I.) Pigment Yellow 150 or C. I. Pigment Yellow 185 is used as the yellow pigment.

SUMMARY OF THE INVENTION

In recent years, a color filter has been required to have a further improvement in light fastness.

Furthermore, a color filter having a protective layer or the like formed on the surface thereof is used in some cases. According to the studies conducted by the present inventors, it could be found that light fastness in a case where a protective layer or the like is formed on a surface of a color filter is easily deteriorated than that in a case where the protective layer or the like is not formed.

Therefore, an object of the present invention is to provide a coloring composition capable of producing a film having excellent light fastness, and the like, a method for producing a coloring composition, a color filter, a pattern forming method, a solid-state imaging device, and an image display device.

The present inventors have conducted extensive studies, and as a result, they have found that a film having excellent light fastness can be produced by using a coloring composition including a coated pigment in which at least a portion of a surface of a yellow pigment is coated with a resin, a halogenated phthalocyanine pigment, a dispersant having an acid value of 40 mgKOH/g or more, and a curable compound, leading to completion of the present invention. The present invention provides the following aspects.

<1> A coloring composition comprising:

a coated pigment in which at least a portion of a surface of a yellow pigment is coated with a resin;

a halogenated phthalocyanine pigment;

a dispersant having an acid value of 40 mgKOH/g or more; and a curable compound.

<2> The coloring composition as described in <1>, in which the yellow pigment is an isoindoline-based yellow pigment.

<3> The coloring composition as described in <1> or <2>, in which the halogenated phthalocyanine pigment is a halogenated zinc phthalocyanine pigment.

<4> The coloring composition as described in any one of <1> to <3>, in which an acid value of the resin coating the surface of the yellow pigment is 40 to 200 mgKOH/g.

<5> The coloring composition as described in <4>, in which a difference between the acid value of the resin coating the surface of the yellow pigment and the acid value of the dispersant is 100 mgKOH/g or less.

<6> The coloring composition as described in any one of <1> to <5>, in which a weight-average molecular weight of the resin coating the surface of the yellow pigment is 5,000 to 40,000.

<7> The coloring composition as described in any one of <1> to <6>, further comprising a pigment derivative having a basic group.

<8> The coloring composition as described in <7>, in which the basic group is an amino group.

<9> The coloring composition as described in any one of <1> to <8>, in which the curable compound includes a compound having a group having an ethylenically unsaturated bond, and the coloring composition further comprises a photopolymerization initiator.

<10> A method for producing the coloring composition as described in any one of <1> to <9>, comprising a step of dispersing at least one selected from a coated pigment in which at least a portion of a surface of a yellow pigment is coated with a resin and a halogenated phthalocyanine pigment in the presence of a dispersant having an acid value of 40 mgKOH/g or more.

<11> A color filter using the coloring composition as described in any one of <1> to <9>.

<12> A pattern forming method comprising:

a step of forming a coloring composition layer on a support, using the coloring composition as described in any one of <1> to <9>; and a step of forming a pattern on the coloring composition layer by a photolithographic method or a dry etching method.

<13> A solid-state imaging device comprising the color filter as described in <11>.

<14> An image display device comprising the color filter as described in <11>.

According to the present invention, it is possible to provide a coloring composition capable of producing a film having excellent light fastness, and the like, a method for producing a coloring composition, a color filter, a pattern forming method, a solid-state imaging device, and an image display device.

DESCRIPTION OF THE PREFERRED EMBODIMENTS

Hereinafter, the contents of the present invention will be described in detail.

In citations for a group (atomic group) in the present specification, in a case where the group is denoted without specifying whether it is substituted or unsubstituted, the group includes both a group having no substituent and a group having a substituent. For example, an "alkyl group" includes not only an alkyl group having no substituent (unsubstituted alkyl group), but also an alkyl group having a substituent (substituted alkyl group).

In the present specification, light means actinic rays or radiation. Further, "actinic rays" or "radiation" means, for example, a bright line spectrum of a mercury lamp, far ultraviolet rays typified by an excimer laser, extreme ultraviolet rays (EUV light), X-rays, electron beams, or the like.

In the present specification, "exposure" includes, unless otherwise specified, not only exposure by a mercury lamp, far ultraviolet rays typified by an excimer laser, X-rays, EUV light, or the like, but also lithography with particle rays such as electron beams and ion beams.

In the present specification, a numerical range expressed using "to" means a range that includes the preceding and succeeding numerical values of "to" as the lower limit value and the upper limit value, respectively.

In the present specification, the total solid content refers to a total mass of the components remaining in a case where a solvent is excluded from all the components of a coloring composition.

In the present specification, "(meth)acrylate" represents either or both of acrylate and methacrylate, "(meth)acryl" represents either or both of acryl and methacryl, "(meth) allyl" represents either or both of allyl and methallyl, and "(meth)acryloyl" represents either or both of acryloyl and methacryloyl.

In the present specification, a term "step" includes not only an independent step, but also a step which is not clearly distinguished from other steps in a case where an intended action of the step is obtained.

In the present specification, a weight-average molecular weight (Mw) and a number-average molecular weight (Mn) are defined as values in terms of polystyrene by gel permeation chromatography (GPC) measurement.

In the present invention, a pigment means an insoluble compound which is sparingly soluble in a specific solvent. It typically means a compound which exists in a state where it is dispersed as particles in a composition. Here, examples of the solvent include the solvents exemplified in the section of a solvent which will be described later. The pigment used in the present invention is preferably, for example, an insoluble compound which is hard to dissolve in propylene glycol monomethyl ether acetate.

<Coloring Composition>

The coloring composition of the present invention includes a coated pigment in which at least a portion of a surface of a yellow pigment is coated with a resin, a halogenated phthalocyanine pigment, a dispersant having an acid value of 40 mgKOH/g or more, and a curable compound.

By using the coloring composition as configured above, it is possible to produce a film having excellent light fastness. In particular, a film formed using the coloring composition of the present invention can suppress the discoloration of the halogenated phthalocyanine pigment upon irradiation with light to suppress the variation in green spectra, and thus, has preferred characteristics as a green color filter. A mechanism by which such effects of the present invention are obtained is presumed to be as follows.

It is presumed that in a case where a film formed using a coloring composition including a yellow pigment and a halogenated phthalocyanine pigment is irradiated with light, the yellow pigment and the halogenated phthalocyanine pigment, excited by irradiation with light, interact with each other to reduce light fastness. Particularly, it is presumed that the yellow pigment activated by excitement reacts with the halogenated phthalocyanine pigment to cause the halogenated phthalocyanine pigment to be easily discolored. Further, in a case where a protective layer or the like is further formed on a surface of a film formed using a coloring composition including a yellow pigment and a halogenated phthalocyanine pigment to shield the film from air or the like, it is difficult for the excitement state of the halogenated phthalocyanine pigment or the yellow pigment to be quenched by oxygen. As a result, it is presumed that the state activated by irradiation with light persists, and thus, the yellow pigment and the halogenated phthalocyanine pigment more easily react with each other, and in particular, the light fastness is easily reduced.

According to the present invention, it is presumed that by using a yellow pigment having at least a portion of the surface thereof coated with a resin and using a dispersant having an acid value of 40 mgKOH/g or more, the interaction between the yellow pigment and the halogenated phthalocyanine pigment after irradiation with light can be controlled, thereby suppressing the halogenated phthalocyanine pigment from be discolored, for example, and thus obtaining excellent light fastness. In addition, even in a case where a protective layer or the like is formed on a surface of a film formed using the coloring composition of the present invention, the decomposition reaction is suppressed, and thus, excellent light fastness is obtained. Further, it is also possible to produce a film in which an acicular crystal is hard to generate, for example.

In addition, there have been cases where a surface of a pigment is coated with a resin for the purpose of improving the dispersibility of a pigment or the durability of the pigment itself in the related art, it is a remarkable effect unpredictable from the coated pigment in the related art that discoloration of a halogenated phthalocyanine pigment to be used in combination with the pigment can be suppressed by coating a yellow pigment with a resin.

<<Coated Pigment>>

The coloring composition of the present invention includes a coated pigment in which at least a portion of a surface of a yellow pigment is coated with a resin. Further, the coated pigment of the present invention is a material formed by adsorbing a resin chemically or physically onto a surface of a yellow pigment in a powder state, which is different from a material having a yellow pigment not coated with a resin (also referred to as an unprocessed yellow pigment) dispersed in a composition including a solvent and a dispersant. That is, the coated pigment of the present invention is a pigment as powder obtained by allowing a resin to undergo a reaction with a yellow pigment in a dry or wet state to coat at least a portion of a surface of the yellow pigment with the resin, followed by drying, if desired.

The coated pigment of the present invention is formed by coating at least a portion of a surface of a yellow pigment with the resin, in which the entire surface of the yellow pigment may be coated with the resin or a part of the surface of the yellow pigment may be exposed to the resin.

Here, the coating rate of the resin can be calculated by measuring a rate (liberation rate) of the resin liberated from the coated pigment. Further, the amount of the resin to be liberated can be calculated by washing the coated pigment with 1-methoxy-2-propanol. Specifically, 10 g of the coated pigment is introduced into 100 ml of 1-methoxy-2-propanol, and shaken at room temperature for 3 hours in a shaker. Next, particles are settled down at 80,000 rpm for 8 hours by a centrifuge, and the solid content of the supernatant liquid portion is determined by a dry method. In addition, the mass of the resin liberated from a processed colorant is determined and a liberation rate (%) is calculated from a ratio to the mass of the resin used in an initial treatment.

The liberation rate of a commercially available processed colorant can be measured by the following method. That is, the liberation rate is calculated as "the mass of the resin used for the initial treatment" by dissolving the entire coated pigment in a solvent (for example, dimethyl sulfoxide, dimethyl formamide, formic acid, and sulfuric acid) in which the yellow pigment is dissolved, and then separating the resin and the yellow pigment with an organic solvent using a difference in solubility. In addition, the coated pigment is washed with 1-methoxy-2-propanol, and the liberation amount obtained is divided with "the mass of the resin used for the initial treatment" to determine a liberation rate (%).

As the liberation rate of the resin is smaller, the coating rate onto the yellow pigment is higher, whereby excellent light fastness is easily obtained. A preferred range of the liberation rate of the resin is 30% or less, more preferably 20% or less, most preferably 15% or less, and ideally 0%.

The mass ratio of the yellow pigment to the resin in the coated pigment is preferably yellow pigment:resin=1:0.01 to 1:2, more preferably 1:0.05 to 1:1, and still more preferably 1:0.1 to 1:0.6. According to this aspect, the above-mentioned effect can be easily obtained.

The average particle diameter of the coated pigments is preferably 10 to 100 nm, and more preferably 15 to 50 nm. The average particle diameter of the coated pigments can be determined by measuring the particle size of 100 coated pigments through observation using a scanning electron microscope (SEM) or a transmission electron microscope (TEM), and calculating an average value thereof.

In the coloring composition of the present invention, the content of the coated pigments is preferably 0.1% to 80% by mass with respect to the total solid content of the coloring composition. The lower limit is, for example, more preferably 1% by mass or more, and still more preferably 5% by mass or more. The upper limit is, for example, more preferably 60% by mass or less, and still more preferably 50% by mass or less. The coated pigments can be used singly or in combination of two or more kinds thereof. In a case where two or more kinds of the coated pigments are included, a total content thereof is preferably in the range.

Hereinafter, the coated pigment will be described in detail.

(Yellow Pigment)

The yellow pigment may be either an inorganic pigment or an organic pigment, with the organic pigment being preferable. Examples of the organic pigment include an azo-based yellow pigment, a pyrazolone-based yellow pigment, a benzimidazolone-based yellow pigment, a quinoxaline-based yellow pigment, an azomethine-based yellow pigment, a quinophthalone-based yellow pigment, an isoindolinone-based yellow pigment, an isoindoline-based yellow pigment, and an anthraquinone-based yellow pigment. Examples of the yellow pigment include the following pigments.

C. I. Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, 214, and the like.

Furthermore, as the yellow pigment, the quinophthalone compounds described in JP2013-54339A and JP2014-26228A can also be used.

In the present invention, the yellow pigment is preferably the isoindoline-based yellow pigment for a reason that the effect of the present invention is more remarkably easily obtained. By using a coated pigment in which an isoindoline-based yellow pigment is coated with a resin, particularly excellent light fastness is obtained. Examples of the isoindoline-based yellow pigment include C. I. Pigment Yellow 139 and 185, with C. I. Pigment Yellow 185 being preferable.

(Coating Resin)

In the present invention, a resin (hereinafter also referred to as a coating resin) that coats the yellow pigment preferably has a group (also referred to as a pigment adsorptive group) in the pigment. Examples of the pigment adsorptive group include an acid group, a colorant structure, a heterocyclic structure, and an acyclic heteroatom-containing group. The pigment adsorptive group may be contained in either the main chain or the side chain of the resin, and is preferably contained in the side chain of the resin. That is, the coating resin is preferably a resin having a repeating unit having the pigment adsorptive group in the side chain.

Examples of the acid group include a carboxyl group, a sulfonic acid group, and a phosphoric acid group.

Preferred examples of the colorant structure include a colorant structures derived from colorants such as a phthalocyanine-based colorant, an azo-based colorant, an azo lake-based colorant, an anthraquinone-based colorant, a quinacridone-based colorant, a dioxazine-based colorant, a diketopyrrolopyrrole-based colorant, an anthrathrone-based colorant, an indanthrone-based colorant, a flavanthrone-based colorant, a perinone-based colorant, a perylene-based colorant, a thioindigo-based colorant, a pyrazolone-based colorant, a benzimidazolone-based colorant, a quinoxaline-based colorant, an azomethine-based colorant, a quinophthalone-based colorant, an isoindolinone-based colorant, an isoindoline-based colorant, and an anthraquinone-based colorant.

Preferred examples of the heterocyclic structure include thiophene, furan, xanthene, pyrrole, pyrroline, pyrrolidine, dioxolane, pyrazole, pyrazoline, pyrazolidine, imidazole, oxazole, thiazole, oxadiazole, triazole, thiadiazole, pyran, pyridine, piperidine, dioxane, morpholine, pyridazine, pyrimidine, piperazine, triazine, trithiane, isoindoline, isoindolinone, benzimidazolone, benzimidazole, benzothiazole, succinimide, phthalimide, naphthalimide, hydantoin, indole, quinoline, carbazole, acridine, acridone, and anthraquinone.

Examples of the acyclic heteroatom-containing group include a group having a nitrogen atom, and preferred examples thereof include a urea group, an imido group, an amido group, and a sulfonamido group. Examples of the urea group include —NR$^{100}$CONR$^{101}$R$^{102}$. R$^{100}$, R$^{101}$, and R$^{102}$ each independently represent a hydrogen atom, an alkyl group, or an aryl group. The number of carbon atoms in the alkyl group is preferably 1 to 30, and more preferably 1 to 20. The alkyl group may be any one of a linear shape, a branched shape, or a cyclic shape. The number of carbon atoms in an aryl group is preferably 6 to 30, and more preferably 6 to 20. R$^{100}$ and R$^{101}$ are each preferably a hydrogen atom. R$^{102}$ is preferably an alkyl group or an aryl group, and more preferably an aryl group.

The resin having a pigment adsorptive group can be synthesized using a monomer having a pigment adsorptive group such as an acid group, a colorant structure, a heterocyclic structure, or an acyclic heteroatom-containing group. Examples of the raw material monomer include monomers having the following structures. Further, examples of the monomer having an acid group include the monomers described in paragraphs 0038 to 0040 of JP2009-149849A. In addition, examples of the monomer having an acyclic heteroatom-containing group include the monomers described in paragraph 0041 of JP2009-149849A.

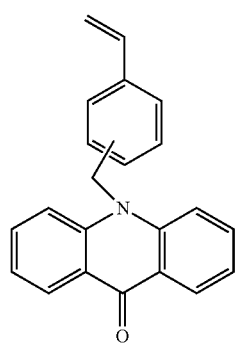

M-1

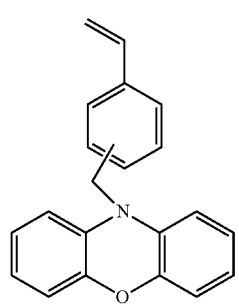

M-2

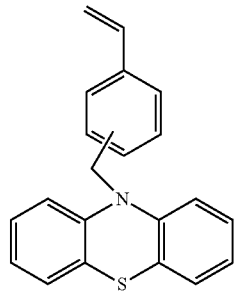

M-3

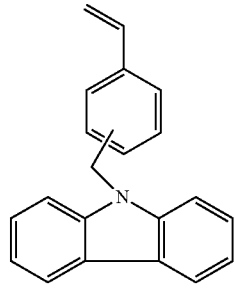

M-4

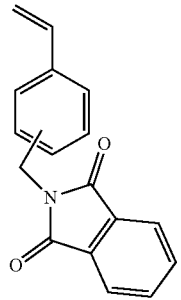

M-5

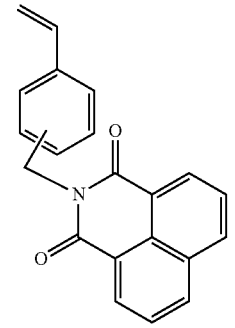

M-6

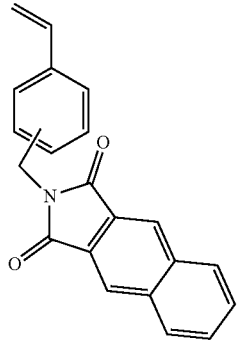

M-7

M-8
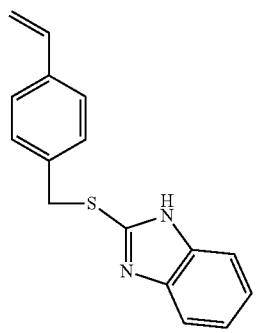
M-9
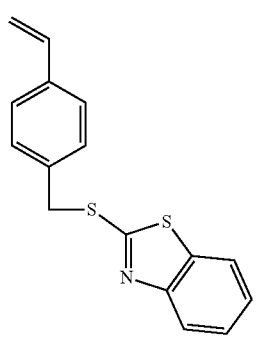
M-10
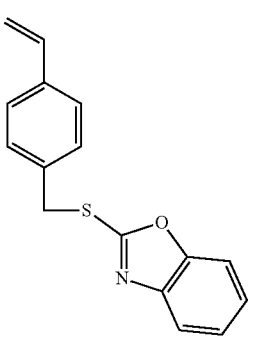
M-11
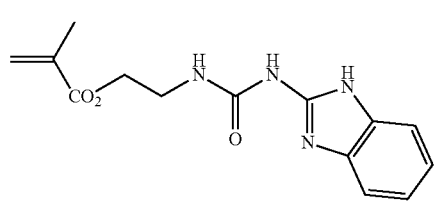
M-12
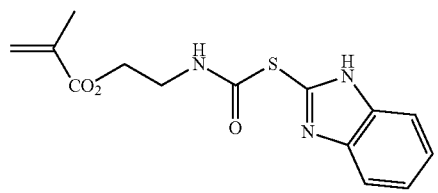
M-13
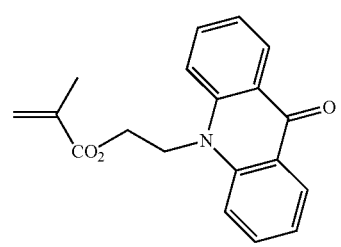
M-14
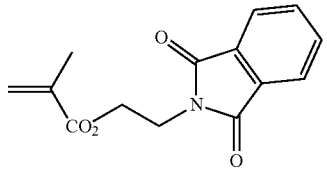
M-15
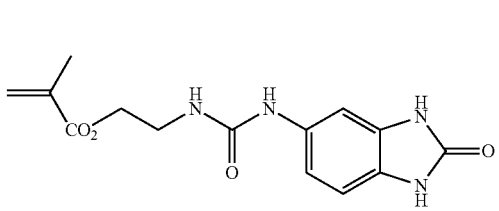
M-16
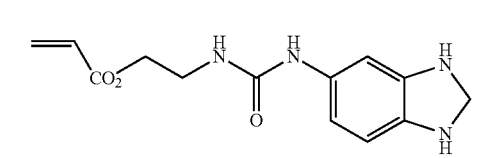
M-17
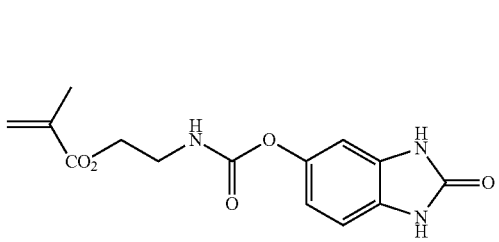
M-18
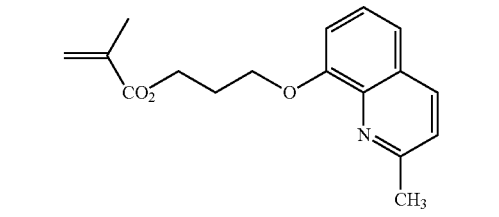
M-19
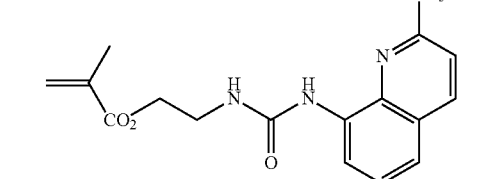
M-20
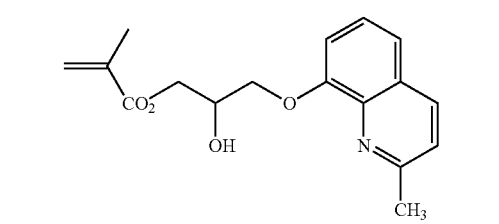

M-21
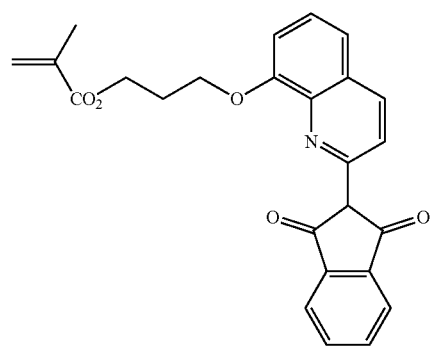
M-22
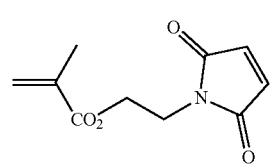
M-23
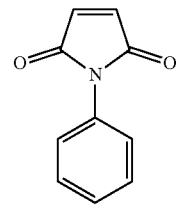
M-24
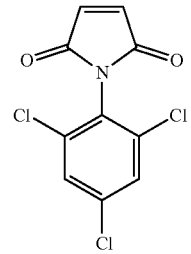
M-25
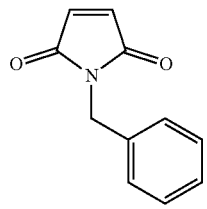
M-26
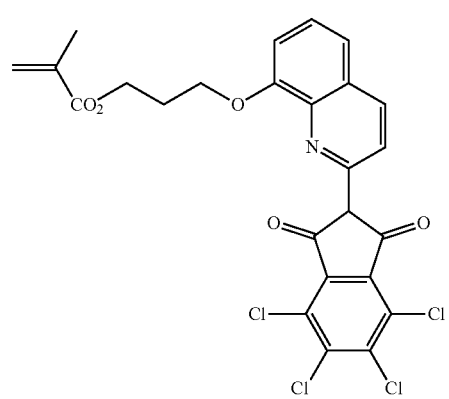
(M-27)
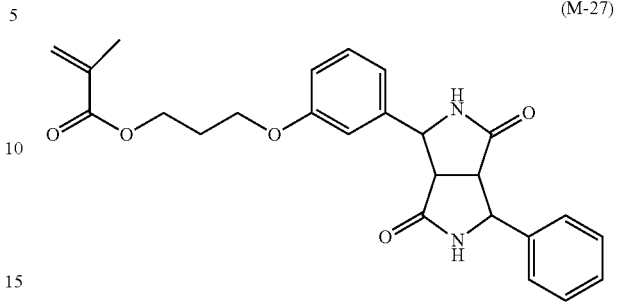
(M-28)
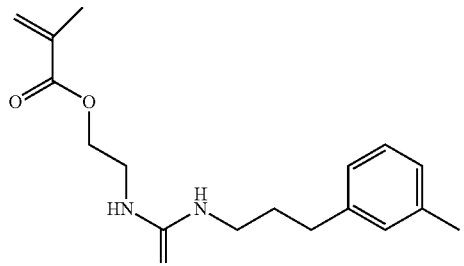
(M-29)
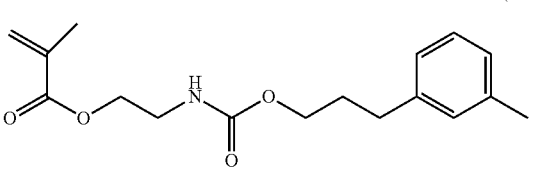
(M-30)
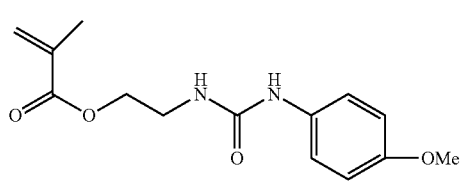
(M-31)
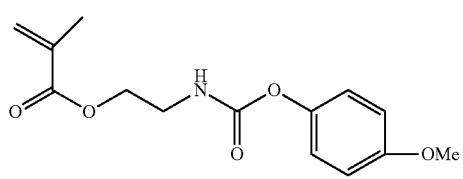
(M-32)

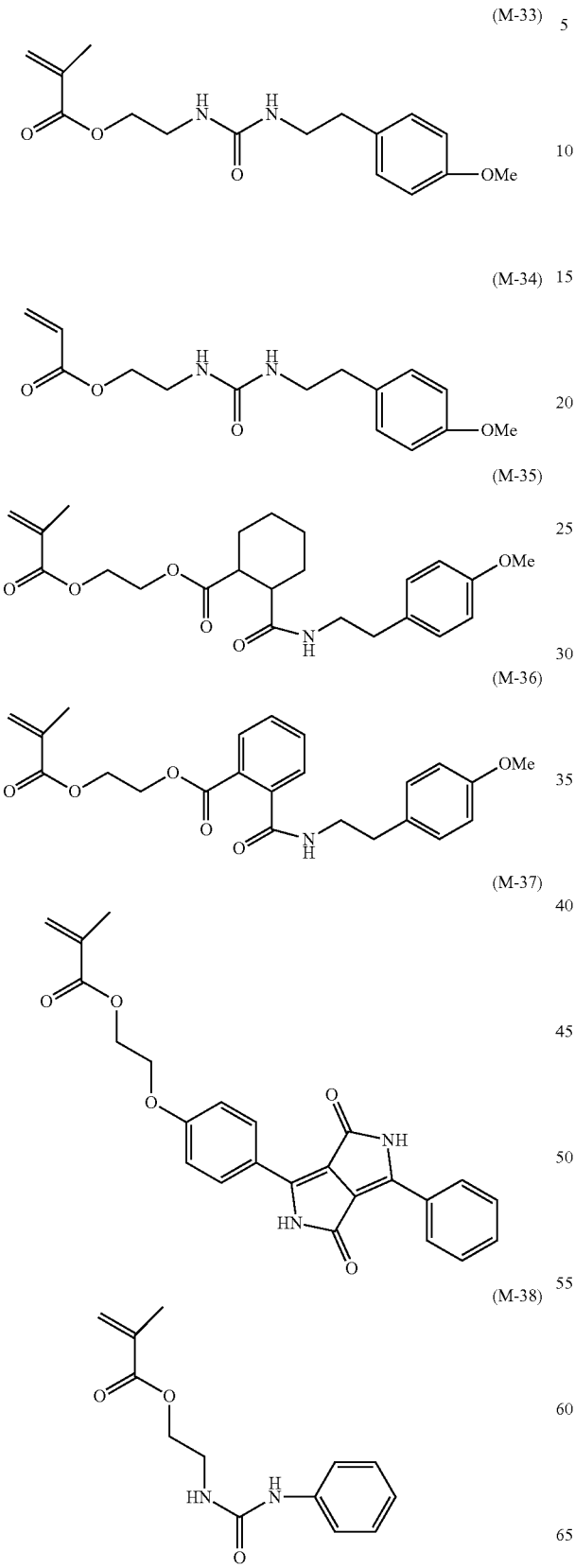
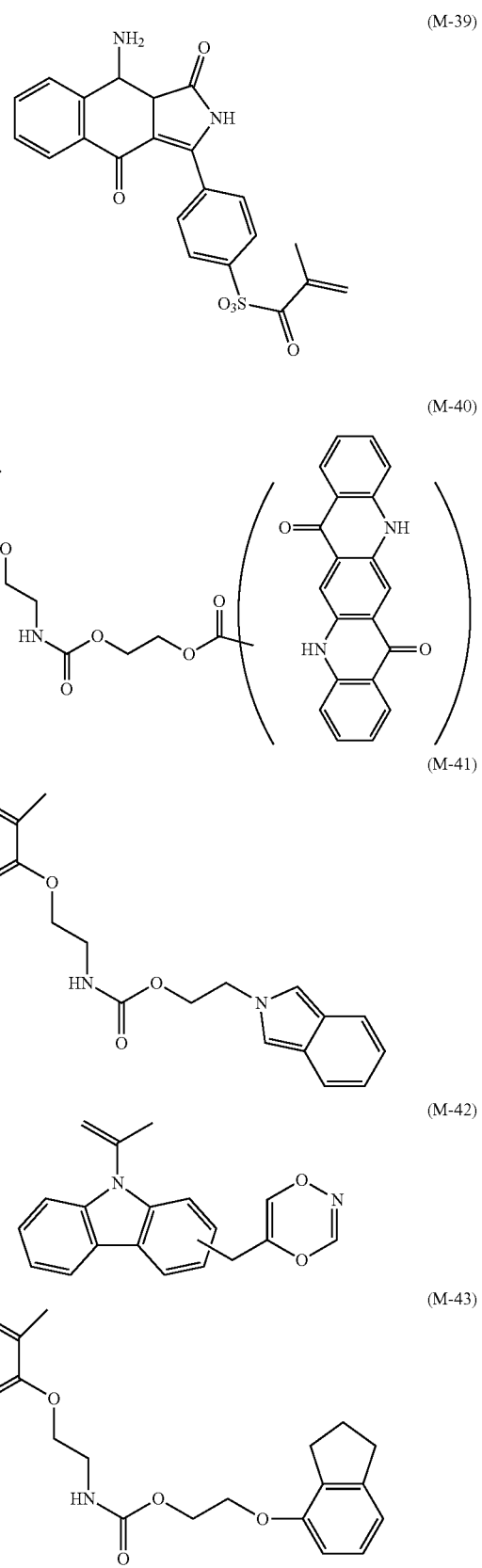

-continued (M-44)

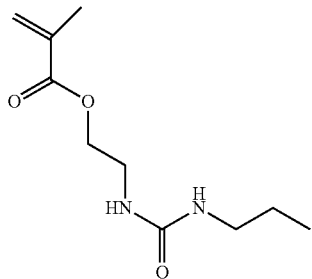

The coating resin may include any one kind or two or kinds of the acid group, the colorant structure, the heterocyclic structure, and the acyclic heteroatom-containing group as described above.

The coating resin preferably contains 1% to 100% by mass of a repeating unit having one or more selected from an acid group, a colorant structure, a heterocyclic structure, and an acyclic heteroatom-containing group in the all the repeating units of the resin. The lower limit is more preferably 5% by mass or more, and still more preferably 10% by mass or more. The upper limit can be set to 90% by mass or less, to 80% by mass or less, or to 70% by mass or less.

Furthermore, the coating resin preferably contains 1% to 50% by mass of a repeating unit having an acid group in the all the repeating units of the resin. The lower limit is more preferably 5% by mass or more, and still more preferably 10% by mass or more. The upper limit can be set to 40% by mass or less, to 35% by mass or less, or the 30% by mass or less.

The coating resin may include other repeating units, in addition to the repeating unit including one or more selected from the colorant structure, the heterocyclic structure, and the acyclic heteroatom-containing group as described above. Other repeating units may or may not have a functional group.

Examples of the monomer constituting other repeating units include (meth)acrylic acid esters, crotonic acid esters, vinyl esters, maleic acid diesters, fumaric acid diesters, itaconic acid diesters, (meth)acrylamides, styrenes, vinyl ethers, vinyl ketones, olefins, maleimides, (meth)acrylonitrile, and N-vinylpyrrolidone. These monomers may be used singly or in combination of two or more kinds thereof.

Examples of the (meth)acrylic acid esters include methyl (meth)acrylate, ethyl (meth)acrylate, n-propyl (meth)acrylate, isopropyl (meth)acrylate, n-butyl (meth)acrylate, isobutyl (meth)acrylate, t-butyl (meth)acrylate, amyl (meth)acrylate, cyclopentyl (meth)acrylate, n-hexyl (meth)acrylate, cyclohexyl (meth)acrylate, t-butylcyclohexyl (meth)acrylate, 2-ethylhexyl (meth)acrylate, t-octyl (meth)acrylate, dodecyl (meth)acrylate, octadecyl (meth)acrylate, acetoxyethyl (meth)acrylate, phenyl (meth)acrylate, 4-hydroxybutyl (meth)acrylate, 2-methoxyethyl (meth)acrylate, 2-ethoxyethyl (meth)acrylate, 2-(2-methoxyethoxy) ethyl (meth)acrylate, 2-chloroethyl (meth)acrylate, vinyl (meth)acrylate, 2-phenylvinyl (meth)acrylate, 1-propenyl (meth)acrylate, allyl (meth)acrylate, 2-allyloxyethyl (meth)acrylate, propargyl (meth)acrylate, benzyl (meth)acrylate, diethylene glycol monomethyl ether (meth)acrylate, diethylene glycol monoethyl ether (meth)acrylate, triethylene glycol monomethyl ether (meth)acrylate, triethylene glycol monoethyl ether (meth)acrylate, polyethylene glycol monomethyl ether (meth)acrylate, polyethylene glycol monoethyl ether (meth)acrylate, β-phenoxyethoxyethyl (meth)acrylate, nonylphenoxypolyethylene glycol (meth)acrylate, dicyclopentenyl (meth)acrylate, dicyclopentenyloxyethyl (meth)acrylate, trifluoroethyl (meth)acrylate, octafluoropentyl (meth)acrylate, perfluorooctylethyl (meth)acrylate, dicyclopentanyl (meth)acrylate, tribromophenyl (meth)acrylate, tribromophenyloxyethyl (meth)acrylate, γ-butyrolactone (meth)acrylate, and isobornyl (meth)acrylate. Examples of the crotonic acid esters include butyl crotonate and hexyl crotonate. Examples of the vinyl esters include vinyl acetate, vinylchloroacetate, vinyl propionate, vinyl butyrate, vinyl methoxy acetate, and vinyl benzoate. Examples of the maleic acid diesters include dimethyl maleate, diethyl maleate, and dibutyl maleate. Examples of the fumaric acid diesters include dimethyl fumarate, diethyl fumarate, and dibutyl fumarate. Examples of the itaconic acid diesters include dimethyl itaconate, diethyl itaconate, and dibutyl itaconate. Examples of the (meth)acrylamides include (meth)acrylamide, N methyl (meth)acrylamide, N-ethyl (meth)acrylamide, N-propyl (meth)acrylamide, N-isopropyl (meth)acrylamide, N-n-butyl (meth)acrylamide, N-t-butyl (meth)acrylamide, N-cyclohexyl (meth)acrylamide, N-(2-methoxyethyl) (meth)acrylamide, N,N-dimethyl (meth)acrylamide, N,N-diethyl (meth)acrylamide, N-phenyl (meth)acrylamide, N-nitrophenyl acrylamide, N-ethyl-N-phenylacrylamide, N-benzyl (meth)acrylamide, (meth)acryloyl morpholine, diacetone acrylamide, N-methylolacrylamide, N-hydroxyethylacrylamide, vinyl (meth)acrylamide, N,N-diallyl (meth)acrylamide, and N-allyl (meth)acrylamide. Examples of the styrenes include styrene, methylstyrene, dimethylstyrene, trimethylstyrene, ethylstyrene, isopropylstyrene, butylstyrene, hydroxystyrene, methoxystyrene, butoxystyrene, acetoxystyrene, chlorostyrene, dichlorostyrene, bromostyrene, chloromethylstyrene, methyl vinylbenzoate, and α-methylstyrene. Examples of the vinyl ethers include methyl vinyl ether, ethyl vinyl ether, 2-chloroethyl vinyl ether, hydroxyethyl vinyl ether, propylvinyl ether, butyl vinyl ether, hexyl vinyl ether, octyl vinyl ether, methoxyethyl vinyl ether, and phenyl vinyl ether. Examples of the vinyl ketones include methyl vinyl ketone, ethyl vinyl ketone, propyl vinyl ketone, and phenyl vinyl ketone. Examples of the olefins include ethylene, propylene, isobutylene, butadiene, and isoprene. Examples of the maleimides include maleimide, butylmaleimide, cyclohexyl maleimide, and phenyl maleimide. Examples of the (meth)acrylonitriles include methacrylonitrile and acrylonitrile.

In the present invention, the coating resin may be a resin having a graft type repeating unit formed by copolymerization of macromonomers, that is, a graft type copolymer. Examples of the copolymer include the graft type copolymers described for the dispersant which will be described later, for example, a graft copolymer including a repeating unit represented by any one of Formulae (1) to (4) described in the section of the dispersant which will be described later, and a graft copolymer including a repeating unit having an acid group. Examples of the macromonomer include macromonomers AA-6 (polymethyl methacrylate having a methacryloyl group as a terminal group), AS-6 (polystyrene having a methacryloyl group as a terminal group), AN-6S (a copolymer of styrene and acrylonitrile which has a methacryloyl group as a terminal group), and AB-6 (polybutyl acrylate having a methacryloyl group as a terminal group), all manufactured by TOAGOSEI, CO., LTD., PLACCEL FM5 (a product obtained by adding 5 molar equivalents of ε-caprolactone of 2-hydroxyethyl methacrylate) and FA10L (a product obtained by adding 10 molar equivalents of ε-caprolactone to 2-hydroxyethyl acrylate), both manufactured by Daicel Chemical Industries, Ltd., and the polyester-based macromonomers described in JP1990-272009A (JP-H02-272009A).

In the present invention, the coating resin preferably has at least one selected from an aliphatic ring (non-aromatic hydrocarbon ring) and an aromatic hydrocarbon ring, and more preferably has at least one selected from an aliphatic ring and an aromatic hydrocarbon ring on a side chain of the repeating unit. By incorporating at least one selected from an aliphatic ring and an aromatic hydrocarbon ring into the coating resin, more excellent light fastness is obtained. The aliphatic ring and the aromatic hydrocarbon ring may be a monocycle or a fused ring, with the monocycle being preferable. In addition, the aliphatic ring may have a crosslinked structure, and preferably has a crosslinked structure.

In the present invention, the coating resin preferably has at least one selected from a monocyclic aliphatic ring having a crosslinked structure and a monocyclic aromatic hydrocarbon ring (preferably a benzene ring).

In the present invention, the acid value of the coating resin is preferably 40 to 200 mgKOH/g. The upper limit is more preferably 180 mgKOH/g or less, and still more preferably 150 mgKOH/g or less. The lower limit is preferably 50 mgKOH/g or more, more preferably 60 mgKOH/g or more, and still more preferably 70 mgKOH/g or more. In a case where the acid value of the coating resin is in the range, the coating resin is efficiently adsorbed onto the surface of the pigment and thus, an effect that the light fastness is particularly good is obtained.

Furthermore, a difference between the acid value of the coating resin and the acid value of the dispersant is preferably 100 mgKOH/g or less. The lower limit can be set to 0 mgKOH/g or more. The upper limit is more preferably 80 mgKOH/g or less, and still more preferably 70 mgKOH/g or less. In a case where the difference in the acid values in the range, the difference in the absorption of the developer into the film is reduced, and thus, good resolution is obtained in photolithographic patterning.

In addition, in the present invention, the acid value represents a number in mg of potassium hydroxide required to neutralizing acidic components per gram of the solid content.

The weight-average molecular weight of the coating resin is preferably 5,000 to 40,000. The lower limit is, for example, more preferably 5,500 or more, and still more preferably 8,000 or more. The upper limit is, for example, more preferably 30,000 or less, still more preferably 25,000 or less, particularly preferably 20,000 or less, and most preferably 14,000 or less. In a case where the weight-average molecular weight of the coating resin is in the range, the layer separation in the film is hard to occur, and thus, good resolution and good light fastness are obtained.

The coating resin can be produced by a method known in the related art, such as radical polymerization, suspension polymerization, and solution polymerization. It can be synthesized by, for example, the method described in paragraph Nos. 0061 to 0063 of JP2009-149849A, the method described in paragraphs 0028 to 0034 of JP2013-216714A, the contents of which can be incorporated herein by reference.

(Method for Producing Coated Pigment)

The coated pigment of the present invention can be produced by allowing a resin (preferably a resin having a pigment adsorptive group) to undergo a reaction with a yellow pigment in a dry or wet state, and coating at least a portion of the surface of the yellow pigment with the resin, followed by drying, if desired.

Furthermore, the coated pigment of the present invention is preferably produced by allowing a resin (preferably a resin having a pigment adsorptive group) to undergo a reaction with a yellow pigment in a dry or wet state, and coating at least a portion of the surface of the yellow pigment with the resin, followed by drying, if desired.

For example, the coated pigment can be produced by kneading a yellow pigment and a resin. The amount of the resin to be used is preferably 1 to 200 parts by mass with respect to 100 parts by mass of the yellow pigment. The lower limit is, for example, more preferably 5 parts by mass or more, and still more preferably 10 parts by mass or more. The upper limit is, for example, more preferably 100 parts by mass or less, and still more preferably 60 parts by mass or less.

Kneading of the yellow pigment and the resin may be carried out by the addition of a solvent and/or water-soluble inorganic salts. Examples of the solvent include methanol, ethanol, isopropanol, n-propanol, isobutanol, n-butanol, ethylene glycol, diethylene glycol, diethylene glycol monomethyl ether, diethylene glycol monoethyl ether, diethylene glycol monobutyl ether, propylene glycol, and propylene glycol monomethyl ether acetate. The amount of the solvent to be used is preferably 50 to 300 parts by mass with respect to 100 parts by mass of the yellow pigment. The lower limit is, for example, more preferably 75 parts by mass or more, and still more preferably 100 parts by mass or more. The upper limit is, for example, more preferably 250 parts by mass or less, and still more preferably 200 parts by mass or less. The solvent may be used singly, or if desired, as a mixture of two or more kinds thereof. Examples of the water-soluble inorganic salts include sodium chloride, potassium chloride, calcium chloride, barium chloride, and sodium sulfate. The amount of the water-soluble inorganic salts to be used is preferably 100 to 5,000 parts by mass with respect to 100 parts by mass of the yellow pigment. The lower limit is, for example, more preferably 75 parts by mass or more, and still more preferably 100 parts by mass or more. The upper limit is, for example, more preferably 2,500 parts by mass or less, and still more preferably 1,000 parts by mass or less.

After kneading, the product is filtered and washed to remove the solvent, the water-soluble inorganic salts, and the like, followed by drying, as desired, to obtain a coated pigment.

Furthermore, a coated pigment can also be produced by kneading the yellow pigment, the resin, the water-soluble inorganic salts, and the solvent, introducing the obtained kneaded product into water, followed by stirring, to form a slurry, and filtering and washing the obtained slurry, and as desired, drying the residue. By such a production method, a coated pigment which is fine and has little aggregation of pigments during drying is obtained.

<<Halogenated Phthalocyanine Pigment>>

The coloring composition of the present invention includes a halogenated phthalocyanine pigment. In the halogenated phthalocyanine pigment, at least a portion of the surface may or may not be coated with a resin.

Examples of the halogenated phthalocyanine pigment include one or more selected from a halogenated phthalocyanine pigment having one selected from the group consisting of Zn, Cu, Al, Ti, Fe, Sn, Pb, Ga, V, Mo, Ta, and Nb as a central metal, and a halogenated phthalocyanine pigment having no central metal. Among those, for a reason that the effect of the present invention is remarkably easily obtained, a halogenated zinc phthalocyanine pigment which is a halogenated phthalocyanine pigment having Zn as a central metal Zn is particularly preferable. According to the studies of the present inventors, the halogenated zinc phthalocyanine pigment tends to be easily deteriorated in light fastness, as compared with other halogenated phthalocyanine pigments. However, even in a case of using such the halogenated zinc phthalocyanine pigment that tends to be easily deteriorated in light fastness, the discoloration of the halogenated zinc phthalocyanine pigment upon irradiation with light can be effectively suppressed by using the pigment in combination with a coated pigment in which at least a portion of a surface of a yellow pigment is coated with a resin, and thus, excellent light fastness is obtained.

The halogenated zinc phthalocyanine pigment is preferably a compound represented by Formula (A1).

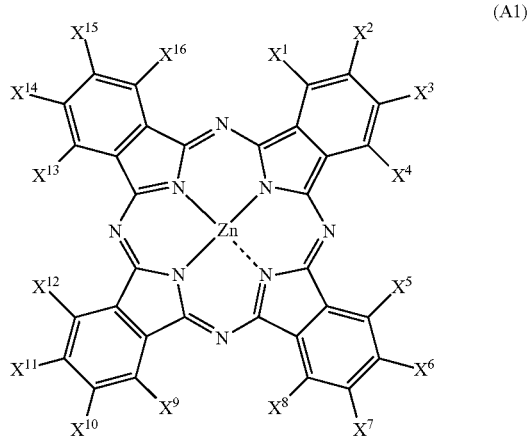

(A1)

In Formula (A1), it is preferable that any 8 to 16 members of $X^1$ to $X^{16}$ each represent a halogen atom, and the others each represent a hydrogen atom or a substituent.

Specific examples of the halogenated zinc phthalocyanine pigment include aspects shown in <1> and <2> below as a preferred example.

<1> A halogenated zinc phthalocyanine pigment in which the average number of halogen atoms per molecule of phthalocyanine is 8 to 12. In this aspect, it preferable that $X^1$ to $X^{16}$ includes one or more chlorine atoms, bromine atoms, or hydrogen atoms. Further, it is preferable that $X^1$ to $X^{16}$ have 0 to 4 chlorine atoms, 8 to 12 bromine atoms, and 0 to 4 hydrogen atoms. With regard to specific examples thereof, reference can be made to the description in paragraph Nos. 0013 to 0039, 0084, and 0085 of JP2007-284592A, the contents of which are incorporated herein by reference.

<2> A halogenated zinc phthalocyanine pigment in which the average number of halogen atoms, the average number of bromine atoms, and the average number of chlorine atoms per molecule of phthalocyanine are 10 to 14, 8 to 12, and 2 to 5, respectively. With regard to specific examples thereof, reference can be made to the description in WO2015/118720A, the contents of which are incorporated herein by reference.

The halogenated zinc phthalocyanine pigment is, for example, a compound classified as a pigment in a color index (C. I.; published by The Society of Dyers and Colourists), and C. I. Pigment Green 58, 59, or the like can also be used.

In addition, examples of the halogenated phthalocyanine pigment other than the halogenated zinc phthalocyanine pigment include C. I. Pigment Green 7, 36, and 37, which can also be used.

The content of the halogenated phthalocyanine pigment in the coloring composition in the present invention is preferably 0.1% to 80% by mass with respect to the total solid content of the coloring composition. The lower limit is, for example, more preferably 1% by mass or more, and still more preferably 5% by mass or more. The upper limit is, for example, more preferably 60% by mass or less, and still more preferably 50% by mass or less. The halogenated phthalocyanine pigment can be used singly or in combination of two or more kinds thereof. In a case where two or more halogenated phthalocyanine pigments are included, a total content thereof is preferably in the range.

The coloring composition of the present invention contains the halogenated phthalocyanine pigment in the amount of preferably 100 to 600 parts by mass, more preferably 150 to 500 parts by mass, and still more preferably 200 to 450 parts by mass, with respect to 100 parts by mass of the above-mentioned coated pigment. In a case where the ratio of the coated pigment to the halogenated phthalocyanine pigment is within the range, the effect of the present invention is more remarkably easily obtained.

<<Yellow Pigment not Coated with Resin>>

The coloring composition of the present invention may include a yellow pigment not coated with a resin. Further, the coloring composition of the present invention can also be configured such that it does not substantially include the yellow pigment not coated with a resin. The expression, substantially not including a yellow pigment not coated with a resin, means, for example, that the content of the yellow pigment not coated with a resin is preferably 20% by mass or less, more preferably 10% by mass or less, and still more preferably 5% by mass or less, with respect to the total solid content of the coloring composition.

<<Other Coloring Agent>>

For the coloring composition of the present invention, a coloring agent (another coloring agent) other than the coated pigment, the halogenated phthalocyanine pigment, and the yellow pigment as described above can further be used. Such another coloring agent may be either of a dye and a pigment, or the both may be used in combination. Further, in a case where such another coloring agent is the pigment, it may be used after being coated with a resin. Examples of the pigment include various inorganic pigments or organic pigments known in the related art. Further, taking into consideration that whether it is an inorganic pigment or an organic pigment, a pigment having a high transmittance is preferable, a pigment having an average particle diameter which is as small as possible is preferably used, and taking handling properties into consideration, the average particle diameter of the pigments is preferably 0.01 to 0.1 μm, and more preferably 0.01 to 0.05 μm.

Examples of the inorganic pigments include metal compounds such as a metal oxide and a metal complex salt, and specific examples thereof include metal oxides of black pigments such as carbon black and titanium black, oxides of metals such as iron, cobalt, aluminum, cadmium, lead, copper, titanium, magnesium, chromium, zinc, and antimony, and complex oxides of the metals.

Examples of the organic pigments include the following ones.

Color Index (C. I.) Pigment Green 10,

C. I. Pigment Orange 2, 5, 13, 16, 17:1, 31, 34, 36, 38, 43, 46, 48, 49, 51, 52, 55, 59, 60, 61, 62, 64, 71, and 73, C. I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, and 279, C. I. Pigment Violet 1, 19, 23, 27, 32, 37, and 42, and C. I. Pigment Blue 1, 2, 15, 15:1, 15:2, 15:3, 15:4, 15:6, 16, 22, 60, 64, 66, 79, and 80

As the dye, for example, the colorants disclosed in the specifications of JP1989-90403A (JP-S64-90403A), JP1989-91102A (JP-S64-91102A), JP1989-94301A (JPH01-94301A), JP1994-11614A (JP-H06-11614A), JP2592207B, U.S. Pat. Nos. 4,808,501A, 5,667,920A, 505,950A, JP1993-333207A (JP-H05-333207A), JP1994-35183A (JP-H06-35183A), JP1994-51115A (JP-H06-51115A), and JP1994-194828A (JP-H06-194828A) can be used. With respect to the chemical structure, a pyrazoleazo compound, a pyrromethene compound, an anilinoazo compound, a triarylmethane compound, an anthraquinone compound, a benzylidene compound, an oxonol compound, a pyrazoletriazole azo compound, a pyridoneazo compound, a cyanine compound, a phenothiazine compound, a pyrrolopyrazoleazomethine compound, or the like can be used. In addition, as the dye, a dye multimer may also be used. Examples of the dye multimer include the compounds described in JP2011-213925A, JP2013-041097A, JP2015-028144A, JP2015-030742A, and the like.

In a case where the coloring composition of the present invention contains another coloring agent, the content of such another coloring agent is preferably 3% to 50% by mass with respect to the total solid content of the coloring composition. The upper limit is preferably 45% by mass or less, and more preferably 40% by mass or less. The lower limit is preferably 5 parts by mass or more, and more preferably 10 parts by mass or more. Other coloring agents may be of one kind or two or more kinds. In a case where two or more kinds of the coloring agents are included, a total content thereof is preferably in the range.

<<Phthalimide Compound>>

The coloring composition of the present invention preferably contains a phthalimide compound. By incorporation of the phthalimide compound, generation of acicular crystals, or the like can be suppressed.

The phthalimide compound is preferably a compound represented by General Formula (PI).

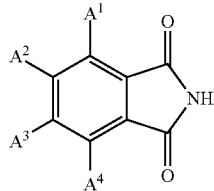

(PI)

In Formula (PI), $A^1$ to $A^4$ each independently represent a hydrogen atom, a halogen atom, or an alkyl group.

Examples of the halogen atom include a chlorine atom, a bromine atom, and a fluorine atom, with the chlorine atom or the fluorine atom being preferable.

The number of carbon atoms in the alkyl group is preferably 1 to 10, and more preferably 1 to 5. The alkyl group may be linear, branched, or cyclic, and is preferably linear or branched, and more preferably linear.

It is preferable that at least one of $A^1$, ..., or $A^4$ is selected from a chlorine atom and a bromine atom, and more preferably a bromine atom. Further, it is more preferable that all of $A^1$ to $A^4$ are selected from a chlorine atom and a bromine atom, and it is still more preferable that all of $A^1$ to $A^4$ are bromine atoms.

In a case where the coloring composition of the present invention contains a phthalimide compound, the content of the phthalimide compound is preferably 0.01% to 5% by mass, more preferably 0.1% to 4% by mass, and still more preferably 0.5% to 3.5% by mass, with respect to the total solid content in the coloring composition.

Furthermore, the phthalimide compound is contained in the amount of preferably 0.1 to 10 parts by mass, and more preferably 1 to 5 parts by mass, with respect to 100 parts by mass of the halogenated phthalocyanine pigment.

The phthalimide compounds may be of one kind or two or more kinds. In a case where two or more kinds of the phthalimide compounds are included, a total content thereof is preferably in the range.

<<Dispersant>>

The coloring composition of the present invention includes a dispersant having an acid value of 40 mgKOH/g or more. By incorporating the dispersant having an acid value of 40 mgKOH/g or more into the coloring composition of the present invention, a film having excellent light fastness can be produced. The acid value of the dispersant is preferably 40 to 250 mgKOH/g, more preferably 40 to 200 mgKOH/g, and still more preferably 40 to 150 mgKOH/g.

Examples of the acid group contained in the dispersant include a carboxyl group, a sulfa group, and a phosphoric acid group, with the carboxyl group or the sulfa group being preferable, and the carboxyl group being more preferable.

The content of the dispersant having an acid value of 40 mgKOH/g or more is preferably 10 to 100 parts by mass, and more preferably 20 to 75 parts by mass, with respect to 100 parts by mass of the total amount of the coated pigment and the halogenated phthalocyanine pigment.

The coloring composition of the present invention may include a dispersant having an acid value of less than 40 mgKOH/g. The content of the dispersant having an acid value of less than 40 mgKOH/g is preferably 30% by mass or less, and more preferably 15% by mass or less, with respect to the total mass of the dispersant. Further, the coloring composition may not substantially include the dispersant having an acid value of less than 40 mgKOH/g. The expression, not substantially including the dispersant having an acid value of less than 40 mgKOH/g, means, for example, that the content of the dispersant having an acid value of 40 mgKOH/g or more is preferably 99% by mass or more, and more preferably 99.9% by mass or more, with respect to the total mass of the dispersant.

Examples of the dispersant include polymer dispersants [for example, a polyamidoamine and a salt thereof, a polycarboxylic acid and a salt thereof, an unsaturated high molecular acid ester, a modified polyurethane, a modified polyester, a modified poly(meth)acrylate, a (meth)acrylic copolymer, and a naphthalenesulfonic acid/formalin condensate], a polyoxyethylene alkyl phosphate ester, a polyoxyethylene alkylamine, and an alkanolamine.

The polymer dispersant can further be classified into a linear polymer, a terminal-modified polymer, a graft type polymer, and a block type polymer, depending on its structure. The polymer dispersant is adsorbed on a surface of a pigment and reacts so as to prevent re-aggregation. For this reason, examples of a preferable structure thereof include a terminal-modified polymer, a graft type polymer, and a block type polymer, which have an anchoring site on a surface of a pigment.

Examples of the terminal-modified polymer include a polymer having a phosphate group at a terminal thereof described in JP1991-112992A (JP-H03-112992A) or JP2003-533455A, a polymer having a sulfonic acid group at a terminal thereof described in JP2002-273191A, and a polymer having a partial skeleton or a heterocycle of an organic colorant described in JP1997-77994A (JP-H09-77994A). In addition, the polymers described in JP2007-277514A in which two or more anchor sites (for example, an acid group, a basic group, a partial skeleton or a hetero ring of an organic colorant) to a pigment surface are introduced into a terminal thereof are also preferable due to its excellent dispersion stability.

Examples of the graft type polymer include a polyester-based dispersant, and specifically a reaction product of a poly(lower alkylene imine) and a polyester, described in JP1979-37082A (JP-S54-37082A), JP1996-507960A (JP-H08-507960A), JP2009-258668A, or the like, a reaction product of a polyallylamine and a polyester, described in JP1997-169821A (JP-H09-169821A), a copolymer of a macromonomer and a monomer including a nitrogen atom, described in JP1998-339949A (JP-H10-339949A), JP2004-37986A, or the like, a graft type polymer having a partial skeleton or a heterocycle of an organic colorant described in JP2003-238837A, JP2008-9426A, JP2008-81732A, or the like, a copolymer of a macromonomer and an acid group-containing monomer, described in JP2010-106268A or the like, and an amphoteric resin having a basic group and an acid group described in JP2009-203462A.

As the macromonomer used in the production of a graft type polymer by radical polymerization, known macromonomers can be used, and examples thereof include macromonomers AA-6 (polymethyl methacrylate having a methacryloyl group as a terminal group), AS-6 (polystyrene having a methacryloyl group as a terminal group), AN-6S (a copolymer of styrene and acrylonitrile that has a methacryloyl group as a terminal group), and AB-6 (polybutyl acrylate having a methacryloyl group as a terminal group) manufactured by TOAGOSEI, CO., LTD.; PLACCEL FM5 (a product obtained by adding 5 molar equivalents of ε-caprolactone to 2-hydroxyethyl methacrylate) and FA10L (a product obtained by adding 10 molar equivalents of ε-caprolactone to 2-hydroxyethyl acrylate) manufactured by Daicel Chemical Industries, Ltd.; and a polyester-based macromonomer described in JP1990-272009A (JP-H02-272009A).

As the block type polymer, the block type polymers described in JP2003-49110A, JP2009-52010A, and the like are preferable.

The dispersant is preferably a resin having a repeating unit having an acid group. The repeating unit having an acid group can be configured using a monomer having an acid group. Examples of the monomer derived from an acid group include a vinyl monomer having a carboxyl group, a vinyl monomer having a sulfonic acid group, and a vinyl monomer having a phosphoric acid group.

Examples of the vinyl monomer having a carboxyl group include (meth)acrylic acid, vinyl benzoic acid, maleic acid, monoalkyl maleic ester, fumaric acid, itaconic acid, crotonic acid, cinnamic acid, and an acrylic acid dimer. Further, an addition reaction products of a monomer having a hydroxyl group, such as 2-hydroxyethyl (meth)acrylate, with a cyclic anhydride such as maleic acid anhydride, phthalic acid anhydride, succinic acid anhydride, and cyclohexane dicarboxylic acid anhydride; ω-carboxy-polycaprolactone mono (meth)acrylate; or the like can also be used. Incidentally, as a precursor of a carboxyl group, an anhydride-containing monomer such as maleic acid anhydride, itaconic acid anhydride, and citraconic acid anhydride may also be used. Among those, from the viewpoint of properties of removing the unexposed area by development, addition reaction products of a monomer having a hydroxyl group, such as 2-hydroxyethyl (meth)acrylate, with a cyclic anhydride such as maleic acid anhydride, phthalic acid anhydride, succinic acid anhydride, and cyclohexane dicarboxylic acid anhydride are preferable.

Examples of the vinyl monomer having a sulfonic acid group include 2-acrylamide-2-methylpropanesulfonic acid.

Examples of the vinyl monomer having a phosphoric acid group include phosphoric mono(2-acryloyloxyethylester) and phosphoric mono(1-methyl-2-acryloyloxyethylester).

In addition, with regard to the repeating unit having an acid group, reference can be made to the descriptions in paragraph Nos. 0067 to 0069 in JP2008-165059A, the contents of which are incorporated herein by reference.

Furthermore, in the present invention, a graft copolymer including a repeating unit represented by any one of Formulae (1) to (4) and a repeating unit having an acid group can also be used as the dispersant.

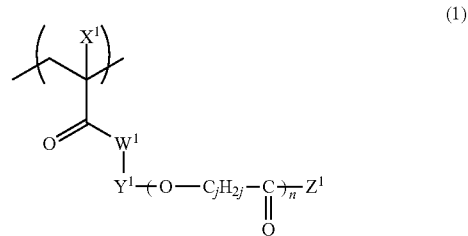

(1)

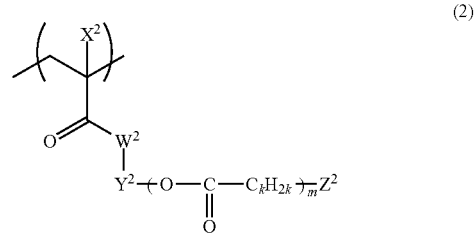

(2)

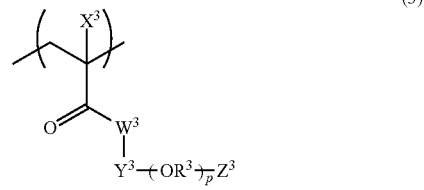

(3)

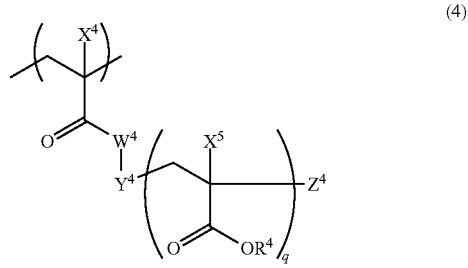

(4)

In Formulae (1) to (4), $W^1$, $W^2$, $W^3$, and $W^4$ each independently represent an oxygen atom or NH, $X^1$, $X^2$, $X^3$, $X^4$, and $X^5$ each independently represent a hydrogen atom or a monovalent organic group, $Y^1$, $Y^2$, $Y^3$, and $Y^4$ each independently represent a divalent linking group, $Z^1$, $Z^2$, $Z^3$, and $Z^4$ each independently represent a monovalent organic group, $R^3$ represents an alkylene group, $R^4$ represents a hydrogen atom or a monovalent organic group, n, m, p, and q each independently represent an integer of 1 to 500, and j and k each independently represent an integer of 2 to 8. In Formula (3), in a case where p is 2 to 500, $R^3$'s which are present in plural numbers may be the same as or different from each other, and in Formula (4), in a case where q is 2 to 500, $X^5$'s and $R^4$'s which are present in plural numbers may be the same as or different from each other.

$W^1$, $W^2$, $W^3$, and $W^4$ are each preferably an oxygen atoms $X^1$, $X^2$, $X^3$, $X^4$, and $X^5$ are each preferably a hydrogen atom or an alkyl group having 1 to 12 carbon atoms, and are each independently more preferably a hydrogen atom or a methyl group, and particularly preferably a methyl group. $Y^1$, $Y^2$, $Y^3$, and $Y^4$ each independently represent a divalent linking group, and the linking group is not particularly limited in their structures. The structure of the monovalent organic group represented by each of $Z^1$, $Z^2$, $Z^3$, and $Z^4$ is not particularly limited, but specific examples thereof include an alkyl group, a hydroxyl group, an alkoxy group, an aryloxy group, a heteroaryloxy group, an alkylthioether group, an arylthioether group, a heteroarylthioether group, and an amino group. Among those, ones having the steric repulsion effect are preferable as the organic groups represented by $Z^1$, $Z^2$, $Z^3$, and $Z^4$, in particular from the viewpoint of improving the dispersibility. It is particularly preferable that $Z^1$, $Z^2$, $Z^3$, and $Z^4$ each independently represent an alkyl group or an alkoxy group having 5 to 24 carbon atoms, and among these, a branched alkyl group having 5 to 24 carbon atoms, a cyclic alkyl group having 5 to 24 carbon atoms, or an alkoxy group having 5 to 24 carbon atoms is preferable. In addition, the alkyl group contained in the alkoxy group may be linear, branched, or cyclic.

In Formulae (1) to (4), n, m, p, and q are each independently an integer of 1 to 500. Further, in Formulae (1) and (2), j and k each independently represent an integer of 2 to 8. j and k in Formulae (1) and (2) are preferably an integer of 4 to 6, and most preferably 5, from the viewpoint of dispersion stability or developability.

In Formula (3), $R^3$ represents an alkylene group, and is preferably an alkylene group having 1 to 10 carbon atoms, and more preferably an alkylene group having 2 or 3 carbon atoms. In a case where p is 2 to 500, $R^3$'s which are present in plural numbers may be the same as or different from each other.

In Formula (4), $R^4$ represents a hydrogen atom or a monovalent organic group, and the monovalent organic group is not particularly limited in terms of its structure. $R^4$ is preferably a hydrogen atom, an alkyl group, an aryl group, or a heteroaryl group, and more preferably a hydrogen atom or an alkyl group. In a case where $R^4$ is an alkyl group, as the alkyl group, a linear alkyl group having 1 to 20 carbon atoms, a branched alkyl group having 3 to 20 carbon atoms, or a cyclic alkyl group having 5 to 20 carbon atoms is preferable, a linear alkyl group having 1 to 20 carbon atoms is more preferable, and a linear alkyl group having 1 to 6 carbon atoms is still more preferable. In Formula (4), in a case where q is 2 to 500, $X^5$'s and $R^4$'s which are present in plural numbers in a graft copolymer may be the same as or different from each other.

With regard to the graft copolymer, reference can be made to the description in paragraph Nos. 0025 to 0094 of JP2012-255128A, the contents of which are incorporated herein by reference. Specific examples of the graft copolymer include the following resins. Other examples thereof include the resins described in paragraph Nos. 0072 to 0094 of JP2012-255128A, the contents of which are incorporated herein by reference.

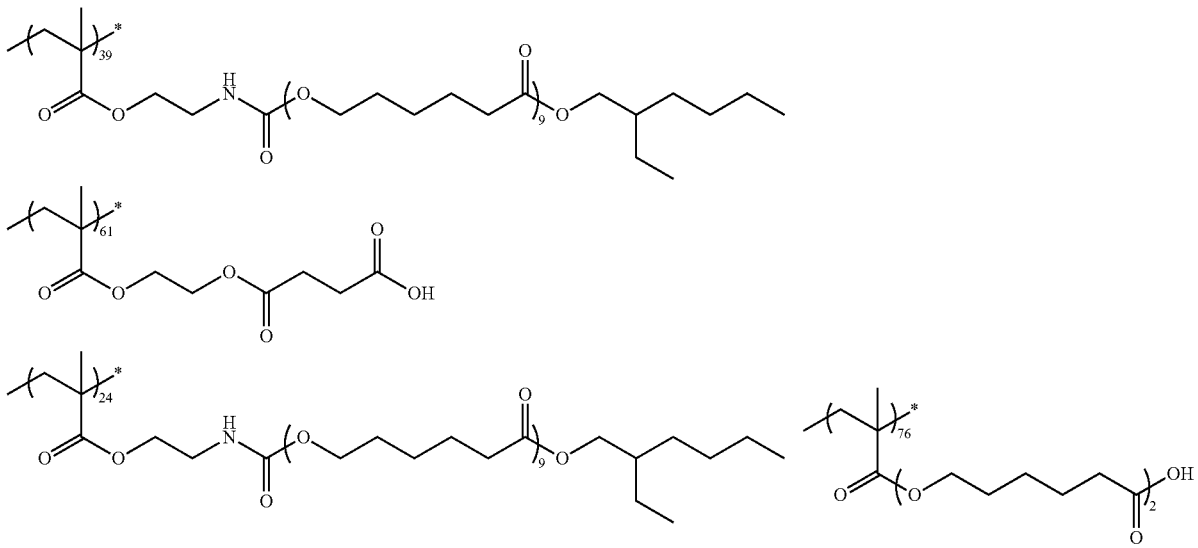

Moreover, in the present invention, an oligoimine-based resin including a nitrogen atom in at least one of the main chain or the side chain can also be preferably used as the dispersant. As the oligoimine-based resin, a resin having a side chain including a repeating unit having a partial structure X having a functional group with a $pK_a$ of 14 or less and an oligomer chain or polymer chain Y having 40 to 10,000 atoms, and having a basic nitrogen atom in at least one of the main chain or the side chain is preferable. The basic nitrogen atom is not particularly limited as long as it is a nitrogen atom exhibiting basicity. The oligoimine-based resin preferably contains a structure having a nitrogen atom with a base strength $pK_b$ of 14 or less, and more preferably contains a structure having a nitrogen atom with a $pK_b$ of 10 or less.

In the present invention, the base strength $pK_b$ refers to a $pK_b$ at a water temperature of 25° C., is one of the indices to quantitatively represent the intensity of a base, and has the same definition as the basicity constant. The base strength $pK_b$ and the acid strength $pK_a$ which will be described later are in a relationship of $pK_b=14-pK_a$.

It is particularly preferable that the oligoimine-based resin has a repeating unit (i) which is at least one repeating unit having a basic nitrogen atom, selected from a poly(lower alkyleneimine)-based repeating unit, a polyallylamine-based repeating unit, a polydiallylamine-based repeating unit, a methaxylenediamine-epichlorohydrin polycondensate-based repeating unit, and a polyvinylamine-based repeating unit, and has a partial structure X having a functional group with a $pK_a$ 14 or less while being bonded to the basic nitrogen atom, and a side chain (ii) including an oligomer chain or polymer chain Y having 40 to 10,000 atoms.

The poly(lower alkyleneimine) may be chained or meshed. Here, in the present invention, the lower alkyleneimine means an alkyleneimine including an alkylene chain having 1 to 5 carbon atoms.

The repeating unit (i) preferably forms a main chain moiety in an oligoimine-based resin. The number-average molecular weight of the main chain moiety, that is, the number-average molecular weight of a portion of the oligoimine-based resin excluding the side chain (ii) therefrom is preferably 100 to 10,000, more preferably 200 to 5,000, and most preferably 300 to 2,000. The number-average molecular weight of the main chain moiety can be determined from a ratio of integrated values of hydrogen atoms in the terminal group and the main chain moiety, measured by nuclear magnetic resonance spectroscopy, or can be determined by the measurement of the molecular weight of an oligomer or polymer containing an amino group which is a raw material.

Examples of the oligoimine-based resin include a resin including a repeating unit represented by General Formula (I-1), a repeating unit represented by General Formula (I-2), and/or a repeating unit represented by General Formula (I-2a).

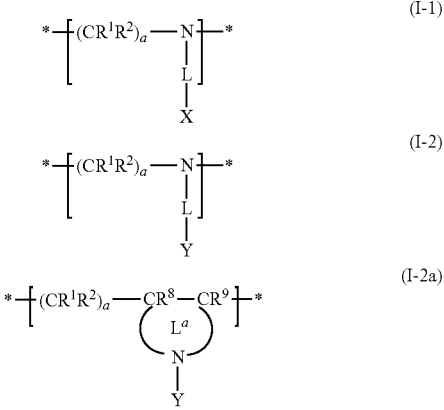

$R^1$ and $R^2$ each independently represent a hydrogen atom, a halogen atom, or an alkyl group (preferably having 1 to 6 carbon atoms). a's each independently represent an integer of 1 to 5. * represents a linking moiety between repeating units. $R^8$ and $R^9$ are each a group having the same definition as $R^1$. L is a single bond, an alkylene group (preferably having 1 to 6 carbon atoms), an alkenylene group (preferably having 2 to 6 carbon atoms), an arylene group (preferably having 6 to 24 carbon atoms), a heteroarylene group (preferably having 1 to 6 carbon atoms), an imino group (preferably having 0 to 6 carbon atoms), an ether group, a thioether group, a carbonyl group, or a linking group for a combination thereof. Among those, L is preferably a single bond or —$CR^5R^6$—$NR^7$— (an imino group is on the side of X or Y). Here, $R^5$ and $R^6$ each independently represent a hydrogen atom, a halogen atom, or an alkyl group (preferably having 1 to 6 carbon atoms). $R^7$ is a hydrogen atom or an alkyl group having 1 to 6 carbon atoms. $L^a$ is a structural site which is combined with $CR^8CR^9$ and N to form a ring structure, preferably a structural site which is combined with a carbon atom in $CR^8CR^9$ to form a non-aromatic heterocycle having 3 to 7 carbon atoms, more preferably a structural site which is combined with a carbon atom and N (nitrogen atom) in $CR^8CR^9$ to form a 5- to 7-membered non-aromatic heterocycle, still more preferably a structural site that forms a 5-membered non-aromatic heterocycle, and particularly preferably a structural site that forms pyrrolidine. This structural site may further have a substituent such as an alkyl group. X represents a group having functional group with $pK_a$ 14. Y represents a side chain having 40 to 10,000 atoms.

The dispersant (oligoimine-based dispersant) may further contain one or more selected from repeating units represented by Formulae (I-3), (I-4), and (I-5) as a copolymerization component.

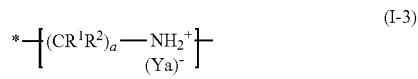

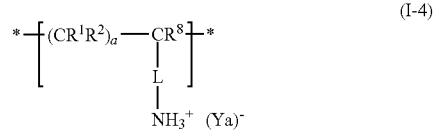

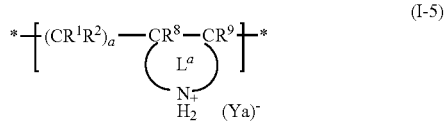

$R^1$, $R^2$, $R^8$, $R^9$, L, $L^a$, a, and * each have the same definitions as in Formulae (I-1), (I-2), and (I-2a). Ya represents a side chain having 40 to 10,000 atoms contained in the anionic group. It is possible for the repeating unit represented by Formula (I-3) to be formed by performing a reaction by the addition of an oligomer or polymer having a group capable of forming a salt through a reaction with an amine, to a resin having a primary or secondary amino group in the main chain moiety.

With regard to the oligoimine-based resin, reference can be made to the description in paragraph Nos. 0102 to 0174 of JP2012-255128A, the contents of which are incorporated herein by reference. As specific examples of the oligoimine-based resin, the resins described in paragraph Nos. 0168 to 0174 of JP2012-255128A can be used.

Furthermore, in the present invention, a resin having an acid group and an unsaturated double bond, described in paragraph Nos. 0020 to 0075 of JP2008-165059A, can be used as the dispersant.

The dispersant is also available as a commercially available product, and among the specific examples shown below, the dispersants having an acid value of 40 mgKOH/g or more can be preferably used.

Specific examples of the dispersant include "DA-7301" manufactured by Kusumoto Chemicals, Ltd., "Disperbyk-101 (polyamidoamine phosphate), 107 (carboxylic acid ester), 110 (copolymer including an acid group), 111 (phosphoric acid-based dispersant), 130 (polyamide), 161, 162, 163, 164, 165, 166, and 170 (polymeric copolymers), and BYK-P104 and P105 (unsaturated high molecular polycarboxylic acid)" manufactured by BYK-Chemie, "EFKA 4047, and 4050 to 4165 (polyurethane-based), EFKA 4330 to 4340 (block copolymer), 4400 to 4402 (modified polyacrylate), 5010 (polyesteramide), 5765 (high molecular polycarboxylate), 6220 (aliphatic polyester), 6745 (phthalocyanine derivative), and 6750 (azo pigment derivative)" manufactured by EFKA, "AJISPER PB821, PB822, PB880, and PB881" manufactured by Ajinomoto Fine-Techno Co., Inc., "FLOWLEN TG-710 (urethane oligomer)" and "POLYFLOW No. 50E, No. 300 (acrylic copolymer)" manufactured by KYOEISHA CHEMICAL Co., LTD., "DISPARLON KS-860, 873SN, 874, and #2150 (aliphatic polyvalent carboxylic acid), #7004 (polyether ester), DA-703-50, DA-705, and DA-725" manufactured by Kusumoto Chemicals, Ltd., "DEMOL RN and N (naphthalene sulfonate formalin polycondensate), MS, C, and SN-B (aromatic sulfonate formalin polycondensate), HOMOGENOL L-18 (polymeric polycarboxylic acid), EMULGEN 920, 930, 935, and 985 (polyoxyethylene nonyl phenyl ether), and ACETAMINE 86 (stearylamine acetate)" manufactured by Kao Corporation, "SOLSPERSE 5000 (phthalocyanine derivative), 22000 (azo pigment derivative), 13240 (polyesteramine), 3000, 12000, 17000, 20000, and 27000 (polymers having a functional moiety in the terminal moiety), and 24000, 28000, 32000, and 38500 (graft type polymers)" manufactured by The Lubrizol Corporation, "EFKA-46, EFKA-47, EFKA-47EA, EFKA POLYMER 100, EFKA POLYMER 400, EFKA POLYMER 401, and EFKA POLYMER 450" manufactured by MORISHITA SANGYO Corporation, "DISPERSE AID 6, DISPERSE AID 8, DISPERSE AID 15, and DISPERSE AID 9100" manufactured by SAN NOPCO Ltd., "ADEKA PLURONIC L31, F38, L42, L44, L61, L64, F68, L72, P95, F77, P84, F87, P94, L101, P103, F108, L121, and P-123" manufactured by ADEKA CORPORATION, and "IONET (trade name) S-20" manufactured by Sanyo Chemical Industries, Ltd. In addition, Acryl-Based FFS-6752 (manufactured by Fujikura Kasei Co., Ltd.) and Acryl-Based FFS-187 (manufactured by Fujikura Kasei Co., Ltd.), ACRYCURE RD-F8 (manufactured by Nippon Shokubai Co., Ltd.), or CYCLOMER P (manufactured by Daicel Chemical Industries, Ltd.) can also be used.

Furthermore, the resins described for the dispersant can also be used in applications other than those as dispersants. For example, the resins can also be used as a binder.

<<Alkali-Soluble Resin>>

The coloring composition of the present invention preferably contains an alkali-soluble resin. By incorporation of the alkali-soluble resin, the developability and the pattern formability are improved. In addition, the alkali-soluble resin can also be used as a dispersant or a binder.

The molecular weight of the alkali-soluble resin is not particularly determined, but the weight-average molecular weight (Mw) is preferably 5,000 to 100,000. Further, the number-average molecular weight (Mn) is preferably 1,000 to 20,000.

The alkali-soluble resin may be a linear organic high molecular polymer, and can be appropriately selected from alkali-soluble resins having at least one group enhancing alkali solubility in a molecule (preferably a molecule having an acrylic copolymer or a styrene-based copolymer as a main chain).

As the alkali-soluble resin, from the viewpoint of heat resistance, a polyhydroxystyrene-based resin, a polysiloxane-based resin, an acrylic resin, an acrylamide-based resin, and an acryl/acrylamide copolymer resin are preferable, and further, from the viewpoint of controlling developability, an acrylic resin, an acrylamide-based resin, and an acryl/acrylamide copolymer resin are preferable.

Examples of the group enhancing alkali solubility (hereinafter also referred to as an acid group) include a carboxyl group, a phosphoric acid group, a sulfonic acid group, and a phenolic hydroxyl group. The group enhancing alkali solubility is preferably a group which is soluble in an organic solvent and can be developed by an aqueous weak alkaline solution, and particularly preferred examples thereof include (meth)acrylic acid. These acid groups may be used singly or in combination of two or more kinds thereof.

For the production of the alkali-soluble resin, for example, a known radical polymerization method can be applied. The polymerization conditions for producing the alkali-soluble resin by radical polymerization, such as a temperature, a pressure, the type and amount of a radical initiator, and the type of a solvent, can be easily set by those skilled in the art, and the conditions can also be determined experimentally.

As the alkali-soluble resin, polymers having a carboxyl group in a side chain are preferable, and examples thereof include a methacrylic acid copolymer, an acrylic acid copolymer, an itaconic acid copolymer, a crotonic acid copolymer, a maleic acid copolymer, a partially esterified maleic acid copolymer, an alkali-soluble phenol resin or the like such as a novolac resin, an acidic cellulose derivative having a carboxyl group in a side chain, and a polymer obtained by adding an acid anhydride to a polymer having a hydroxyl group. In particular, a copolymer of a (meth)acrylic acid and another monomer copolymerizable with the (meth)acrylic acid is suitable as the alkali-soluble resin. Examples of another monomer copolymerizable with a (meth)acrylic acid include alkyl (meth)acrylate, aryl (meth)acrylate, and a vinyl compound. Examples of the alkyl (meth)acrylate and aryl (meth)acrylate include methyl (meth)acrylate, ethyl (meth) acrylate, propyl (meth)acrylate, butyl (meth)acrylate, isobutyl (meth)acrylate, pentyl (meth)acrylate, hexyl (meth) acrylate, octyl (meth)acrylate, phenyl (meth)acrylate, benzyl (meth)acrylate, tolyl (meth)acrylate, naphthyl (meth)acrylate, and cyclohexyl (meth)acrylate. Examples of the vinyl compound include styrene, α-methylstyrene, vinyltoluene, glycidyl methacrylate, acrylonitrile, vinyl acetate, N-vinylpyrrolidone, tetrahydrofurfuryl methacrylate, a polystyrene macromonomer, and a polymethyl methacrylate macromonomer. Further, as other monomers, the N-position-substituted maleimide monomers described in JP1998-300922A (JP-H10-300922A) can also be used. Specific examples thereof include N-phenylmaleimide and N-cyclohexylmaleimide. In addition, other monomers copolymerizable with a (meth)acrylic acid may be used singly or in combination of two or more kinds thereof.

As the alkali-soluble resin, a benzyl (meth)acrylate/ (meth)acrylic acid copolymer, benzyl (meth)acrylate/(meth) acrylic acid/2-hydroxyethyl (meth)acrylate copolymer, or a multicomponent copolymer including benzyl (meth)acrylate/(meth)acrylic acid/other monomers can be preferably used. As the alkali-soluble resin, those obtained by copolymerizing 2-hydroxyethyl (meth)acrylate, a 2-hydroxypropyl (meth)acrylate/polystyrene macromonomer/benzyl methacrylate/methacrylic acid copolymer described in JP1995-140654A (JP-H07-140654A), a 2-hydroxy-3-phenoxypropylacrylate/polymethyl methacrylate macromonomer/benzyl methacrylate/methacrylic acid copolymer, a 2-hydroxyethyl (meth)acrylate/polystyrene macromonomer/methyl methacrylate/methacrylic acid copolymer, a 2-hydroxyethyl methacrylate/polystyrene macromonomer/benzyl methacrylate/methacrylic acid copolymer, and the like can be preferably used. In addition, as a commercially available product thereof, for example, FF-426 (manufactured by Fujikura Kasei Co., Ltd.) or the like can also be used.

Moreover, as the alkali-soluble resin, an alkali-soluble resin having a polymerizable group may be used. Examples of the polymerizable group include a (meth)allyl group and a (meth)acryloyl group. As the alkali-soluble resin having a polymerizable group, an alkali-soluble resin containing a polymerizable group on a side chain thereof, and the like are useful. Examples of the alkali-soluble resin containing a polymerizable group include DIANAL NR Series (manufactured by Mitsubishi Rayon Co., Ltd.), PHOTOMER 6173 (polyurethane acrylic oligomer containing COOH, manufactured by Diamond Shamrock Co., Ltd.), VISCOAT R-264 and KS RESIST 106 (both manufactured by Osaka Organic Chemical Industry, Ltd.), CYCLOMER P Series (for example, ACA230AA) and PLACCEL CF200 Series (both manufactured by Daicel Chemical Industries, Ltd.), EBECRYL 3800 (manufactured by Daicel-UCB Co., Ltd.), and ACRYCURE RD-F8 (manufactured by Nippon Shokubai Co., Ltd.).

It is also preferable that the alkali-soluble resin includes a polymer obtained by polymerizing monomer components including a compound represented by General Formula (ED1) and/or the compound represented by General Formula (1) of JP2010-168539A (these compounds are hereinafter also referred to as an "ether dimer" in some cases).

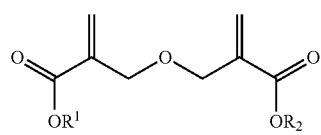
(ED1)

In General Formula (ED1), $R^1$ and $R^2$ each independently represent a hydrogen atom or a hydrocarbon group having 1 to 25 carbon atoms, which may have a substituent.

Specific examples of the ether dimer include those described in paragraph 0317 of JP2013-29760A, the contents of which are incorporated herein by reference. These ether dimers may be of one kind or of two or more kinds.

The alkali-soluble resin may include a repeating unit derived from a compound represented by Formula (X).

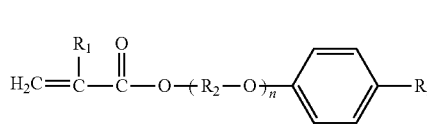
(X)

In Formula (X), $R_1$ represents a hydrogen atom or a methyl group, $R_2$ represents an alkylene group having 2 to 10 carbon atoms, $R_3$ represents a hydrogen atom or an alkyl group having 1 to 20 carbon atoms, which may include a benzene ring, and n represents an integer of 1 to 15.

In Formula (X), the number of carbon atoms in the alkylene group of $R_2$ is preferably 2 or 3. Further, the number of carbon atoms in the alkyl group of $R_3$ is 1 to 20, and more preferably 1 to 10, and the alkyl group of $R_3$ may include a benzene ring. Examples of the alkyl group including a benzene ring, represented by $R_3$, include a benzyl group and a 2-phenyl(iso)propyl group.

Specific examples of the alkali-soluble resin include the following resins. In the following formulae, Me is a methyl group.

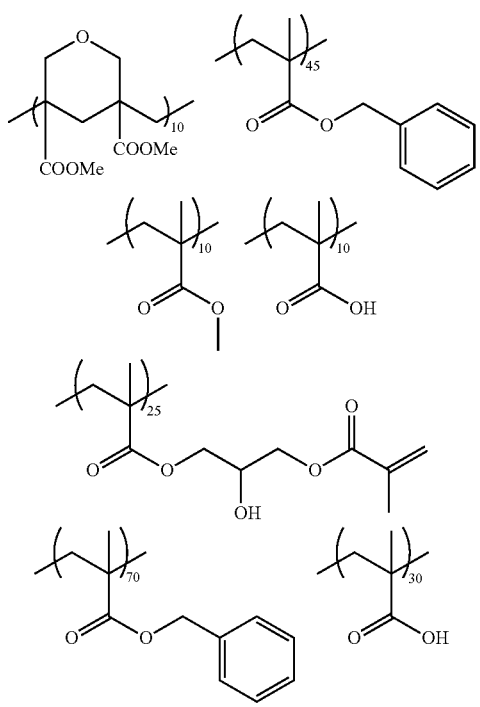

With regard to the alkali-soluble resin, reference can be made to the descriptions in paragraphs 0558 to 0571 of JP2012-208494A ([0685] to [0700] of the corresponding US2012/0235099A), the contents of which are incorporated herein by reference. In addition, the copolymers (B) described in paragraph Nos. 0029 to 0063 of JP2012-32767A and the alkali-soluble resins used in Examples of the document, the binder resins described in paragraph Nos. 0088 to 0098 of JP2012-208474A and the binder resins used in Examples of the document, the binder resins described in paragraph Nos. 0022 to 0032 of JP2012-137531A and the binder resins in Examples of the document, the binder resins described in paragraph Nos. 0132 to 0143 of JP2013-024934A and the binder resins used in Examples of the document, the binder resins described in paragraph Nos. 0092 to 0098 of JP2011-242752A and used in Examples, or the binder resins described in paragraph Nos. 0030 to 0072 of JP2012-032770A can be used, and the contents of these publications are incorporated herein by reference.

The acid value of the alkali-soluble resin is preferably 30 to 500 mgKOH/g. The lower limit is more preferably 50 mgKOH/g or more, and still more preferably 70 mgKOH/g or more. The upper limit is more preferably 400 mgKOH/g or less, still more preferably 200 mgKOH/g or less, particularly preferably 150 mgKOH/g or less, and even still more preferably 120 mgKOH/g or less.

The content of the alkali-soluble resin is preferably 1% to 20% by mass with respect to the total solid content of the coloring composition. The lower limit is preferably 2% by mass or more, and more preferably 3% by mass or more. The upper limit is preferably 15% by mass or less, and more preferably 12% by mass or less. The coloring composition of the present invention may include one kind or two or more kinds of the alkali-soluble resins. In a case where two or more kinds of the alkali-soluble resin are included, a total amount thereof preferably falls within the range.

<<Solvent>>

The coloring composition of the present invention preferably contains a solvent. The solvent is preferably an organic solvent. The solvent is not particularly limited as long as it satisfies the solubility of the respective components or the coatability of the coloring composition.

Suitable examples of the organic solvent include esters such as ethyl acetate, n-butyl acetate, isobutyl acetate, cyclohexyl acetate, amyl formate, isoamyl acetate, butyl propionate, isopropyl butyrate, ethyl butyrate, butyl butyrate, methyl lactate, ethyl lactate, alkyl alkyloxyacetate esters (for example, methyl alkyloxyacetate, ethyl alkyloxyacetate, and butyl alkyloxyacetate (for example, methyl methoxyacetate, ethyl methoxyacetate, butyl methoxyacetate, methyl ethoxyacetate, and ethyl ethoxyacetate)), alkyl 3-alkyloxypropionate esters (for example, methyl 3-alkyloxypropionate and ethyl 3-alkyloxypropionate (for example, methyl 3-methoxypropionate, ethyl 3-methoxypropionate, methyl 3-ethoxypropionate, and ethyl 3-ethoxypropionate)), alkyl 2-alkyloxypropionate esters (for example, methyl 2-alkyloxypropionate, ethyl 2-alkyloxypropionate, and propyl 2-alkyloxypropionate (for example, methyl 2-methoxypropionate, ethyl 2-methoxypropionate, propyl 2-methoxypropionate, methyl 2-ethoxypropionate, and ethyl 2-ethoxypropionate)), methyl 2-alkyloxy-2-methyl propionate and ethyl 2-alkyloxy-2-methyl propionate (for example, methyl 2-methoxy-2-methyl propionate and ethyl 2-ethoxy-2-methyl propionate), methyl pyruvate, ethyl pyruvate, propyl pyruvate, methyl acetoacetate, ethyl acetoacetate, methyl 2-oxobutanoate, and ethyl 2-oxobutanoate, ethers, for example, diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monomethyl ether acetate, propylene glycol monoethyl ether acetate, and propylene glycol monopropyl ether acetate, ketones, for example, methyl ethyl ketone, cyclohexanone, cyclopentanone, 2-heptanone, and 3-heptanone, and aromatic hydrocarbons, for example, toluene and xylene.

The organic solvents may be used singly or in combination of two or more kinds thereof. In a case where the organic solvents are used in combination of two or more kinds thereof, the solvent is particularly preferably a mixed solution formed of two or more kinds selected from methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol methyl ether, and propylene glycol methyl ether acetate.

In the present invention, the organic solvent preferably has a content of peroxides of 0.8 mmol/L or less, and more preferably, it does not substantially include peroxides.

The content of the solvent is preferably an amount such that the total solid content of the coloring composition is 5% to 80% by mass. The lower limit is preferably 10% by mass or more. The upper limit is preferably 60% by mass or less, more preferably 50% by mass or less, and still more preferably 40% by mass or less.

<<Curable Compound>>

The coloring composition of the present invention contains a curable compound. As the curable compound, known compounds which can be crosslinked by a radical, an acid, or heat can be used. Examples thereof include a compound having a group having an ethylenically unsaturated bond, a cyclic ether (epoxy or oxetane) group, a methylol group, or the like, with the compound having a group having an ethylenically unsaturated bond being preferable. Examples of the group having an ethylenically unsaturated bond include a vinyl group, a (meth)allyl group, and a (meth)acryloyl group.

In the present invention, the curable compound is preferably a polymerizable compound, and more preferably a radically polymerizable compound. Examples of the radically polymerizable compound include a compound having a group having an ethylenically unsaturated bond.

The content of the curable compound is preferably 0.1% to 50% by mass with respect to the total solid content of the coloring composition. The lower limit is, for example, more preferably 0.5% by mass or more, and still more preferably 1% by mass or more. The upper limit is, for example, more preferably 45% by mass or less, and still more preferably 40% by mass or less. The curable compounds may be used singly or in combination of two or more kinds thereof. In a case where the curable compounds are used in combination of two or more kinds thereof, the total amount thereof preferably falls within the range.

(Polymerizable Compound)

In the present invention, the polymerizable compound may be, for example, any of chemical forms such as a monomer, a prepolymer, that is, a dimer or a trimer, an oligomer, a mixture thereof, a multimer thereof, and the like. In a case where the polymerizable compound is a photoradically polymerizable compound, the monomer is preferable.

The molecular weight of the polymerizable compound is preferably 100 to 3,000. The upper limit is preferably 2,000 or less, and more preferably 1,500 or less. The lower limit is preferably 150 or more, and more preferably 250 or more.

The polymerizable compound is preferably a trifunctional to pentadecafunctional (meth)acrylate compound, and more preferably a trifunctional to hexafunctional (meth)acrylate compound. With regard to these specific examples, reference can be made to the compounds described in paragraph Nos. 0095 to 0108 of JP2009-288705A, paragraph 0227 of JP2013-29760A, and paragraph Nos. 0254 to 0257 of JP2008-292970A, the contents of which are incorporated herein by reference.

As the polymerizable compound, dipentaerythritol triacrylate (KAYARAD D-330 as a commercially available product; manufactured by Nippon Kayaku Co., Ltd.), dipentaerythritol tetraacrylate (KAYARAD D-320 as a commercially available product; manufactured by Nippon Kayaku Co., Ltd.), dipentaerythritol penta(meth)acrylate (KAYARAD D-310 as a commercially available product; manufactured by Nippon Kayaku Co., Ltd.), dipentaerythritol hexa(meth)acrylate (KAYARAD DPHA as a commercially available product; manufactured by Nippon Kayaku Co., Ltd., A-DPH-12E manufactured by Shin-Nakamura Chemical Co., Ltd.), and a structure in which these (meth)acryloyl groups are bonded via an ethylene glycol or propylene glycol residue (for example, SR454 and SR499, commercially available from Sartomer Company, Inc.) are preferable. Oligomer types of these can also be used. In addition, KAYARAD RP-1040 and DPCA-20 (manufactured by Nippon Kayaku Co., Ltd.), or pentaerythritol tetraacrylate (NK ESTER A-TMMT as a commercially available product; manufactured by Shin-Nakamura Chemical Co., Ltd.) can also be used.

The polymerizable compound may have an acid group such as a carboxyl group, a sulfonic acid group, and a phosphoric acid group. Examples of the commercially available product thereof include M-305, M-510, and M-520 which are each polybasic acid-modified acryl oligomers manufactured by TOAGOSEI, CO., LTD.

The acid value of the polymerizable compound having an acid group is preferably 0.1 to 40 mgKOH/g, and particularly preferably 5 to 30 mgKOH/g. In a case where the acid value of the polymerizable compound is 0.1 mgKOH/g or more, the development and dissolution characteristics are good, whereas in a case where the acid value is 40 mgKOH/g or less, it is advantageous in production or handling. In addition, the photopolymerization performance is good and the curability is excellent.

In another preferred aspect, the polymerizable compound is a compound having a caprolactone structure.

The polymerizable compound having a caprolactone structure is commercially available as KAYARAD DPCA series from Nippon Kayaku Co., Ltd., and examples thereof include DPCA-20, DPCA-30, DPCA-60, and DPCA-120.

As the polymerizable compound, a polymerizable compound having an alkyleneoxy group can be used. The polymerizable compound having an alkyleneoxy group is preferably a polymerizable compound having an ethyleneoxy group and/or a propyleneoxy group, more preferably a polymerizable compound having an ethyleneoxy group, and still more preferably a trifunctional to hexafunctional (meth) acrylate compound having 4 to 20 ethyleneoxy groups.

Specific examples of the polymerizable compound having an alkyleneoxy group include the following compound.

As the polymerizable compound, the urethane acrylates described in JP1973-41708B (JP-S48-41708B), JP1976-37193A (JP-S51-37193A), JP1990-32293B (JP-H02-32293B), and JP1990-16765B (JP-H02-167658), and the urethane compounds which have an ethylene oxide-based skeleton described in JP1983-49860B (JP-S58-49860B), JP1981-17654B (JP-S56-17654B), JP1987-39417B (JP-S62-39417B), and JP1987-39418B (JP-S62-39418B) are also suitable. In addition, it is also preferable to use the addition-polymerizable compounds having an amino structure or a sulfide structure in the molecule, described in JP1988-277653A (JP-S63-277653A), JP1988-260909A (JP-S63-260909A), and JP1989-105238A (JP-H01-105238A).

Examples of commercially available products thereof include urethane oligomers UAS-10 and UAB-140 (manufactured by Sanyo-kokusaku Pulp Co., Ltd.), UA-7200 (manufactured by Shin-Nakamura Chemical Co., Ltd.), DPHA-40H (manufactured by Nippon Kayaku Co., Ltd.), and UA-306H, UA-306T, UA-306I, AH-600, T-600, and AI-600 (manufactured by Kyoeisha Chemical Co., Ltd.).

In a case where a polymerizable compound is used as the curable compound, the content of the polymerizable compound is preferably 0.1% to 50% by mass with respect to the total solid content of the composition. The lower limit is, for example, more preferably 0.5% by mass or more, and still more preferably 1% by mass or more. The upper limit is, for example, more preferably 45% by mass or less, and still more preferably 40% by mass or less. The curable compounds may be used singly or in combination of two or more kinds thereof. In a case where the curable compounds are used in combination of two or more kinds thereof, the total amount thereof preferably falls within the range.

In addition, the content of the polymerizable compound is preferably 10% to 100% by mass, and more preferably 30% to 100% by mass, with respect to the total mass of the curable compound.

(Compound Having Epoxy Group)

In the present invention, a compound having an epoxy group can be used as the curable compound. The compound having an epoxy group is preferably a compound having two or more epoxy groups per molecule. The compound having

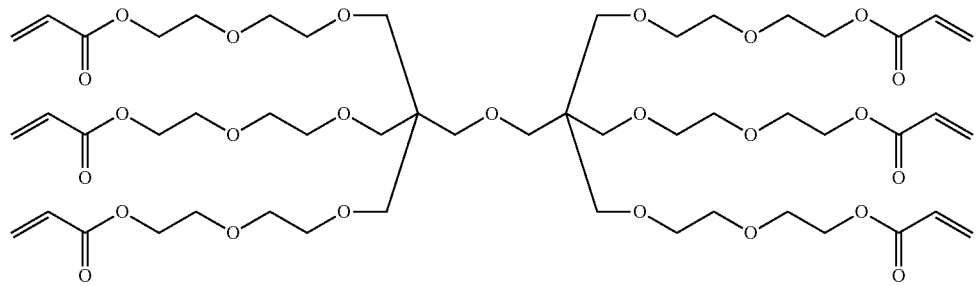 [SMILES: C=CC(=O)OCCOCCOCC(COCCOCCOC(=O)C=C)(COCCOCCOC(=O)C=C)COCC(COCCOCCOC(=O)C=C)(COCCOCCOC(=O)C=C)COCCOCCOC(=O)C=C]

Examples of the commercially available product of the polymerizable compound having an alkyleneoxy group include SR-494 which is a tetrafunctional acrylate having four ethyleneoxy groups, manufactured by Sartomer Co., Inc., DPCA-60 which is a hexafunctional acrylate having six pentyleneoxy groups, and TPA-330 which is a trifunctional acrylate having three isobutyleneoxy groups, both manufactured by Nippon Kayaku Co., Ltd.

an epoxy group preferably has 2 to 100 epoxy groups per molecule. The upper limit can be set to, for example, 10 or less, or 5 or less.

The compound having an epoxy group in the present invention preferably has a structure having an aromatic ring and/or an aliphatic ring, and more preferably has a structure having an aliphatic ring. The epoxy group is preferably bonded to an aromatic ring and/or an aliphatic ring via a single bond or a linking group. Examples of the linking group include groups including at least one selected from an alkylene group, an arylene group, —O—, a structure represented by —NR'— (R' represents a hydrogen atom, an alkyl group which may have a substituent, or an aryl group which may have a substituent, with the hydrogen atom being preferable), —SO$_2$—, —CO—, —O—, and —S—.

In a case of a compound having an aliphatic ring, a compound in which an epoxy group is bonded to an aliphatic ring via a direct bond (a single bond) is preferable. In a case of a compound having an aromatic ring, a compound in which an epoxy group is bonded to an aromatic ring via a linking group is preferable. The linking group is preferably an alkylene group, or a group formed by combination of an alkylene group with —O—.

In addition, as the compound having an epoxy group, a compound having a structure in which 2 or more aromatic rings are linked to a hydrocarbon group can also be used. The hydrocarbon group is preferably an alkylene group having 1 to 6 carbon atoms. The epoxy group is preferably linked via the linking group.

The epoxy equivalent (=the molecular weight of the compound having an epoxy group/the number of epoxy groups) of the compound having an epoxy group is preferably 500 g/eq or less, more preferably 100 to 400 g/eq, and still more preferably 100 to 300 g/eq.

The compound having an epoxy group may be either a low molecular compound (for example, a molecular weight of less than 2,000, and further a molecular weight of less than 1,000) or a high molecular compound (macromolecule) (for example, a molecular weight of 1,000 or more, and in a case of a polymer, a weight-average molecular weight of 1,000 or more). The weight-average molecular weight of the compound having an epoxy group is preferably 200 to 100,000, and more preferably 500 to 50,000. The upper limit of the weight-average molecular weight is preferably 3,000 or less, more preferably 2,000 or less, and still more preferably 1,500 or less.

As the compound having an epoxy group, the compounds described in paragraph Nos. 0034 to 0036 of JP2013-011869A, paragraph Nos. 0147 to 0156 of JP2014-043556A, or paragraph Nos. 0085 to 0092 of JP2014-089408A, the contents of the publications are incorporated herein by reference, can also be used. Examples of the commercially available products thereof include jER825, jER827, jER828, jER834, jER1001, jER1002, jER1003, jER1055, jER1007, jER1009, and jER1010 (all manufactured by Japan Epoxy Resins Co., Ltd.), EPICLON860, EPICLON1050, EPICLON1051, and EPICLON1055 (all manufactured by DIC Corporation) as a bisphenol A type epoxy resin; jER806, jER807, jER4004, jER4005, jER4007, and jER4010 (all manufactured by Japan Epoxy Resins Co., Ltd.), EPICLON830 and EPICLON83S (both manufactured by DIC Corporation), LCE-21 and RE-602S (both manufactured by Nippon Kayaku Co., Ltd.) as a bisphenol F type epoxy resin; jER152, jER154, jER157S70, and jER157S65 (all manufactured by Japan Epoxy Resins Co., Ltd.), EPICLON N-740, EPICLON N-770, and EPICLON N-775 (all manufactured by DIC Corporation) as a phenol novolac type epoxy resin; EPICLON N-660, EPICLON N-665, EPICLON N-670, EPICLON N-673, EPICLON N-680, EPICLON N-690, and EPICLON N-695 (all manufactured by DIC Corporation), EOCN-1020 (all manufactured by Nippon Kayaku Co., Ltd.) as a cresol novolac type epoxy resin; and ADEKA RESIN EP-4080S, ADEKA RESIN EP-4085S, and ADEKA RESIN EP-4088S (all manufactured by ADEKA Corporation), CELLOXIDE 2021P, CELLOXIDE 2081, CELLOXIDE 2083, CELLOXIDE 2085, EHPE3150, EPOLEAD PB 3600, and EPOLEAD PB 4700 (all manufactured by Daicel Chemical Industries, Ltd.), and DENACOL EX-212L, EX-214L, EX-216L, EX-321L, and EX-850L (all manufactured by Nagase ChemteX Corporation) as an aliphatic epoxy resin. Other examples include ADEKA RESIN EP-4000S, ADEKA RESIN EP-4003S, ADEKA RESIN EP-4010S, and ADEKA RESIN EP-4011S (all manufactured by ADEKA Corporation), NC-2000, NC-3000, NC-7300, XD-1000, EPPN-501, and EPPN-502 (all manufactured by ADEKA Corporation), and jER1031S (manufactured by Japan Epoxy Resins Co., Ltd.).

In a case where the compound having an epoxy group is used as the curable compound, the content of the compound having an epoxy group is preferably 0.1% to 40% by mass with respect to the total solid content of the coloring composition. The lower limit is, for example, more preferably 0.5% by mass or more, and still more preferably 1% by mass or more. The upper limit is, for example, more preferably 30% by mass or less, and still more preferably 20% by mass or less. The compound having an epoxy group may be used singly or in combination of two or more kinds thereof. In a case where the compound is used in combination of two or more kinds thereof, the total amount thereof preferably falls within the range.

Furthermore, the content of the compound having an epoxy group is preferably 1% to 80% by mass, more preferably 1% to 50% by mass, and still more preferably 1% to 30% by mass, with respect to the total mass of the curable compound.

In addition, in a case where the polymerizable compound is used in combination with the compound having an epoxy group, the mass ratio of the polymerizable compound to the compound having an epoxy group is preferably polymerizable compound:compound having an epoxy group=100:1 to 100:400, more preferably 100:1 to 100:100, and still more preferably 100:1 to 100:50.

<<Curing Accelerator>>

A curing accelerator may be added to the coloring composition of the present invention for the purpose of promoting the reaction of a polymerizable compound or lowering a curing temperature. Examples of the curing accelerator include polyfunctional thiol compounds having two or more mercapto groups in a molecule thereof. The polyfunctional thiol compounds may also be added for the purpose of improving stability, odor, resolution, developability, adhesiveness, or the like. The polyfunctional thiol compounds are preferably secondary alkanethiols, and particularly preferably compounds having structures represented by General Formula (T1).

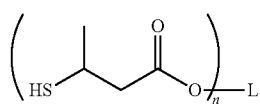

General Formula (T1)

(In Formula (T1), n represents an integer of 2 to 4, and L represents a divalent to tetravalent linking group.)

In General Formula (T1), it is preferable that the linking group L is an aliphatic group having 2 to 12 carbon atoms, and it is particularly preferable that n is 2 and L is an alkylene group having 2 to 12 carbon atoms. Specific examples of the polyfunctional thiol compounds are compounds represented by Structural Formulae (T2) to (T4), with the compound represented by Formula (T2) being particularly preferable. These polyfunctional thiol compounds can be used singly or in combination of two or more kinds thereof.

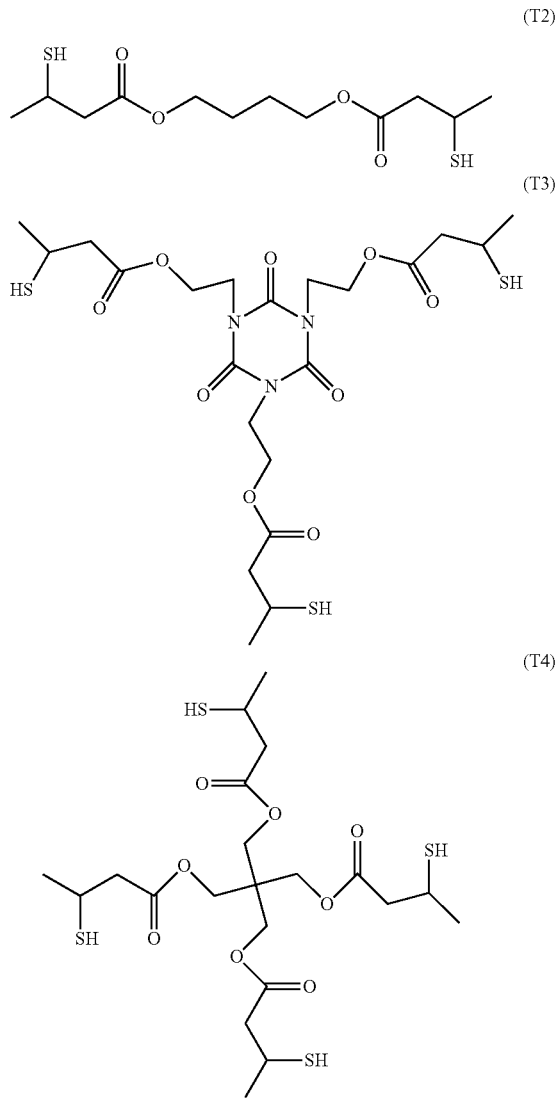

Moreover, as the curing accelerator, a methylol-based compound (for example, the compounds exemplified as a crosslinking agent in paragraph 0246 of JP2015-34963A), amines, phosphonium salts, amidine salts, amide compounds (each of which are the curing agents described in, for example, paragraph 0186 of JP2013-41165A), base generators (for example, the ionic compounds described in JP2014-55114A), cyanate compounds (for example, the compounds described in paragraph 0071 of JP2012-150180A), alkoxysilane compounds (for example, the alkoxysilane compounds having epoxy groups, described in JP2011-253054A), onium salt compounds (for example, the compounds exemplified as an acid generator in paragraph 0216 of JP2015-34963A, and the compounds described in JP2009-180949A), or the like can also be used.

In a case where the coloring composition of the present invention contains the curing accelerator, the content of the curing accelerator is preferably 0.3% to 8.9% by mass, and more preferably 0.8% to 6.4% by mass, with respect to the total solid content of the coloring composition.

<<Photopolymerization Initiator>>

It is preferable that the coloring composition of the present invention further contains a photopolymerization initiator. The photopolymerization initiator is not particularly limited as long as it can initiate the polymerization of polymerizable compounds, and can be appropriately selected from known photopolymerization initiators. For example, it is preferably sensitive to radiations from UV to visible regions. Further, it may be an activator that causes a certain action with a photoexcited sensitizer to generate active radicals or an initiator that functions to initiate cationic polymerization depending on the type of the monomer. Incidentally, the photopolymerization initiator preferably contains at least one compound having a molar light absorption coefficient of at least about 50 in the range of about 300 nm to 800 nm (more preferably 330 nm to 500 nm).

Examples of the photopolymerization initiator include halogenated hydrocarbon derivatives (for example, those having a triazine skeleton and those having an oxadiazole skeleton), acylphosphine compounds such as acylphosphine oxide, hexaaryl biimidazole, oxime compounds such as oxime derivatives, organic peroxides, thio compounds, ketone compounds, aromatic onium salts, ketoxime ethers, aminoacetophenone compounds, and hydroxyacetophenone.

Moreover, from the viewpoint of the exposure sensitivity, a compound selected from the group consisting of a trihalomethyl triazine compound, a benzyl dimethyl ketal compound, an α-hydroxyketone compound, an α-aminoketone compound, an acylphosphine compound, a phosphine oxide compound, a metallocene compound, an oxime compound, a triaryl imidazole dimer, an onium compound, a benzothiazole compound, a benzophenone compound, an acetophenone compound and a derivative thereof, a cyclopentadiene-benzene-iron complex and a salt thereof, a halomethyl oxadiazole compound, and a 3-aryl-substituted coumarin compound is preferable.

At least one compound selected from the group consisting of a trihalomethyltriazine compound, an α-aminoketone compound, an acylphosphine compound, a phosphine oxide compound, an oxime compound, a triaryl imidazole dimer, an onium compound, a benzophenone compound, and an acetophenone compound is more preferable, and at least one compound selected from the group consisting of a trihalomethyltriazine compound, an α-aminoketone compound, an oxime compound, a triaryl imidazole dimer, and a benzophenone compound is particularly preferable.

In particular, in a case where the coloring composition of the present invention is used to prepare a color filter of a solid-state imaging device, it is necessary to form a fine pattern in a sharp shape, and thus it is important to obtain excellent curability and perform development without a residue remaining in an unexposed area. From such viewpoints, it is particularly preferable that an oxime compound is used as the photopolymerization initiator. In particular, in a case where a fine pattern is formed in a solid-state imaging device, a stepper exposing machine is used for exposure for curing, and this exposure device may be damaged by halogen, and it is also necessary to reduce the addition amount of the photopolymerization initiator to be small. Therefore, in consideration of this point, it is particularly preferable an oxime compound is used as the photopolymerization initiator for forming a fine pattern in a solid-state imaging device or the like. In addition, by using the oxime compound, color transfer properties can be further improved.

With regard to specific examples of the photopolymerization initiator, reference can be made to, for example, the descriptions in paragraphs 0265 to 0268 of JP2013-29760A, the contents of which are incorporated herein by reference.

As the photopolymerization initiator, a hydroxyacetophenone compound, an aminoacetophenone compound, and an acylphosphine compound can also be suitably used. More specifically, for example, the aminoacetophenone-based initiator described in JP1998-291969A (JP-H10-291969A), and the acylphosphine oxide-based initiator described in JP4225898B can also be used.

As the hydroxyacetophenone-based initiator, IRGACURE-184, DAROCUR-1173, IRGACURE-500, IRGACURE-2959, and IRGACURE-127 (trade names, all manufactured by BASF) can be used. As the aminoacetophenone-based initiator, IRGACURE-907, IRGACURE-369, and IRGACURE-379 (trade names: all manufactured by BASF) which are commercially available products can be used. In addition, as the aminoacetophenone-based initiator, the compound described in JP2009-191179A, of which an absorption wavelength matches with a light source at a long wavelength of 365 nm, 405 nm, or the like can be used. In addition, as the acylphosphine-based initiator, IRGACURE-819 or DAROCUR-TPO (trade names, both manufactured by BASF) which is a commercially available product can be used.

More preferred examples of the photopolymerization initiator include an oxime compound. As the specific examples of the oxime compound, the compound described in JP2001-233842A, the compound described in JP2000-80068A, and the compound described in JP2006-342166A can be used.

Examples of the oxime compound such as an oxime derivative, which can be suitably used as the photopolymerization initiator in the present invention include 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-(4-toluenesulfonyloxy)iminobutan-2-one, and 2-ethoxycarbonyloxyimino-1-phenylpropan-1-one.

Examples of the oxime compound also include the compounds described in J. C. S. Perkin II (1979), pp. 1653 to 1660, J. C. S. Perkin II (1979), pp. 156 to 162, Journal of Photopolymer Science and Technology (1995), pp. 202 to 232, and each of the publications of JP2000-66385A, JP2000-80068A, JP2004-534797A, and JP2006-342166A.

As the commercially available products thereof, IRGACURE-OXE01 (manufactured by BASF) and IRGACURE-OXE02 (manufactured by BASF) are also suitably used. In addition, TRONLY TR-PBG-304, TRONLY TR-PBG-309, and TRONLY TR-PBG-305 (manufactured by CHANGZHOU TRONLY NEW ELECTRONIC MATERIALS CO., LTD.), or ADEKA ARKLS NCI-930 (manufactured by ADEKA Corporation) can also be used.

Furthermore, as oxime compounds other than the above-described oxime compounds, the compound described in JP2009-519904A in which oxime is linked to an N-position of carbazole, the compound described in U.S. Pat. No. 7,626,957B in which a hetero-substituent is introduced into a benzophenone moiety, the compounds described in JP2010-15025A and US2009/292039A in which a nitro group is introduced into a colorant moiety, the ketoxime compound described in WO2009/131189A, the compound described in U.S. Pat. No. 7,556,910B, which contains a triazine skeleton and an oxime skeleton in the same molecule, the compound described in JP2009-221114A, which has maximum absorption at 405 nm and has excellent sensitivity to a light source of g-rays, and the like, may be used. Preferably, reference can be made to the descriptions in, for example, paragraphs 0274 and 0275 of JP2013-29760A, the contents of which are incorporated herein by reference. Specifically, as the oxime compound, a compound represented by General Formula (OX-1) is preferable. In addition, the compound may be an oxime compound in which an N—O bond of oxime forms an (E) isomer, an oxime compound in which the N—O bond forms a (Z) isomer, or a mixture in which the N—O bond forms a mixture of the (E) isomer and the (Z) isomer.

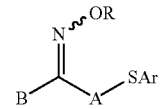

(OX-1)

In General Formula (OX-1), R and B each independently represent a monovalent substituent, A represents a divalent organic group, and Ar represents an aryl group.

In General Formula (OX-1), the monovalent substituent represented by R is preferably a monovalent non-metal atomic group.

Examples of the monovalent non-metal atomic group include an alkyl group, an aryl group, an acyl group, an alkoxycarbonyl group, an aryloxycarbonyl group, a heterocyclic group, an alkylthiocarbonyl group, and an arylthiocarbonyl group. Further, these groups may have one or more substituents. In addition, the above-mentioned substituents may further be substituted with other substituents.

Examples of the substituents include a halogen atom, an aryloxy group, an alkoxycarbonyl group, an aryloxycarbonyl group, an acyloxy group, an acyl group, an alkyl group, and an aryl group.

As the monovalent substituent represented by B in General Formula (OX-1), an aryl group, a heterocyclic group, an arylcarbonyl group, or a heterocyclic carbonyl group is preferable. These groups may have one or more substituents. Examples of the substituent include the above-mentioned substituents.

As the divalent organic group represented by A in General Formula (OX-1), an alkylene group having 1 to 12 carbon atoms, or an alkynylene group is preferable. These groups may have one or more substituents. Examples of the substituent include the above-mentioned substituents.

In the present invention, an oxime compound having a fluorene ring can be used as the photopolymerization initiator. Specific examples of the oxime compound having a fluorene ring include the compounds described in JP2014-137466A, the contents of which are incorporated herein by reference.

In the present invention, an oxime compound having a fluorine atom can also be used as the photopolymerization initiator. Specific examples of the oxime compound having a fluorine atom include the compounds described in JP2010-262028A, the compounds 24, and 36 to 40 described in JP2014-500852A, and the compounds (C-3) described in JP2013-164471A, the contents of which are incorporated herein by reference.

In the present invention, an oxime compound having a nitro group can be preferably used as the photopolymerization initiator. Specific examples of the oxime compound having a nitro group include the compounds described in paragraphs 0031 to 0047 of JP2013-114249A, paragraphs 0008 to 0012 and 0070 to 0079 of JP2014-137466A, and ADEKA ARKLS NCI-831 (manufactured by ADEKA).

Specific examples of the oxime compound which is preferably used in the present invention are shown below, but the present invention is not limited thereto.
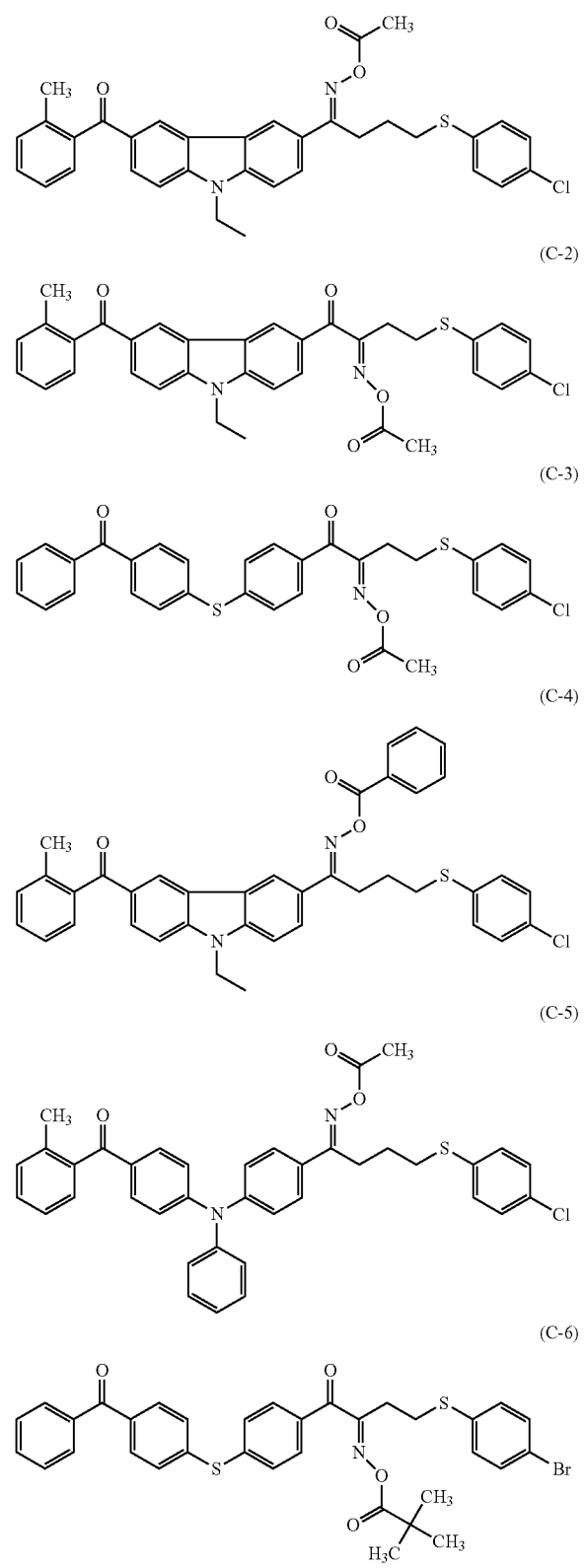
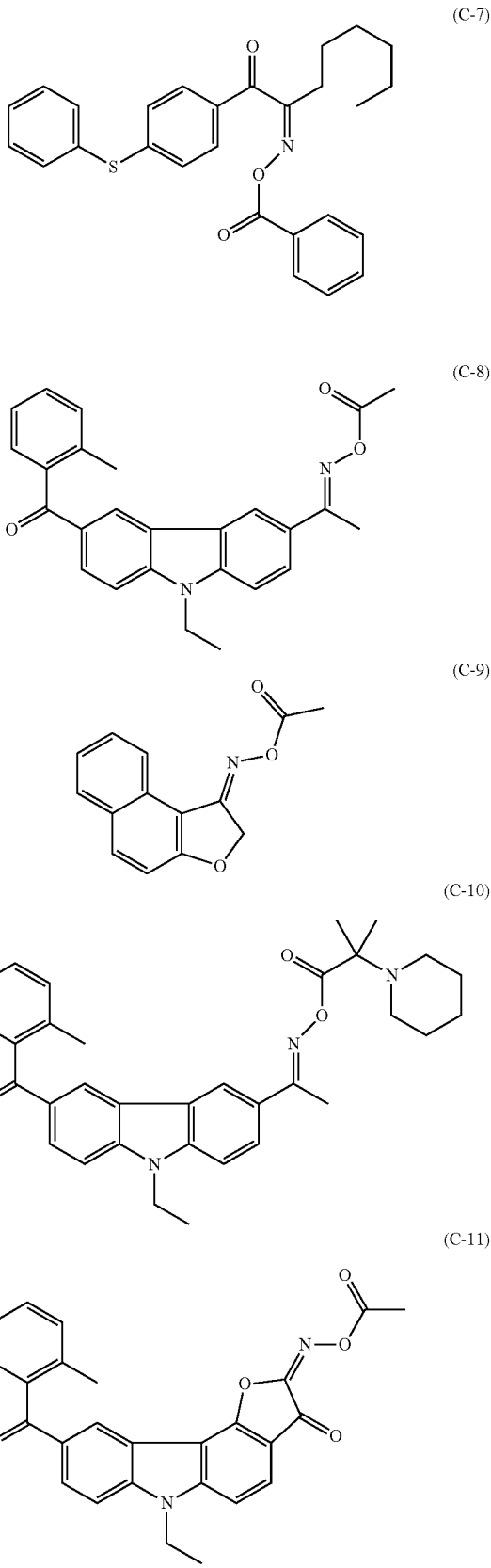

-continued

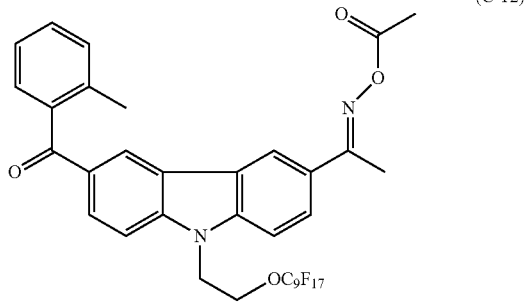
(C-12)

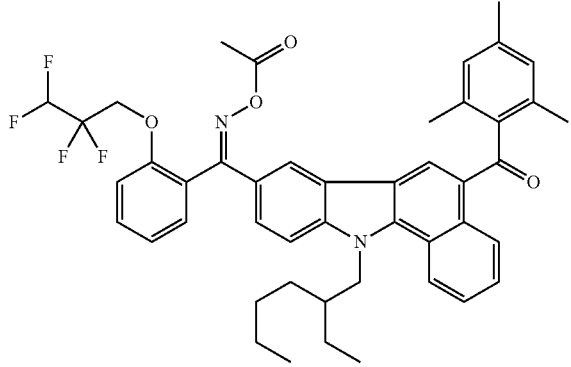
(C-13)

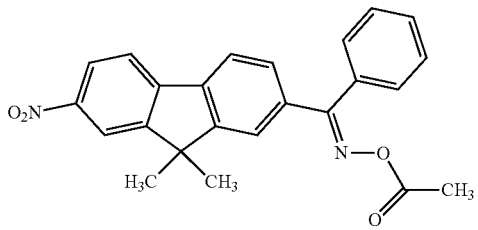
(C-14)

As the oxime compound, the compound having a maximum absorption wavelength in a wavelength range of 350 nm to 500 nm is preferable, the compound having an absorption wavelength in a wavelength range of 360 nm to 480 nm is more preferable, and the compound showing a high absorbance at 365 nm and 405 nm is particularly preferable.

From the viewpoint of sensitivity, the molar light absorption coefficient at 365 nm or 405 nm of the oxime compound is preferably 1,000 to 300,000, more preferably 2,000 to 300,000, and particularly preferably 5,000 to 200,000. The molar light absorption coefficient of the compound can be measured using a known method, but specifically, it is preferably measured, for example, by means of an ultraviolet and visible light spectrophotometer (Cary-5 spectrophotometer manufactured by Varian) at a concentration of 0.01 g/L using an ethyl acetate solvent.

The photopolymerization initiator may be used in combination of two or more kinds thereof, as desired.

In a case where the coloring composition of the present invention contains a photopolymerization initiator, the content of the photopolymerization initiator is preferably 0.1% to 50% by mass, more preferably 0.5% to 30% by mass, and still more preferably 1% to 20% by mass, with respect to the total solid content of the coloring composition. Within this range, better sensitivity and pattern forming properties are obtained. The coloring composition of the present invention may include one kind or two or more kinds of the photopolymerization initiators. In a case where two or more kinds of the photopolymerization initiators are included, the total amount thereof preferably falls within the range.

<<Pigment Derivative>>

The coloring composition of the present invention preferably contains a pigment derivative. Examples of the pigment derivative include a compound having a structure in which a portion of an organic pigment is substituted with an acid group, a basic group, or a phthalimidomethyl group. Examples of the acid group include a sulfo group, a carboxyl group, and quaternary ammonium salt groups thereof. Examples of the basic group include an amino group.

For a reason that the effect of the present invention is easily obtained, the pigment derivative is preferably a pigment derivative having a basic group, more preferably a pigment derivative having an amino group, and still more preferably a pigment derivative having a tertiary amino group.

Examples of the organic pigment for constituting the pigment derivative include a diketopyrrolopyrrole-based pigment, an azo-based pigment, a phthalocyanine-based pigment, an anthraquinone-based pigment, a quinacridone-based pigment, a dioxazine-based pigment, a perinone-based pigment, a perylene-based pigment, a thioindigo-based pigment, an isoindoline-based pigment, an isoindolinone-based pigment, a quinophthalone-based pigment, a threne-based pigment, a metal complex-based pigment, a quinoline-based pigment, and a benzimidazolone-based pigment. The organic pigment is preferably the quinoline-based pigment, the benzimidazolone-based pigment, or the isoindoline-based pigment, and more preferably the quinoline-based pigment or the benzimidazolone-based pigment.

In the present invention, the pigment derivative is preferably a compound having the following structure.

$$A\text{-}B\text{-}(\text{-}C\text{-}D\text{-}E)_t \quad (P)$$

In General Formula (P), A represents a structure selected from General Formulae (PA-1) to (PA-3), B represents a single bond, or a (t+1)-valent linking group, C represents a single bond, —NH—, —CONH—, —CO$_2$—, —SO$_2$NH—, —O—, —S—, or —SO$_2$—, D represents a single bond, an alkylene group, or an arylene group, E represents —SO$_3$H or a salt thereof, —CO$_2$H or a salt thereof, or —N(Rpa)(Rpb), Rpa and Rpb each independently represent an alkyl group or an aryl group, or they may be linked to each other to form a ring, and t represents an integer of 1 to 5.

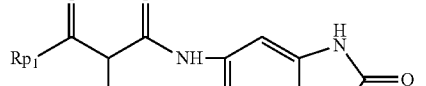
(PA-1)

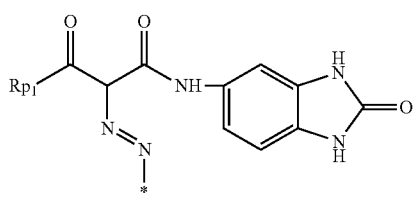
(PA-2)

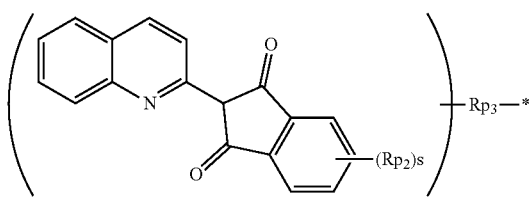
(PA-3)

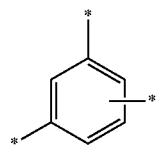
(PA-8)

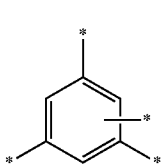
(PA-9)

$Rp_1$ represents an alkyl group or aryl group having 1 to 5 carbon atoms.

$Rp_2$ represents a halogen atom, an alkyl group, or a hydroxyl group, $Rp_3$ represents a single bond, —NH—, —CONH—, —CO$_2$—, —SO$_2$NH—, —O—, —S—, or —SO$_2$—, s represents an integer of 0 to 4, and in a case where s is 2 or more, a plurality of Rp2's may be the same as or different from each other, and

* represents a linking moiety with B.

$Rp_1$ is preferably a methyl group or a phenyl group, and most preferably a methyl group.

$Rp_2$ is preferably a halogen atom, and most preferably a chlorine atom.

In General Formula (P), examples of the (t+1)-valent linking group represented by B include an alkylene group, an arylene group, and a heteroarylene group. Examples of the alkylene group include linear, branched, and cyclic alkylene groups.

The (t+1)-valent linking group is particularly preferably a linking group represented by one of Structural Formulae (PA-4) to (PA-9). * represents a linking moiety between A and C.

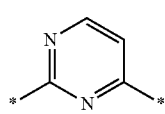
(PA-4)

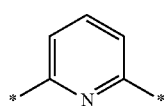
(PA-5)

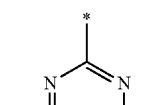
(PA-6)

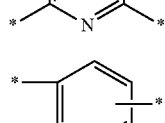
(PA-7)

Among Structural Formulae (PA-4) to (PA-9), in particular, a pigment derivative having a linking group represented by Structural Formula (PA-5) or (PA-8) as B is preferable.

In General Formula (P), examples of the alkylene group and the arylene group represented by D include a methylene group, an ethylene group, a propylene group, a butylene group, a pentylene group, a hexylene group, a decylene group, a cyclopropylene group, a cyclobutylene group, a cyclopentylene group, a cyclohexylene group, a cyclooctylene group, a cyclodecylene group, a phenylene group, and a naphthylene group. Among these, a linear alkylene group is preferable, and a linear alkylene group having 1 to 5 carbon atoms is more preferable as D.

In General Formula (P), E represents —SO$_3$H or a salt thereof, —CO$_2$H or a salt there, or —N(Rpa)(Rpb), with —N(Rpa)(Rpb) being preferable. Rpa and Rpb each independently represent an alkyl group or an aryl group. Examples of the alkyl group and the aryl group include a methyl group, an ethyl group, a propyl group, an isopropyl group, a butyl group, a sec-butyl group, a tert-butyl group, a pentyl group, an isopentyl group, a neopentyl group, a hexyl group, an octyl group, a decyl group, a cyclopropyl group, a cyclobutyl group, a cyclopentyl group, a cyclohexyl group, a cyclooctyl group, a cyclodecyl group, a phenyl group, and a naphthyl group. As Rpa and Rpb, an alkyl group is particularly preferable, and an alkyl group having 1 to 5 carbon atoms is most preferable.

In General Formula (P), in a case where E represents —SO$_3$H or a salt thereof, or —CO$_2$H or a salt there, an alkali metal such as a lithium atom, a sodium atom, and a potassium atom, ammonium, tetraalkylammonium, or the like is preferable as an atom or atomic group that forms a salt.

t is preferably 1 or 2.

Specific examples of the pigment derivative are set forth below, but the present invention is not limited thereto. In the following formulae, Me represents a methyl group, Et represents an ethyl group, Bu represents a butyl group, M represents a hydrogen atom, or an atom or atomic group that forms a salt. In addition, with regard to the pigment derivative, reference can be made to the descriptions in paragraphs 0162 to 0183 of JP2011-252065A, the contents of which are incorporated herein by reference.

| 49 | 50 |
|---|---|
| (A-1) 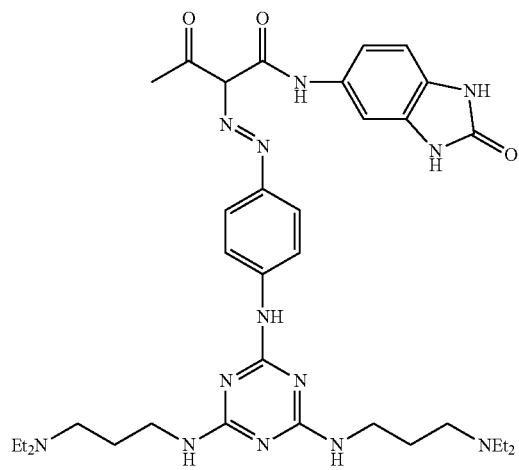 | (A-2) 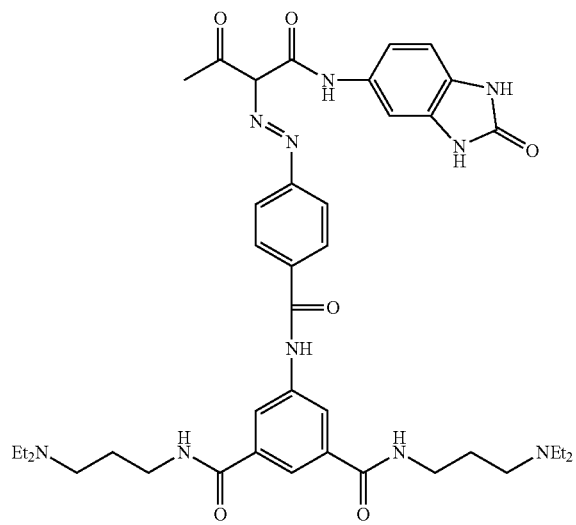 |
| (A-3) 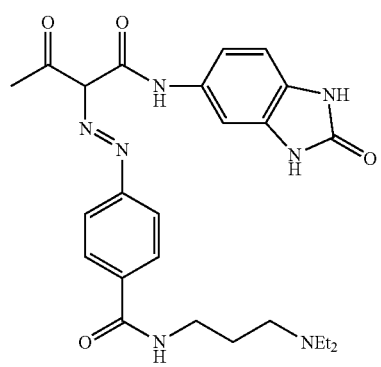 | (A-4) 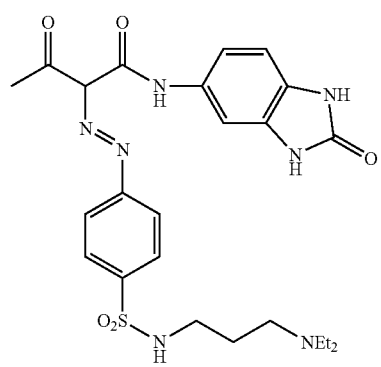 |
| (A-5) 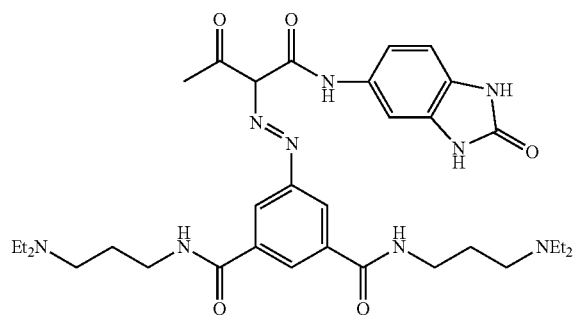 | (A-6) 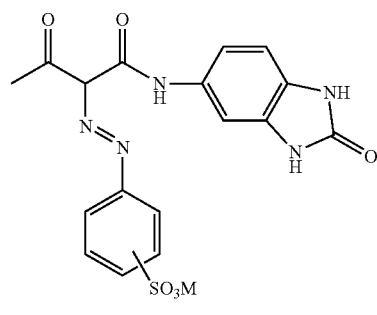 |
| (A-7) 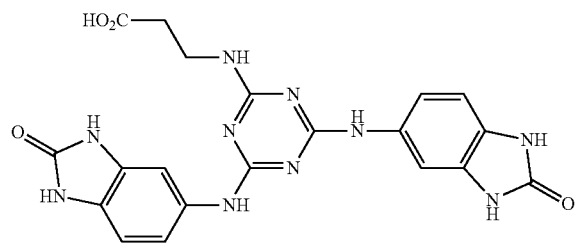 | (A-8) 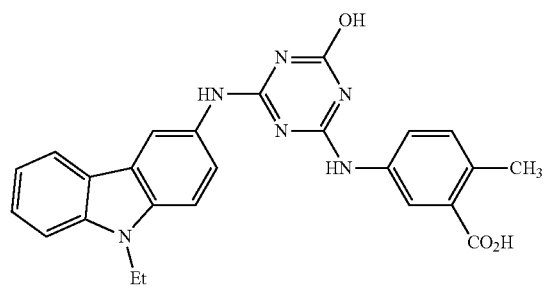 |

-continued
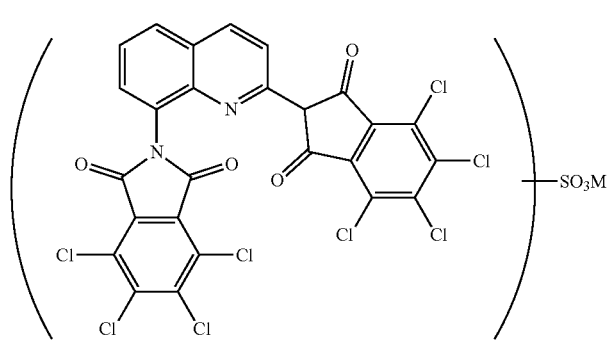
(A-9)
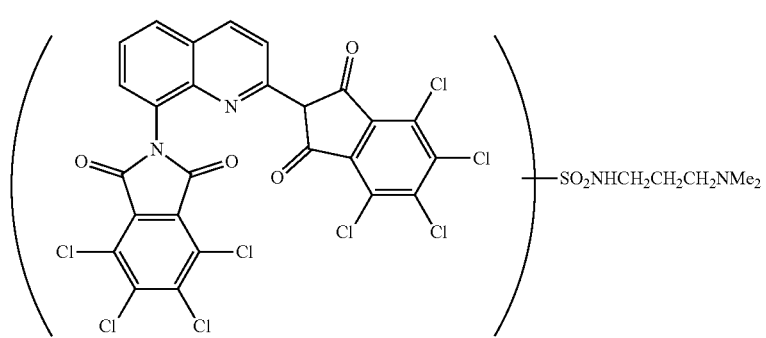
(A-10)
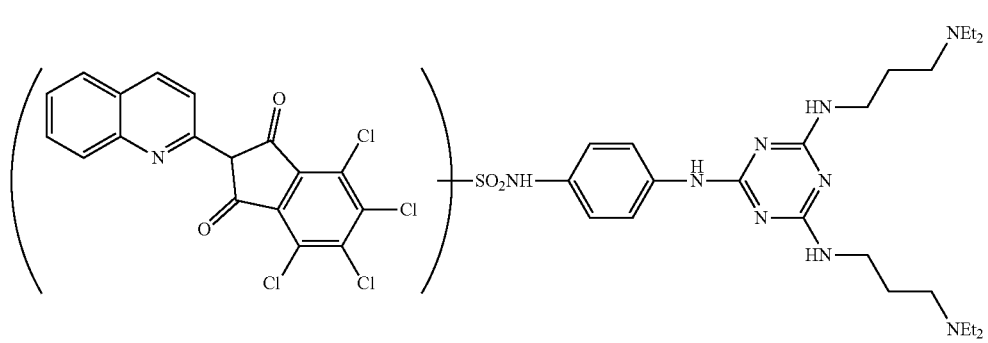
(A-11)
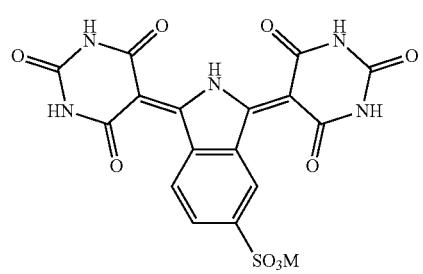
(A-12)
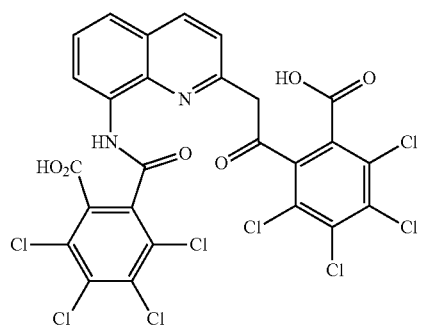
(A-13)

-continued
(A-14)
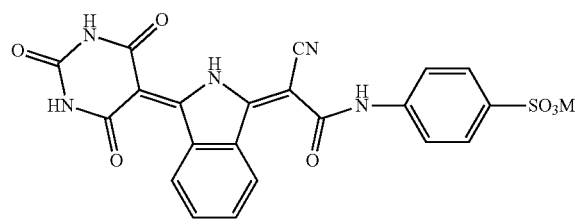
(A-15)
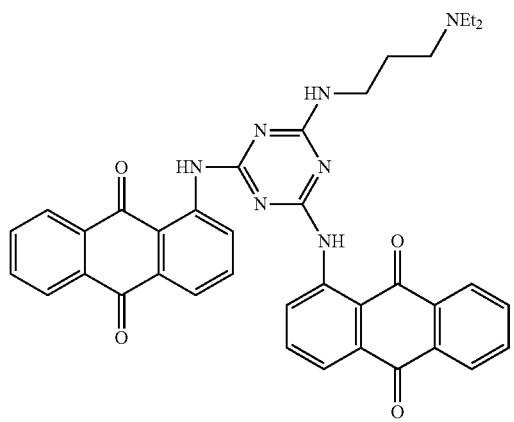
(A-16)
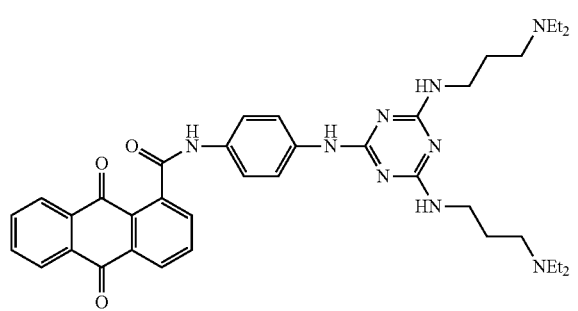
(A-17)
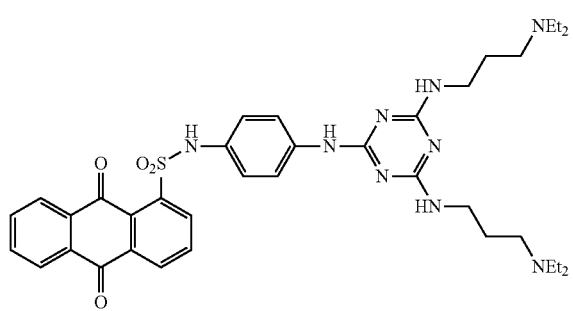
(A-18)
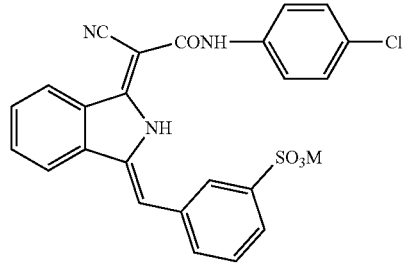
(A-19)
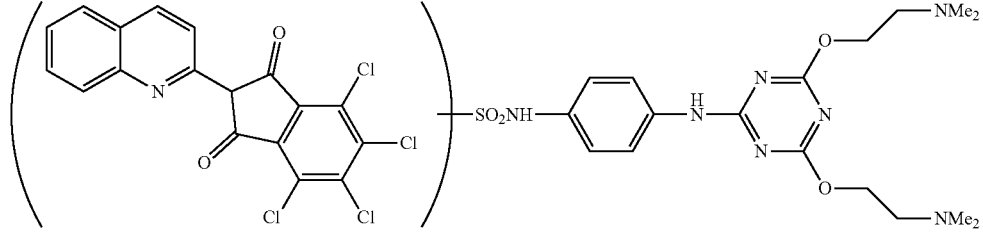
(A-20)
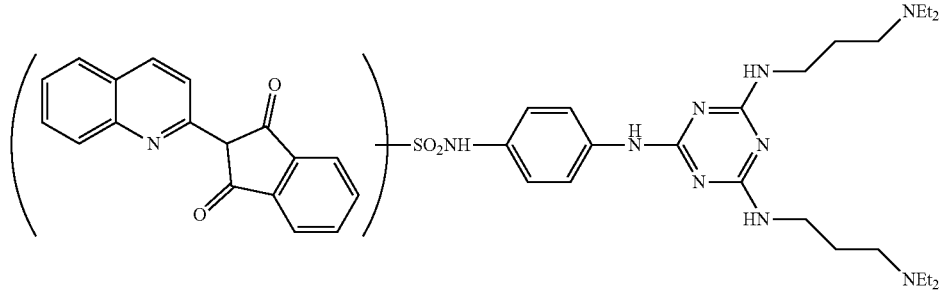

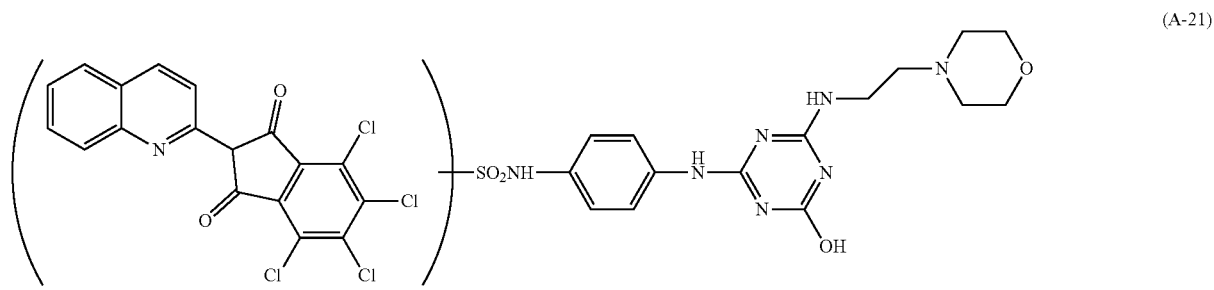
(A-21)
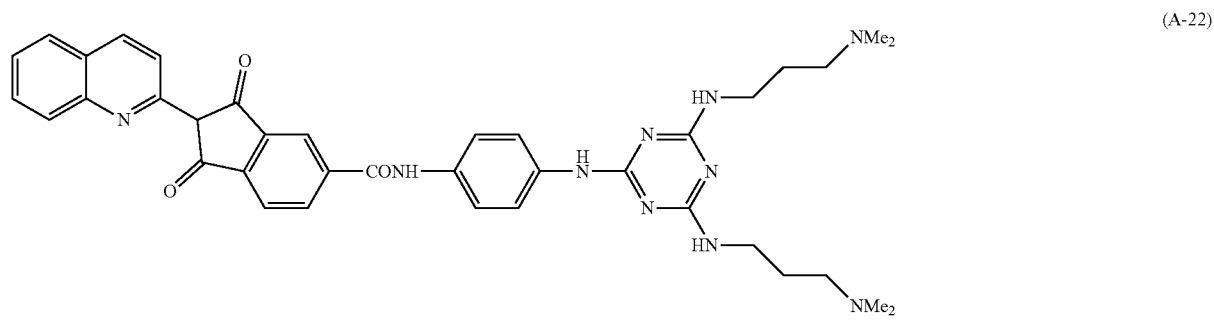
(A-22)
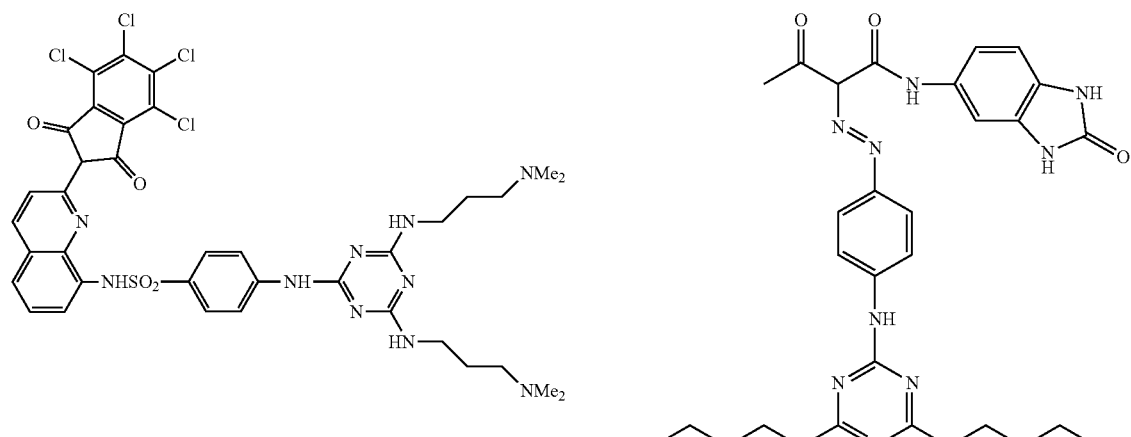
(A-23)
(A-24)
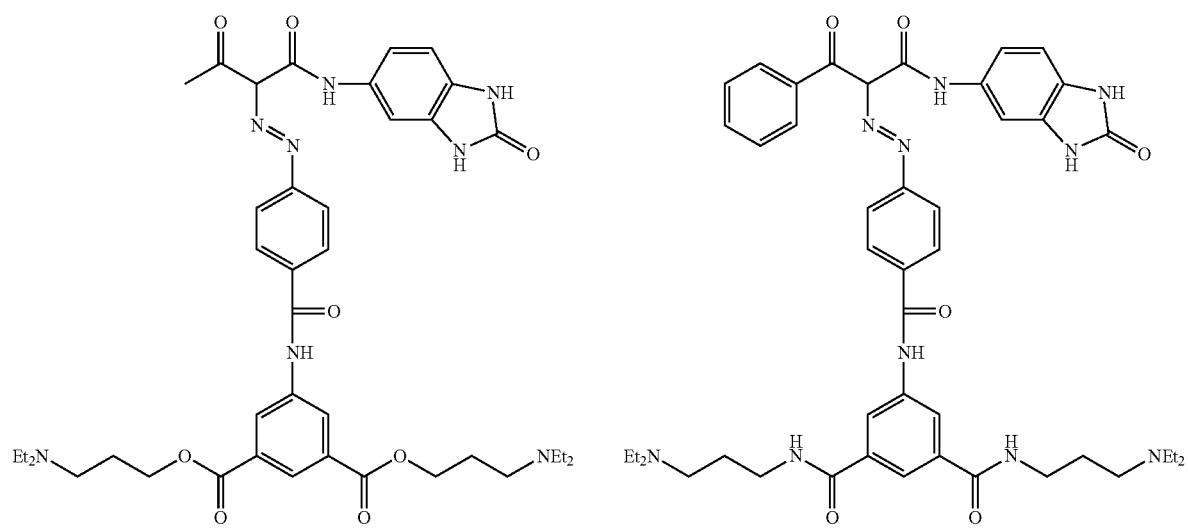
(A-25)
(A-26)

(A-27)
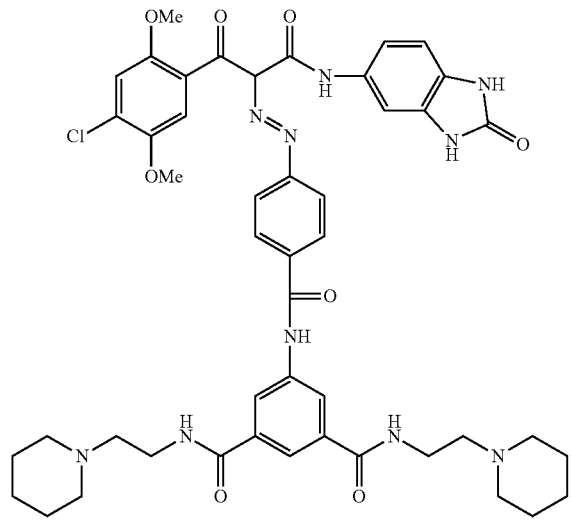
(A-28)
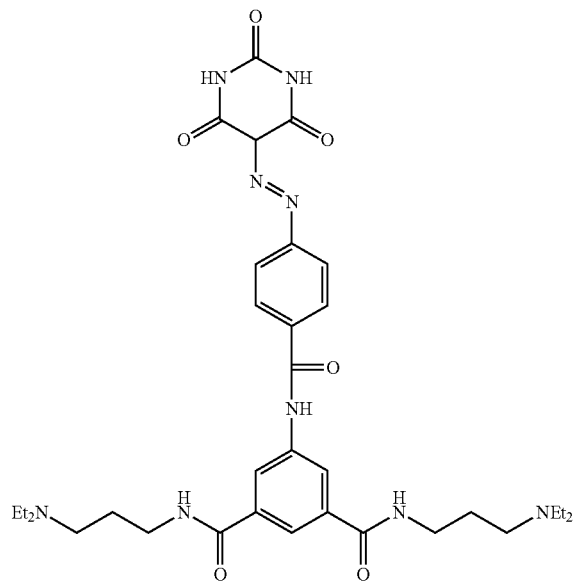
(A-29)
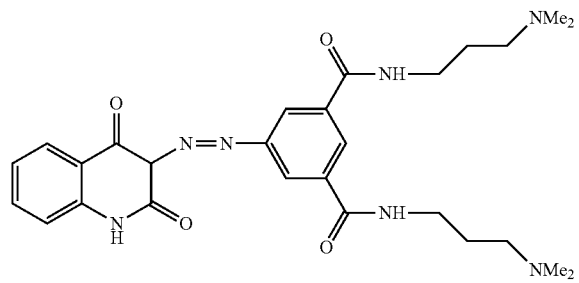
(A-30)
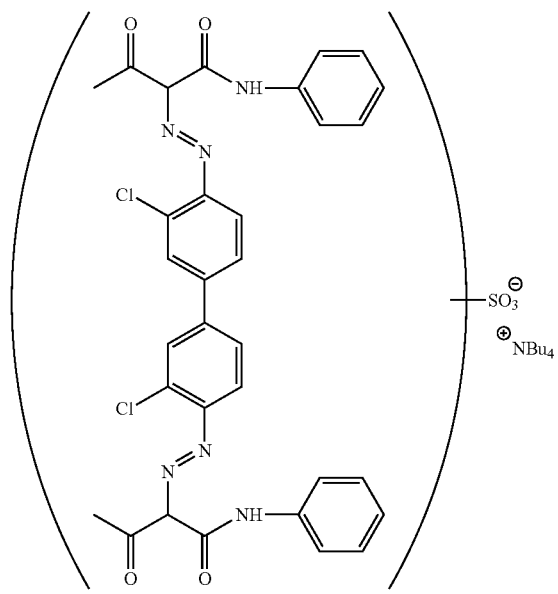
(A-31)
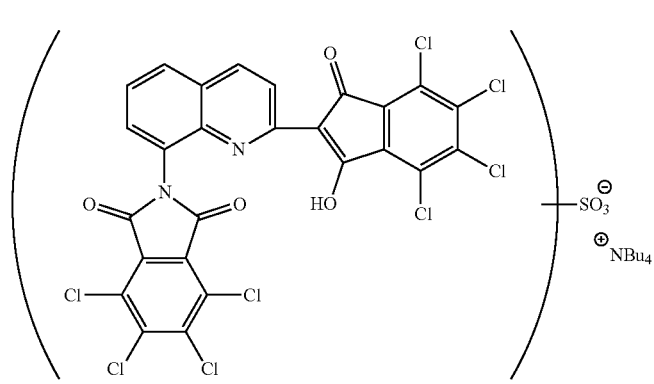

In a case where the coloring composition of the present invention contains the pigment derivative, the content of the pigment derivative is preferably 1% to 30% by mass, and more preferably 3% to 20% by mass, with respect to the mass of the pigment. The pigment derivative may be used singly or in combination of two or more kinds thereof.

<<Surfactant>>

From the viewpoint of further improving coatability, the coloring composition of the present invention may contain various surfactants. As the surfactant, various surfactants such as a fluorine-based surfactant, a non-ionic surfactant, a cationic surfactant, an anionic surfactant, and a silicon-based surfactant can be used.

By incorporating a fluorine-based surfactant into the coloring composition of the present invention, liquid characteristics (in particular, fluidity) in a case of preparation of a coating liquid using the coloring composition are further improved, and thus, the evenness of coating thickness or liquid saving properties can be further improved. That is, in a case where a film is formed using a coating liquid to which a coloring composition containing a fluorine-based surfactant has been applied, the interface tension between a surface to be coated and the coating liquid is reduced to improve wettability with respect to the surface to be coated, and enhance coatability with respect to the surface to be coated. Therefore, a film with a uniform thickness which exhibits a small extent of thickness unevenness can be more suitably formed.

The fluorine content in the fluorine-based surfactant is suitably 3% to 40% by mass, more preferably 5% to 30% by mass, and particularly preferably 7% to 25% by mass. The fluorine-based surfactant in which the fluorine content falls within this range is effective in terms of the evenness of the thickness of the coating film, liquid saving properties, and the like, and the solubility of the surfactant in the composition is also good.

Examples of the fluorine-based surfactant include MEGAFACE F171, MEGAFACE F172, MEGAFACE F173, MEGAFACE F176, MEGAFACE F177, MEGAFACE F141, MEGAFACE F142, MEGAFACE F143, MEGAFACE F144, MEGAFACE R30, MEGAFACE F437, MEGAFACE F475, MEGAFACE F479, MEGAFACE F482, MEGAFACE F554, MEGAFACE F780, and RS-72-K (all manufactured by DIC Corporation), FLUORAD FC430, FC431, and FC171 (all manufactured by Sumitomo 3M), SURFLON S-382, SURFLON SC-101, SURFLON SC-103, SURFLON SC-104, SURFLON SC-105, SURFLON SC-1068, SURFLON SC-381, SURFLON SC-383, SURFLON S-393, and SURFLON KH-40 (all manufactured by ASAHI GLASS Co., Ltd.), and PF636, PF656, PF6320, PF6520, and PF7002 (manufactured by OMNOVA). Further, as the fluorine-based surfactant, the compounds described in paragraph 0015 to 0158 of JP2015-117327A can be used. As the fluorine-based surfactant, a block polymer can also be used, and specific examples thereof include the compounds described in JP2011-89090A.

The fluorine-based surfactant can also preferably use a fluorine-containing, high molecular compound including a repeating unit derived from a (meth)acrylate compound having a fluorine atom and a repeating unit derived from a (meth)acrylate compound having 2 or more (preferably 5 or more) alkyleneoxy groups (preferably ethyleneoxy groups or propyleneoxy groups), the following compounds are also exemplified as a fluorine-based surfactant for use in the present invention.

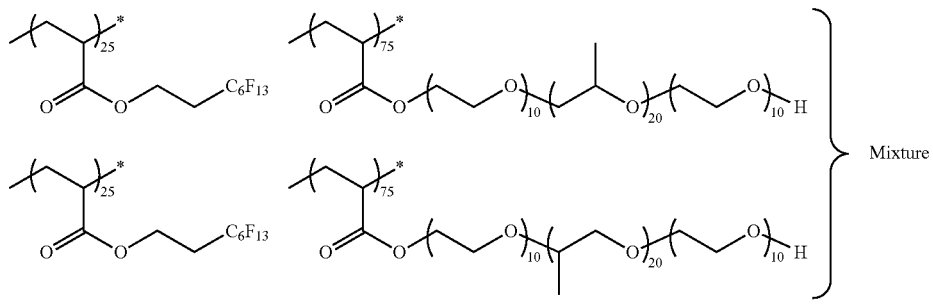

The weight-average molecular weight of the compounds is preferably 3,000 to 50,000, and is, for example 14,000.

As for the fluorine-based surfactant, a fluorine-containing polymer having an ethylenically unsaturated group in a side chain can also be used as the fluorine-based surfactant. Specific examples thereof include the compounds described in paragraphs 0050 to 0090 and paragraphs 0289 to 0295 of JP2010-164965A, such as MEGAFACE RS-101, RS-102, and RS-718K, all manufactured by DIC Corporation.

Specific examples of the non-ionic surfactant include glycerol, trimethylolpropane, trimethylolethane, and ethoxylate and propoxylate thereof (for example, glycerol propoxylate and glycerol ethoxylate), polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate, sorbitan fatty acid esters (PLURONIC L10, L31, L61, L62, 10R5, 17R2, and 25R2, and TETRONIC 304, 701, 704, 901, 904, and 150R1 manufactured by BASF), and SOLSEPERSE 20000 (manufactured by Lubrizol Japan Ltd.). Further, NCW-101, NCW-1001, or NCW-1002 manufactured by Wako Pure Chemical Industries, Ltd., or PIONIN D-6112-W or D-6315 manufactured by Takemoto Oil & Fat Co., Ltd. can also be used.

Specific examples of the cationic surfactant include a phthalocyanine derivative (trade name: EFKA-745, manufactured by MORISHITA KAGAKU SANGYO Corporation), an organosiloxane polymer KP-341 (manufactured by Shin-Etsu Chemical Co., Ltd.), a (meth)acrylic acid-based (co)polymer POLYFLOW No. 75, No. 90, and No. 95 (manufactured by KYOEISHA CHEMICAL CO., LTD.), and W001 (manufactured by Yusho Co., Ltd.).

Specific examples of the anionic surfactant include W004, W005, and W017 (manufactured by Yusho Co., Ltd.), and BL (manufactured by Sanyo Chemical Industries, Ltd.).

Examples of the silicon-based surfactant include TORAY SILICONE DC3PA, TORAY SILICONE SH7PA, TORAY SILICONE DC11PA, TORAY SILICONE SH21PA, TORAY SILICONE SH28PA, TORAY SILICONE SH29PA, TORAY SILICONE SH30PA, and TORAY SILICONE SH8400 (all manufactured by Dow Corning Toray Co., Ltd.), TSF-4440, TSF-4300, TSF-4445, TSF-4460, and TSF-4452 (all manufactured by Momentive Performance Materials Co., Ltd.), KP-341, KF6001, and KF6002 (all manufactured by Shin-Etsu Chemical Co., Ltd.), and BYK307, BYK323, and BYK330 (all manufactured by BYK Chemie). Further, as the silicon-based surfactant, the following compound can be used.

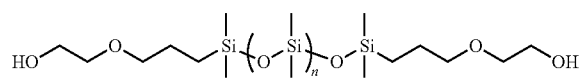

The surfactants may be used singly or in combination of two or more kinds thereof.

The content of the surfactant is preferably 0.001% to 2.0% by mass, and more preferably 0.005% to 1.0% by mass, with respect to the total solid content of the coloring composition.

<<Silane Coupling Agent>>

The coloring composition of the present invention can contain a silane coupling agent.

The silane coupling agent is also preferably a silane compound having at least two kinds of functional groups having different reactivities per molecule and particularly preferably the compound having as the functional group, an amino group and an alkoxy group. Examples of such a silane coupling agent include N-β-aminoethyl-γ-aminopropylmethyldimethoxysilane (KBM-602, trade name, manufactured by Shin-Etsu Chemical Co., Ltd.), N-β-aminoethyl-γ-aminopropyltrimethoxysilane (KBM-603, trade name, manufactured by Shin-Etsu Chemical Co., Ltd.), N-β-aminoethyl-γ-aminopropyltriethoxysilane (trade name KBE-602, manufactured by Shin-Etsu Chemical Co., Ltd.), γ-aminopropyltrimethoxysilane (KBM-903, trade name, manufactured by Shin-Etsu Chemical Co., Ltd.), γ-aminopropyltriethoxysilane (trade name KBE-903, manufactured by Shin-Etsu Chemical Co., Ltd.), and 3-methacryloxypropyltrimethoxysilane (trade name KBM-503, manufactured by Shin-Etsu Chemical Co., Ltd.). With regard to the details of the silane coupling agent, reference can be made to the descriptions in paragraph Nos. 0155 to 0158 of JP2013-254047A, the contents of which are incorporated herein by reference.

In a case where the coloring composition of the present invention includes a silane coupling agent, the content of the silane coupling agent is preferably 0.001% to 20% by mass, more preferably 0.01% to 10% by mass, and particularly preferably 0.1% by mass to 5% by mass, with respect to the total solid content of the coloring composition. The coloring composition of the present invention may include one kind or two or more kinds of the silane coupling agents. In a case where the coloring composition includes two or more kinds of the silane coupling agent, the total amount thereof preferably falls within the range.

<<Polymerization Inhibitor>>

It is also preferable that to the coloring composition of the present invention contains a small amount of a polymerization inhibitor. Examples of the polymerization inhibitor include hydroquinone, p-methoxyphenol, di-t-butyl-p-cresol, pyrogallol, t-butyl catechol, benzoquinone, 4,4'-thiobis(3-methyl-6-t-butylphenol), 2,2'-methylenebis(4-methyl-6-t-butylphenol), and an N-nitrosophenylhydroxylamine salt (an ammonium salt, a cerous salt, or the like)

In a case where the coloring composition of the present invention includes a polymerization inhibitor, the content of the polymerization inhibitor is preferably 0.01% to 5% by mass with respect to the total solid content of the coloring composition. The coloring composition of the present invention may include one kind or two or more kinds of the polymerization inhibitor. In a case where the coloring composition includes two or more kinds of the polymerization inhibitor, the total amount thereof preferably falls within the range.

<<Other Additives>>

Various additives, for example, a filler, an adhesion promoter, an antioxidant, an ultraviolet absorber, and an aggregation inhibitor can be blended into the coloring composition of the present invention, as desired. Examples of these additives include those described in paragraphs 0155 and 0156 of JP2004-295116A, the contents of which are incorporated herein by reference. As the antioxidant, for example, a phenol compound, a phosphorus-based compound (for example, the compounds described in paragraph No. 0042 of JP2011-90147A), a thioether compound, or the like can be used. Examples of a commercially available product thereof include ADEKA STAB series (AO-20, AO-30, AO-40, AO-50, AO-50F, AO-60, AO-60G, AO-80, AO-330, and the like), all manufactured by ADEKA. The antioxidant may be used as a mixture of two or more kinds thereof. The coloring composition of the present invention may contain the sensitizers or the light stabilizers described in paragraph 0078 of JP2004-295116A, or the thermal polymerization inhibitors described in paragraph 0081 of the same publication.

There are some cases where a metal element is included in the coloring composition according to raw materials and the like, but from the viewpoint of suppression of generation of defects, or the like, the content of Group 2 elements (calcium, magnesium, and the like) in the coloring composition is preferably 50 ppm or less, and preferably controlled to 0.01 to 10 ppm. Further, the total amount of the inorganic metal salts in the coloring composition is preferably 100 ppm or less, and preferably controlled to 0.5 to 50 ppm.

<Method for Producing Coloring Composition>

The coloring composition of the present invention can be produced by mixing the above-mentioned components.

In the production of the coloring composition, the respective components may be blended at the same time, or the respective components may be dissolved and/or dispersed in a solvent, and then sequentially blended.

The method for producing a coloring composition of the present invention preferably includes a step of dispersing at least one selected from a coated pigment in which at least a portion of a surface of a yellow pigment is coated with a resin, and a halogenated phthalocyanine pigment in the presence of a dispersant having an acid value of 40 mgKOH/g or more.

The dispersing step may be carried out after further adding a solvent and/or a pigment derivative, as desired.

The dispersing step can also be carried out using a dispersing device such as a bead mill.

In the dispersing step, the coated pigment and the halogenated phthalocyanine pigment may be carried out at the same time in the presence of a dispersant having an acid value of 40 mgKOH/g or more. Further, the respective pigments may be separately dispersed. That is, the dispersing step of the coated pigment and the dispersing step of the halogenated phthalocyanine pigment may also be carried out separately.

In a case where the respective pigments are separately dispersed, dispersion of any one of the coated pigment and the halogenated phthalocyanine pigment may be carried out in the presence of a dispersant having an acid value of 40 mgKOH/g or more, and dispersion of the other pigment may be carried out in the presence of a dispersant having an acid value of 40 mgKOH/g or more, or in the presence of a dispersant having an acid value of less than 40 mgKOH/g. In the present invention, it is preferable that dispersion of the coated pigment and dispersion of the halogenated phthalocyanine pigment are respectively carried out in the presence of a dispersant having an acid value of 40 mgKOH/g or more.

The dispersant used in the dispersing step may be of one kind or two or more kinds. From the viewpoint of dispersion stability, the dispersant is preferably of one kind.

By adding the respective components such as a curable compound and a photopolymerization initiator to the composition (dispersion liquid) after the dispersing step, the coloring composition of the present invention is obtained. Other components may be blended at the same time, or the respective components may be dissolved and/or dispersed in a solvent, and then sequentially blended. Further, the introduction or the operation condition during the blending is particularly not limited. For example, all the components may be dissolved and/or dispersed in a solvent to prepare a composition, or as desired, the respective components may be appropriately formed into two or more solutions or dispersion liquids, and these are mixed during use (during application) to prepare a composition.

It is preferable that in the production of the coloring composition of the present invention, filtration is performed using a filter for the purpose of removing foreign matters, reducing defects, or the like. As the filter, any filters that have been used in the related art for filtration use and the like may be used without particular limitation. Examples of the filter include filters formed of a fluorine resin such as polytetrafluoroethylene (PTFE), a polyamide-based resin such as nylon (for example, Nylon-6 and Nylon-6,6), and a polyolefin resin (including a polyolefin resin having a high density or an ultrahigh molecular weight) such as polyethylene and polypropylene (PP). Among those materials, polypropylene (including a high-density polypropylene) and nylon are preferable.

The pore diameter of the filter is suitably approximately 0.01 to 7.0 µm, preferably approximately 0.01 to 3.0 µm, and more preferably approximately 0.05 to 0.5 µm. By setting the pore diameter of the filter to the range, fine foreign matters which inhibit the preparation of a uniform composition or the formation of a smooth film in the next step can be reliably removed. In addition, a fibrous filter material is also preferably used, and examples of the filter material include a polypropylene fiber, a nylon fiber, and a glass fiber, and specifically, filter cartridges of SBP type series (SBP008 and the like) manufactured by Roki Techno Co., Ltd., TPR type series (TPR002, TPR005, and the like), or SHPX type series (SHPX003 and the like) can be used.

In a case of using the filter, different filters may be combined. Here, the filtration through the first filter may be run once, or may be repeated twice or more times.

Incidentally, the first filters having different pore diameters within the range may be combined. With regard to the pore diameter of the filter herein, reference can be made to nominal values of filter manufacturers. A commercially available filter may be selected from various filters provided by Nihon Pall Corporation (DFA4201NXEY and the like), Toyo Roshi Kaisha., Ltd., Nihon Entegris K. K. (formerly Nippon Microlith Co., Ltd.), Kitz Micro Filter Corporation, or the like, for example.

As the second filter, those formed of the same material as that of the above-described first filter may be used.

For example, the filtration through the first filter may be carried out with only a dispersion liquid, the other components may be mixed, and then the filtration through the second filter may be carried out.

The coloring composition of the present invention can be used after its viscosity is adjusted for the purposes of adjusting the state of a film surface (flatness or the like), adjusting a film thickness, or the like. The value of the viscosity can be appropriately selected as desired, and is, for example, preferably 0.3 mPa·s to 50 mPa·s, and more preferably 0.5 mPa·s to 20 mPa·s at 25° C. As for a method for measuring the viscosity, the viscosity can be measured, for example, with a temperature being adjusted to 25° C., using a viscometer RE85L (rotor: 1°34'×R24, measurement range of 0.6 to 1,200 mPa·s) manufactured by Told Sangyo Co., Ltd.

The moisture content of the coloring composition in the present invention is usually 3% by mass or less, preferably 0.01% to 1.5% by mass, and more preferably 0.1% to 1.0% by mass. In addition, the moisture content is a value measured by a Karl Fischer method.

Since the coloring composition of the present invention can form a film having excellent light fastness, it is suitably used for forming a colored layer of a color filter. In addition, the coloring composition of the present invention can be suitably used for forming a colored pattern of a color filter or the like which is used in a solid-state imaging device such as a charge coupled device (CCD) and a complementary metal-oxide semiconductor (CMOS), or an image display device such as a liquid crystal display device. In addition, the coloring composition can also be suitably used in the applications for preparing a printing ink, an ink jet ink, a coating material, and the like. Among those, the coloring composition can also be suitably used for manufacturing a color filter for a solid-state imaging device such as a CCD and a CMOS.

<<Color Filter>>

Next, the color filter of the present invention will be described.

The color filter of the present invention is formed using the above-mentioned coloring composition of the present invention. The film thickness of the color filter of the present invention can be appropriately adjusted, depending on the purposes. The film thickness is preferably 20 µm or less, more preferably 10 µm or less, and still more preferably 5 µm or less. The lower limit of the film thickness is preferably 0.1 µm or more, more preferably 0.2 µm or more, and still more preferably 0.3 µm or more. The color filter of the present invention can be used for a solid-state imaging device such as a charge coupled device (CCD) and a complementary metal-oxide semiconductor (CMOS), an image display device, or the like.

In a case where the color filter of the present invention is used in applications for a liquid crystal display device, the voltage holding ratio of a liquid crystal display element including a color filter is preferably 70% or more, and more preferably 90% or more. Known means for obtaining a high voltage holding ratio can be incorporated as appropriate, and examples of typical means include a use of high-purity materials (for example, reduction in ionic impurities) and a control of the amount of acidic functional groups in a composition. The voltage holding ratio can be measured by, for example, the methods described in paragraph 0243 of JP2011-008004A, and paragraphs 0123 to 0129 of JP2012-224847A.

<Pattern Forming Method>

The pattern forming method of the present invention includes a step of forming a coloring composition layer on a support using the coloring composition of the present invention, and a step of forming a pattern onto the coloring composition layer by a photolithographic method or a dry etching method.

Pattern formation by a photolithographic method preferably includes a step of forming a coloring composition layer on a support using the coloring composition, a step of patternwise exposing the coloring composition layer, and a step of removing unexposed areas by development to form a pattern. A step of baking the coloring composition layer (pre-baking step), and a step of baking the developed pattern (post-baking step) may be provided, as desired.

Furthermore, pattern formation by a dry etching method preferably includes a step of forming a coloring composition layer on a support using the coloring composition, a step of performing curing to form a cured product layer, a step of forming a photoresist layer on the cured product layer, a step of performing exposure and development to pattern the photoresist layer, thereby obtaining a resist pattern, and a step of dry-etching the cured product layer using the resist pattern as an etching mask to form a pattern. Hereinafter, the respective steps will be described.

<<Step of Forming Coloring Composition Layer>>

In the step of forming a coloring composition layer, the coloring composition layer is formed on a support, using the coloring composition.

As the support, a substrate for a solid-state imaging device in which a solid-state imaging device (light-receiving element) such as a CCD and a CMOS is provided onto a substrate (for example, a silicon substrate) can be used.

The pattern in the present invention may be formed on the side (front surface) of a substrate on which a solid-state imaging device is formed, or may be formed on the side (rear surface) on which a solid-state imaging device is not formed.

An undercoat layer may be provided on the support, as desired, so as to improve adhesion to a layer above the support, to prevent diffusion of materials, or to make a surface of the substrate flat.

As a method for applying the coloring composition onto the support, various coating methods such as slit coating, an ink jet method, spin coating, cast coating, roll coating, and a screen printing method can be used.

The coloring composition layer formed on the support may be dried (pre-baked). In a case of forming a pattern by a low-temperature process, pre-baking may not be performed.

In a case of performing the pre-baking, the pre-baking temperature is preferably 150° C. or lower, more preferably 120° C. or lower, and still more preferably 110° C. or lower. The lower limit may be set to, for example, 50° C. or higher, or to 80° C. or higher. By setting the pre-baking temperature to 150° C. or lower, these characteristics can be more effectively maintained in a case of a configuration in which a photo-electric conversion film of an image sensor is formed of organic materials.

The pre-baking time is preferably 10 seconds to 300 seconds, more preferably 40 to 250 seconds, and still more preferably 80 to 220 seconds. Drying can be performed using a hot plate, an oven, or the like.

(Case of Forming Pattern by Photolithographic Method)

<<<Exposing Step>>>

Next, the coloring composition layer formed on the support is patternwise exposed (exposing step). For example, the coloring composition layer can be subjected to patternwise exposure by performing exposure using an exposure device such as a stepper through a mask having a predetermined mask pattern. Thus, the exposed portion can be cured.

As the radiation (light) which can be used during the exposure, ultraviolet rays such as g-rays and i-rays (particularly preferably i-rays) are preferably used. The irradiation dose (exposure dose) is, for example, preferably 0.03 to 2.5 J/cm$^2$, and more preferably 0.05 to 1.0 J/cm$^2$.

The oxygen concentration during the exposure can be appropriately selected, and may also be performed, for example, in a low-oxygen atmosphere having an oxygen concentration of 19% by volume or less (for example, 15% by volume, 5% by volume, and substantially oxygen-free) or in a high-oxygen atmosphere having an oxygen concentration of more than 21% by volume (for example, 22% by volume, 30% by volume, and 50% by volume). Further, the exposure illuminance can be appropriately set, and can be usually selected from a range of 1,000 W/m$^2$ to 100,000 W/m$^2$ (for example, 5,000 W/m$^2$, 15,000 W/m$^2$, or 35,000 W/m$^2$). Appropriate conditions of each of the oxygen concentration and the illuminance of exposure energy may be combined, and for example, a combination of the oxygen concentration of 10% by volume and the illuminance of 10,000 W/m$^2$, a combination of the oxygen concentration of 35% by volume and the illuminance of 20,000 W/m$^2$, or the like is available.

<<<Developing Step>>>

Next, the unexposed area is removed by development to form a pattern. The removal of the unexposed area by development can be carried out using a developer. Thus, the coloring composition layer of the unexposed area in the exposing step is eluted into the developer, and as a result, only a photocured portion remains.

As the developer, an organic alkali developer causing no damage on the underlying solid-state imaging device, circuit, or the like is preferable.

The temperature of the developer is preferably for example, 20° C. to 30° C., and the development time is preferably 20 to 180 seconds. Further, in order to improve residue removing properties, a step of removing the developer by shaking per 60 seconds and supplying a new developer may be repeated multiple times.

Examples of the alkali agent used for the developer include organic alkaline compounds such as aqueous ammonia, ethylamine, diethylamine, dimethylethanolamine, tetramethylammonium hydroxide, tetraethylammonium hydroxide, tetrapropylammoniumhydroxide, tetrabutylammoniumhydroxide, benzyltrimethylammonium hydroxide, dimethylbis(2-hydroxyethyl)ammonium hydroxide, choline, pyrrole, piperidine, and 1,8-diazabicyclo-[5.4.0]-7-undecene. As to the developer, an aqueous alkaline solution obtained by diluting the alkali agent with pure water is preferably used. The concentration of the alkali agent in the aqueous alkaline solution is preferably 0.001% to 10% by mass, and more preferably 0.01% to 1% by mass.

In addition, an inorganic alkaline compound may be used as the alkali agent in a developer. As the inorganic alkaline compound, sodium hydroxide, potassium hydroxide, sodium carbonate, sodium hydrogen carbonate, sodium silicate, sodium metasilicate, or the like is preferable.

Moreover, a surfactant may also be added to the developer. Examples of the surfactant include the surfactants described as the above-mentioned curable composition, with a non-ionic surfactant being preferable.

Incidentally, in a case where a developer formed of such an aqueous alkaline solution is used, it is preferable that cleaning (rinsing) with pure water is generally performed after development.

After the development, a heating treatment (post-baking) can also be performed after carrying out drying. The post-baking is a heating treatment after development so as to complete the curing of the film. In a case of performing the post-baking, the post-baking temperature is preferably, for example, 100° C. to 240° C. From the viewpoint of curing of the film, the post-baking temperature is more preferably 200° C. to 230° C. In addition, in a case of using an organic electroluminescence (organic EL) element as a light-emitting light source of an image display device or a case of constituting a photo-electric conversion film of an image sensor with organic materials, the post-baking temperature is preferably 150° C. or lower, more preferably 120° C. or lower, still more preferably 100° C. or lower, and particularly preferably 90° C. or lower. The lower limit can be set to, for example, 50° C. or higher.

The post-baking can be carried out continuously or batchwise by using a heating unit such as a hot plate, a convection oven (hot-air circulating dryer), and a high-frequency heater so that the film after development satisfies the conditions. Further, in a case of forming a pattern by a low-temperature process, the post-baking may not be carried out.

(Case of Forming Pattern by Dry Etching Method)

Pattern formation by a dry etching method can be carried out by curing a composition layer formed on a support to form a cured product layer, then forming a patterned photoresist layer on the obtained cured product layer, and the carrying out etching using an etching gas through the photoresist layer as a mask.

Specifically, it is preferable that a positive tone or negative tone radiation-sensitive composition is applied onto a cured product layer, and dried to form a photoresist layer. For formation of the photoresist layer, it is preferable that a pre-baking treatment is further carried out. In particular, a process for forming a photoresist is preferably an aspect in which a post-exposure heating treatment or a post-development heating treatment (post-baking treatment) is carried out. With regard to the pattern formation by a dry etching method, reference can be made to the descriptions in paragraphs 0010 to 0067 of JP2013-064993A, the contents of which are incorporated herein by reference.

<Solid-State Imaging Device>

The solid-state imaging device of the present invention has the above-mentioned color filter of the present invention. The configuration of the solid-state imaging device of the present invention is not particularly limited as long as the solid-state imaging device is configured to include the color filter in the present invention and function as a solid-state imaging device. However, examples thereof include the following configurations.

The solid-state imaging device is configured to have a plurality of photodiodes constituting a light receiving area of the solid-state imaging device (a charge coupled device (CCD) image sensor, a complementary metal-oxide semiconductor (CMOS) image sensor, or the like), and a transfer electrode formed of polysilicon or the like on a substrate; have a light-shielding film having openings only over the light receiving portion of the photodiode, on the photodiodes and the transfer electrodes; have a device-protective layer formed of silicon nitride or the like, which is formed to coat the entire surface of the light-shielding film and the light receiving portion of the photodiodes, on the light-shielding film; and have a color filter on the device-protective layer. In addition, the solid-state imaging device may also be configured, for example, such that it has a light collecting means (for example, a microlens, which is the same hereinafter) on a device-protective layer under a color filter (a side closer to the substrate), or has a light collecting means on a color filter. Further, the color filter may have a structure in which a cured film forming each color pixel is embedded in, for example, a space partitioned in a lattice shape by a partition wall. The partition wall in this case preferably has a low refractive index for each color pixel. Examples of an imaging device having such a structure include the devices described in JP2012-227478A and JP2014-179577A.

<Image Display Device>

The color filter of the present invention can be used for an image display device such as a liquid crystal display device and an organic electroluminescence display device. The definitions of display devices and the details of the respective display devices are described in, for example, "Electronic Display Device (Akio Sasaki, Kogyo Chosakai Publishing Co., Ltd., published in 1990)", "Display Device (Sumiaki Ibuki, Sangyo Tosho Co., Ltd., published in 1989)", and the like. In addition, the liquid crystal display device is described in, for example, "Liquid Crystal Display Technology for Next Generation (edited by Tatsuo Uchida, Kogyo Chosakai Publishing Co., Ltd., published in 1994)". The liquid crystal display device to which the present invention can be applied is not particularly limited, and for example, the present invention can be applied to liquid crystal display devices employing various systems described in the "Liquid Crystal Display Technology for Next Generation".

EXAMPLES

Hereinbelow, the present invention will be described in more detail with reference to Examples. The materials, the amounts of materials used, the proportions, the treatment details, the treatment procedure, or the like shown in the Examples below may be modified if appropriate as long as the modifications do not depart from the spirit of the present invention. Therefore, the scope of the present invention should not be construed as being limited to the specific Examples shown below. In addition, "parts" and "%" are on a mass basis unless otherwise specified.

Furthermore, PGMEA is hereinafter an abbreviation of propylene glycol monomethyl ether acetate.

<Measurement of Weight-Average Molecular Weight>

The weight-average molecular weight was measured by the following method.

Types of columns: Columns formed by connection of TOSOH TSKgel Super HZM-H, TOSOH TSKgel Super HZ4000, and TOSOH TSKgel Super HZ2000

Developing solvent: Tetrahydrofuran

Column temperature: 40° C.

Flow amount (amount of a sample to be injected): 1.0 μL (sample concentration: 0.1% by mass)

Device name: HLC-8220GPC manufactured by Tosoh Corporation

Detector: Refractive index (RI) detector

Calibration curve base resin: Polystyrene

<Method for Measuring Acid Value>

A measurement sample was dissolved in a mixed solvent of tetrahydrofuran/water=9/1 (mass ratio), and the obtained solution was titration by neutralization with a 0.1-mol/L aqueous sodium hydroxide solution, using a potentiometric titrator (trade name: AT-510, manufactured by Kyoto Denshi K. K.) at 25° C. By using the inflection point in a titration pH curve as a titration end point, an acid value was calculated by the following equation.

$$A = 56.11 \times Vs \times 0.1 \times f/w$$

A: Acid value (mgKOH/g)

Vs: Use amount (mL) of a 0.1-mol/L aqueous sodium hydroxide solution required for titration f: Titer of a 0.1-mol/L aqueous sodium hydroxide solution w: Mass (g) (in terms of a solid content) of a measurement sample <Method of Producing Coated Pigment>

50 parts of a yellow pigment, 500 parts of sodium chloride (OSHIO MICRON MS-5 manufactured by Ako Kasei Co., Ltd.), 5 parts of a coating resin, and 100 parts of diethylene glycol were introduced into a 1-gallon stainless-made kneader (manufactured by Inoue Seisakusho Mfg Co., Ltd.), and kneaded for 9 hours. Next, the mixture was introduced into about 3 liters of water, stirred for about 1 hour with a high-speed mixer, then filtered, washed with water to remove sodium chloride and the solvent, and dried to obtain coated pigments 1 to 15.

TABLE 1

| Coated pigment | Yellow pigment | Coating resin |
|---|---|---|
| 1 | PY185 | A-1 |
| 2 | PY185 | A-2 |
| 3 | PY185 | A-3 |
| 4 | PY185 | A-4 |
| 5 | PY185 | A-5 |
| 6 | PY185 | D-1 |
| 7 | PY185 | D-2 |
| 8 | PY138 | A-1 |
| 9 | PY138 | A-2 |
| 10 | PY150 | A-1 |
| 11 | PY150 | A-2 |
| 12 | PY129 | A-1 |
| 13 | PY129 | A-2 |
| 14 | PY139 | A-1 |
| 15 | FY139 | A-2 |

(Yellow Pigment)

PY185: C. I. Pigment Yellow 185 (isoindoline-based pigment)

PY138: C. I. Pigment Yellow 138 (quinophthalone-based pigment)

PY150: C. I. Pigment Yellow 150 (azomethine-based pigment)

PY129: C. I. Pigment Yellow 129 (azomethine-based pigment)

PY139: C. I. Pigment Yellow 139 (isoindoline-based pigment)

(Coating Resin)

The following structures (the numerical values described with the respective repeating units (the numerical values described with the repeating units in the main chains) represent the contents [% by mass] of the respective repeating units, and the numerical values described with the repeating units in the side chain represent the repetition numbers of the repeating moieties)

A-1: Weight-average molecular Weight=30,000, acid value=100 mgKOH/g

A-2: Weight-average molecular Weight=15,000, acid value=80 mgKOH/g

A-3: Weight-average molecular Weight=10,000, acid value=70 mgKOH/g

A-4: Weight-average molecular Weight=5,000, acid value=100 mgKOH/g

A-5: Weight-average molecular Weight=10,000, acid value=100 mgKOH/g

D-1: Weight-average molecular Weight=25,000, acid value=45 mgKOH/g

D-2: Weight-average molecular Weight=20,000, acid value=75 mgKOH/g

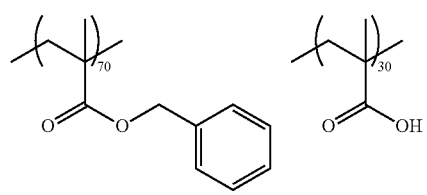

(A-1)

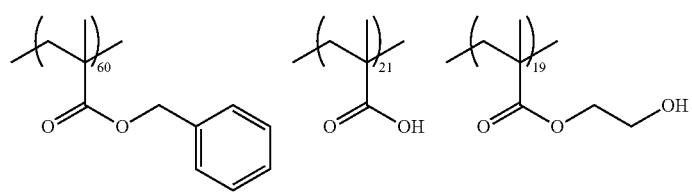

(A-2)

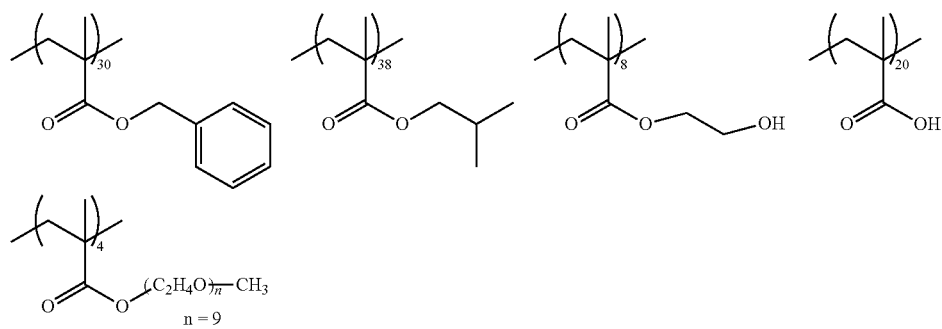

(A-3)

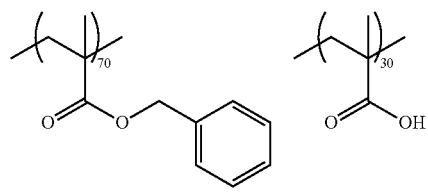

(A-4)

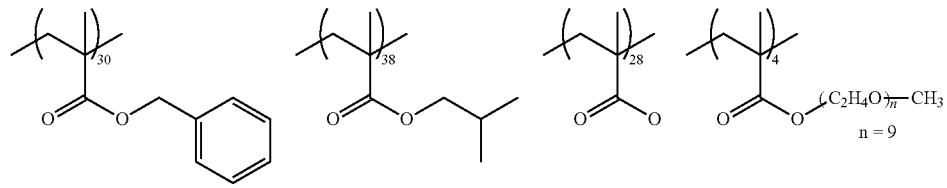

(A-5)

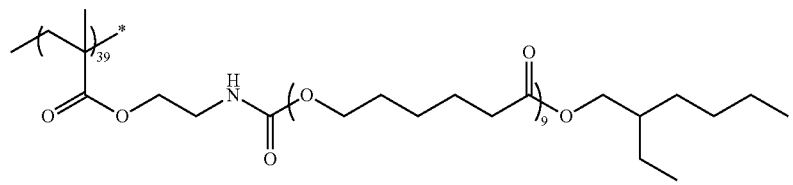

(D-1)

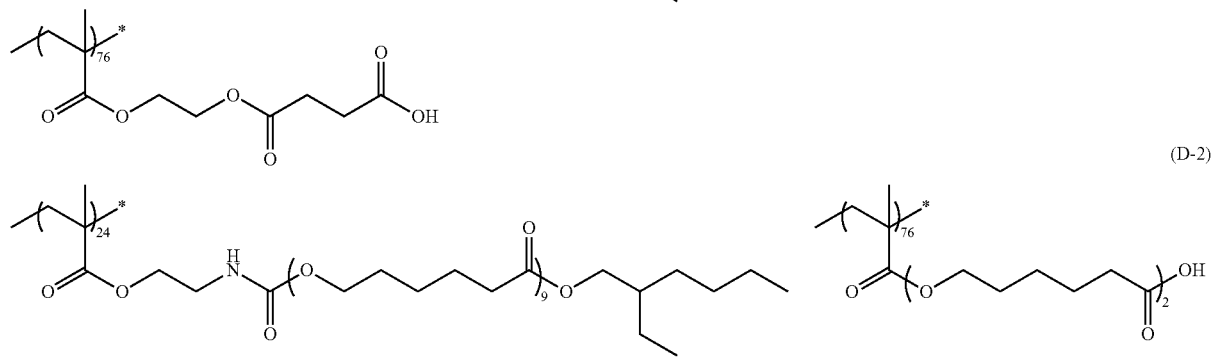

(D-2)

<Production of Yellow Pigment Dispersion Liquid>
(Dispersion Liquids DY-1 to DY-19)

The following components were mixed, and the obtained mixed solution was subjected to a dispersion treatment using ULTRA APEX MILL (trade name) manufactured by Kotobuki Industries Co., Ltd. as a circulation type dispersing device (bead mill) to obtain dispersion liquids DY-1 to -19.

(Components)

Coated pigment or yellow pigment shown below: 364 parts

Dispersant shown in the following table (30% PGMEA solution): 571 parts

Pigment derivative (S-1): 64.0 parts

PGMEA: 2,000 parts

TABLE 2

| Dispersion liquid | Coated pigment or yellow pigment | Dispersant Type | Acid value |
|---|---|---|---|
| DY-1 | Coated pigment 1 | D-1 | 45 |
| DY-2 | Coated pigment 2 | D-1 | 45 |
| DY-3 | Coated pigment 3 | D-1 | 45 |
| DY-4 | Coated pigment 4 | D-1 | 45 |
| DY-5 | Coated pigment 5 | D-1 | 45 |
| DY-6 | Coated pigment 6 | D-1 | 45 |
| DY-7 | Coated pigment 7 | D-1 | 45 |
| DY-8 | Coated pigment 8 | D-1 | 45 |
| DY-9 | Coated pigment 9 | D-1 | 45 |
| DY-10 | Coated pigment 10 | D-1 | 45 |

TABLE 2-continued

| Dispersion liquid | Coated pigment or yellow pigment | Dispersant Type | Acid value |
|---|---|---|---|
| DY-11 | Coated pigment 11 | D-1 | 45 |
| DY-12 | Coated pigment 12 | D-1 | 45 |
| DY-13 | Coated pigment 13 | D-1 | 45 |
| DY-14 | Coated pigment 14 | D-1 | 45 |
| DY-15 | Coated pigment 15 | D-1 | 45 |
| DY-16 | Coated pigment 2 | D-2 | 75 |
| DY-17 | Coated pigment 2 | D-3 | 20 |
| DY-18 | Coated pigment 2 | D-4 | 30 |
| DY-19 | PY185 | D-1 | 45 |

<Production of Halogenated Phthalocyanine Pigment Dispersion Liquid>

(Dispersion Liquids DG-1 to DG-10)

The following components were mixed, and the obtained mixed solution was subjected to a dispersion treatment, using ULTRA APEX MILL (trade name) manufactured by Kotobuki Industries Co., Ltd. as a circulation type dispersing device (bead mill), to obtain dispersion liquids DG-1 to -10.

(Components)

Halogenated phthalocyanine pigment shown in the following table: 420 parts

Dispersant shown in the following table (30% PGMEA solution): 462 parts

Pigment derivative (S-1): 52.0 parts
PGMEA: 2,077 parts

TABLE 3

| Dispersion liquid | Halogenated phthalocyanine pigment | Dispersant Type | Acid value (mgKOH/g) |
|---|---|---|---|
| DG-1 | G1 | D-1 | 45 |
| DG-2 | G1 | D-2 | 75 |
| DG-3 | G1 | D-3 | 20 |
| DG-4 | G1 | D-4 | 30 |
| DG-5 | G2 | D-1 | 45 |
| DG-6 | G3 | D-1 | 45 |
| DG-7 | G4 | D-1 | 45 |
| DG-8 | G5 | D-1 | 45 |
| DG-9 | G6 | D-1 | 45 |
| DG-10 | G7 | D-1 | 45 |

The raw materials shown in Tables 2 and 3 are as follows.

Coated pigments 1 to 15: Coated pigments produced by the method

PY185: C. I. Pigment Yellow 185 (isoindoline-based pigment)

G1: C. I. Pigment Green 58 (trade name: FASTOGEN Green A110 manufactured by DIC)

G2 to G7: Halogenated zinc phthalocyanine pigments shown in Table 4. Synthesis Examples therefor will be described later.

Pigment derivative S-1: The following structure

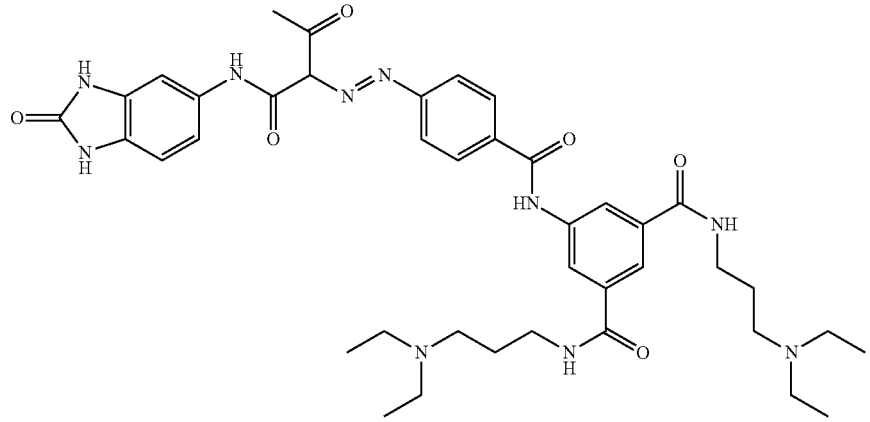 [SMILES: CCN(CC)CCCNC(=O)c1cc(NC(=O)c2ccc(/N=N/C(C(C)=O)C(=O)Nc3ccc4[nH]c(=O)[nH]c4c3)cc2)cc(C(=O)NCCCN(CC)CC)c1]

(Dispersant)

D-1: Weight-average molecular Weight=25,000, acid value=45 mgKOH/g

D-2: Weight-average molecular Weight=20,000, acid value=75 mgKOH/g

D-3: Weight-average molecular Weight=24,000, acid value=20 mgKOH/g

D-4: Weight-average molecular Weight=23,000, acid value=30 mgKOH/g (D-1)

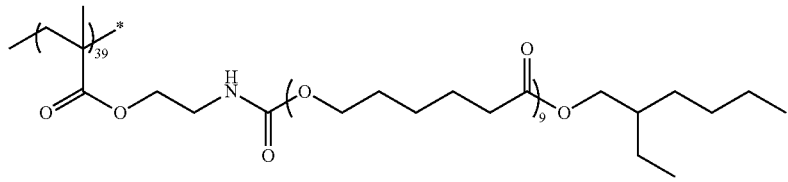

-continued

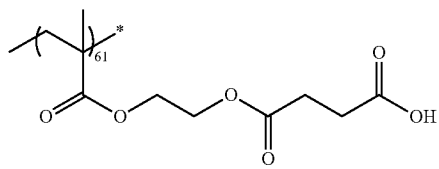

(D-2)

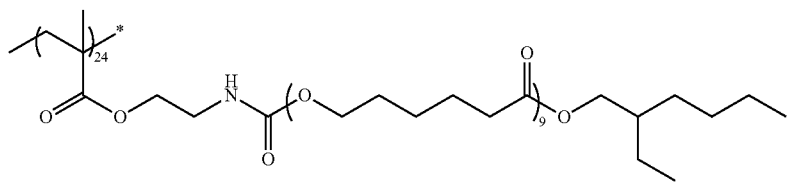

(D-3)

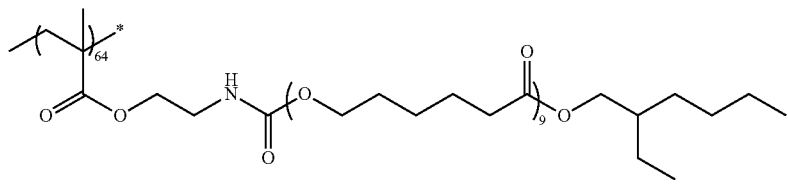

(D-4)

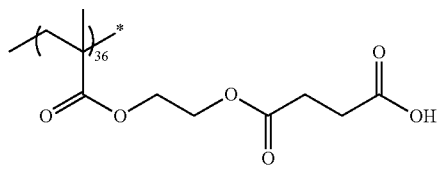

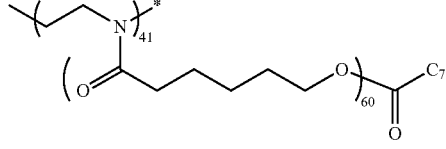

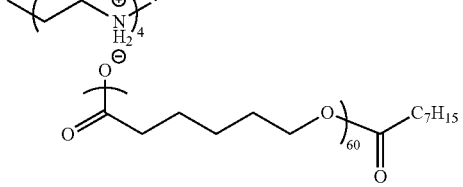

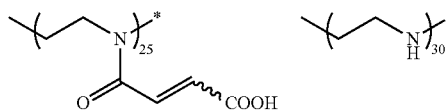

<Synthesis of Halogenated Zinc Phthalocyanine Pigment G2>

91 parts of sulfuryl chloride, 109 parts of aluminum chloride, 15 parts of sodium chloride, 30 parts of zinc phthalocyanine, and 74 parts of bromine were introduced. The temperature was raised to 130° C. for 40 hours and extracted with water, and then the residue was filtered to obtain a green colorant pigment. 20 parts of the obtained green colorant pigment, 140 parts of pulverized sodium chloride, 32 parts of diethylene glycol, and 1.8 parts of xylene were introduced into a twin-arm type kneader, and kneaded at 100° C. for 6 hours. After kneading, the product was extracted with 1,800 parts of water at 80° C., and after stirring for 1 hour, the residue was filtered, washed with hot water, dried, and pulverized to obtain a halogenated zinc phthalocyanine pigment G2.

The obtained halogenated zinc phthalocyanine pigment G2 was subjected to halogen content analysis by mass spectrometry and flask combustion ion chromatography, and it was found that the atomic ratio of halogen and hydrogen 14:2.

<Synthesis of Halogenated Zinc Phthalocyanine Pigments G3 to 7>

By the same method as for the halogenated zinc phthalocyanine pigment G2 except that the atomic ratio of halogen to hydrogen was changed as follows, halogenated zinc phthalocyanine pigments G3 to 7 were synthesized.

TABLE 4

| Halogenated zinc phthalocyanine pigment | Halogen:hydrogen (atomic ratio) |
|---|---|
| G-2 | 14:2 |
| G-3 | 13.5:2.5 |
| G-4 | 13:3 |
| G-5 | 12.5:3.5 |
| G-6 | 12:4 |
| G-7 | 11.5:4.5 |

<Preparation of Coloring Composition>

The following components were mixed to prepare a coloring composition.

(Components)

PGMEA: 16.87 parts

Alkali-soluble resin B-1 (44%-by-mass PGMEA solution): 0.99 parts

Polymerizable compound (trade name "NK ester A—TMMT" manufactured by Shin Nakamura Chemical Co., Ltd.): 2.28 parts Surfactant W-1 (0.2%-by-mass PGMEA solution, siloxane-based): 4.17 parts (solid content of 0.0083 parts)

Photopolymerization initiator (trade name "IRGACURE OXE-02" manufactured by BASF): 1.31 parts Epoxy compound (trade name "EHPE3150" manufactured by Daicel Chemical Industries, Ltd.): 0.34 parts Polymerization inhibitor (p-methoxyphenol): 0.01 parts Yellow pigment dispersion liquid: 22.95 parts (solid content of 4.59 parts)

Halogenated zinc phthalocyanine pigment dispersion liquid: 51.08 parts (solid content of 10.34 parts)

Alkali-soluble resin B-1: The following structure (weight-average molecular weight=5,000, acid value=100 mgKOH/g)

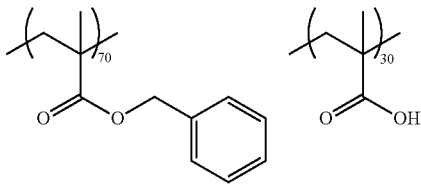

Surfactant W-1: The following structure (weight-average molecular weight of 14,000)

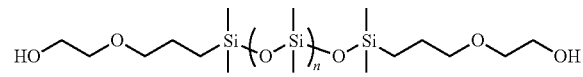

<Manufacture of Substrate for Spectroscopic Measurement>

Each of the coloring compositions was applied onto soda glass (75 mm×75 mm square, thickness of 1.1 mm) with a spin coater (H-360S [trade name], manufactured by Mikasa Co., Ltd.). Then, prebaking was carried out at 100° C. for 2 minutes, using a hot plate, to obtain a coating film.

The obtained coating film was exposed at 1,000 mJ/cm$^2$ by an ultrahigh pressure mercury lamp ("USH-500BY" (trade name)) manufactured by Ushio Inc. Subsequently, the coating film after exposure was heated on a hot plate in an air atmosphere at 200° C. for 5 minutes to obtain a cured film having a film thickness of 0.5 μm.

For the obtained cured film, a light transmittance (transmittance) in the range of 400 nm to 700 nm was measured using "MCPD-3000" (trade name) manufactured by Otsuka Electronics Co., Ltd. The test was carried out five times for each sample, and an average value of the results from the three tests excluding the maximum and minimum values was employed.

<Test for Evaluation of Light Fastness>

(Light Fastness 1)

The cured film prepared above was equipped with an ultraviolet ray-shielding filter (KU-1000100 [trade name] manufactured by AS ONE Corporation), and irradiated with light at 5,000,000 l×h for 50 hours, using a light fastness tester (Xenon Weather Meter SX75 [trade name] manufactured by Suga Test Instruments Co., Ltd.), to perform a light fastness test. A temperature of the cured film (a temperature within the test device) was set to 63° C. The relative humidity in the test device was set to 50%. The light fastness was evaluated in accordance with the following standard, depending on a variation in the transmittance of the cured film after the light fastness test.

The test was performed five times for the cured film prepared under the same conditions, and an average value of the results from the three tests excluding the maximum and minimum values was employed. Further, a variation in the transmittance indicates a variation with respect to a wavelength with the highest variation in the transmittance in the range of a wavelength of 600 nm to 700 nm (the transmittance (%) before the light fastness test–the transmittance (%) after the light fastness test).

5: The variation in the transmittance is ±3% or less.

4: The variation in the transmittance is more than ±3% and ±5% or less.

3: The variation in the transmittance is more than ±5% and ±7% or less.

2: The variation in the transmittance is more than ±7% and ±10% or less.

1: The variation in the transmittance is more than ±10%.

(Light Fastness 2) Sealing Light Fastness

A 100-nm SiO$_2$ film was vapor-deposited on the cured film prepared above by a chemical vapor deposition (CVD) method. The obtained cured film after completion of the vapor deposition treatment was equipped with an ultraviolet ray-shielding filter (KU-1000100 [trade name] manufactured by AS ONE Corporation), and irradiated with light at 5,000,000 l×h for 500 hours, using a light fastness tester (Xenon Weather Meter SX75 [trade name] manufactured by Suga Test Instruments Co., Ltd.), to perform a light fastness test. A temperature of the cured film (a temperature within the test device) was set to 63° C. The relative humidity in the test device was set to 50%. The light fastness was evaluated in accordance with the following standard, depending on a variation in the transmittance of the cured film after the Eight fastness test. The test was performed five times for the cured film prepared under the same conditions, and an average value of the results from the three tests excluding the maximum and minimum values was employed. Further, a variation in the transmittance indicates a variation with respect to a wavelength with the highest variation in the transmittance in the range of a wavelength of 600 nm to 700 (the transmittance (%) before the light fastness test–the transmittance (%) after the light fastness test).

5: The variation in the transmittance is ±3% or less.

4: The variation in the transmittance is more than ±3% and ±5% or less.

3: The variation in the transmittance is more than ±5% and ±7% or less.

2: The variation in the transmittance is more than ±7% and ±10% or less.

1: The variation in the transmittance is more than ±10%.

<Evaluation of Generation Degree of Acicular Crystals>

<<Production of Color Filter>>

(Formation of First Colored Layer (Green Layer))

The coloring composition obtained above was applied onto a 200-mm (8-inch) silicon wafer with an undercoat layer by a spin coating method using Act8 [trade name] manufactured by Tokyo Electron Ltd. such that the film thickness after application reached 0.5 μm, and then heated on a hot plate at 100° C. for 2 minutes to obtain a cured film.

For the obtained cured film, the pattern in 1.0 μm×1.0 μm square was exposed through a mask, using an i-ray stepper exposure device "FPA-3000i5+" (trade name, manufactured by Canon Inc.). As an exposure dose herein, an exposure dose (Eopt) at a time when the pattern size after the following post-baking treatment reached 1.0 μm was measured in advance, and the exposure dose was used.

Subsequently, the cured film after exposure was evaluated on developability, using a development device (Act8 [trade name] manufactured by Tokyo Electron Ltd.). Shower development was carried out at 23° C. for 60 seconds, using a 0.3% aqueous solution of tetramethylammonium hydroxide (TMAH) as the developer. Thereafter, rinsing was carried out by spin shower using pure water to obtain a pattern. Then, a post-baking treatment was carried out on a hot plate at 220° C. for 5 minutes.

(Formation of Second Colored Layer (Blue Layer))

The following blue coloring composition was applied onto the first colored layer (green layer) obtained above such that the thickness after drying and post-baking reached 0.40 μm, and then dried to obtain a cured film having a second colored layer (blue layer) formed thereon on the first colored layer (green layer).

For the obtained cured film, the pattern in 1.0 μm×1.0 μm square was exposed through a mask, using an i-ray stepper exposure device "FPA-3000i5+" (trade name, manufactured by Canon Inc.). In the similar manner to a case with formation of the first colored layer, as an exposure dose herein, an exposure dose (Eopt) at a time when the pattern size after the following post-baking treatment reached 1.0 μm was measured in advance, and the exposure dose was used. At this time, an exposure operation was carried out such that a pattern was generated at a position in which the side surface of the second colored layer was in contact with the first colored layer in an area having no first colored layer present therein (an unexposed area in the preparation of the first colored layer, which was peeled during development).

Subsequently, the cured film after exposure was evaluated on developability, using a development device (Act8 [trade name] manufactured by Tokyo Electron Ltd.). Shower development was carried out at 23° C. for 60 seconds, using a 0.3% aqueous solution of tetramethylammonium hydroxide (TMAH) as the developer. Thereafter, rinsing was carried out by spin shower using pure water to obtain a pattern. Then, a post-baking treatment was carried out on a hot plate at 220° C. for 5 minutes.

As a result, a pattern in 1.0 μm×1.0 μm square, in which the first colored layer (green layer) was adjacent to the second colored layer (blue layer), was prepared.

<<Evaluation of Generation Degree of Acicular Crystals>>

The substrate after the post-baking of the second colored layer and the substrate which had been further baked at 240° C. to 260° C. for 5 minutes were observed at a magnification of 20,000 with a critical scanning electron microscope (S-9260, a scanning electron microscope, manufactured by Hitachi Ltd.), and the generation degree of acicular crystals was evaporated.

5: Acicular crystals are not generated after post-baking (220° C./5 minutes) and even after further baking at 260° C./5 minutes.

4: Acicular crystals are not generated after post-baking (220° C./5 minutes) and even after further baking at 250° C./5 minutes, but are generated after further baking at 260° C./5 minutes.

3: Acicular crystals are not generated after post-baking (220° C./5 minutes) and even after further baking at 240° C./5 minutes, but are generated after further baking at 250° C./5 minutes.

2: Acicular crystals are not generated after post-baking (220° C./5 minutes), but are generated after further baking at 240*C/5 minutes.

1: Acicular crystals are generated after post-baking (220° C./5 minutes).

[Blue Coloring Composition]

A mixed solution of 9.5 parts of C. I. Pigment Blue 15:6, 2.4 parts of C. I. Pigment Violet 23, 5.6 parts of Disperbyk-161 (manufactured by BYK Chemie), and 82.5 parts of PGMEA was mixed and dispersed by a bead mill for 15 hours to prepare a blue pigment dispersion liquid.

Using the above-mentioned blue pigment dispersion liquid, the following components were mixed and stirred to prepare a blue coloring composition.

(Components)

Blue pigment dispersion liquid: 51.2 parts

Photopolymerization initiator (IRGACURE OXE-01 (manufactured by BASF)): 0.87 parts Polymerizable compound (KAYARAD RP-1040 (manufactured by Nippon Kayaku Co., Ltd.)): 4.7 parts Alkali-soluble resin (ACA230AA (manufactured by Daicel Chemical Industries, Ltd.)): 7.4 parts Polymerization inhibitor (p-methoxyphenol): 0.002 parts Non-ionic surfactant (PIONIN D-6112-W (manufactured by Takemoto Oil & Fat Co., Ltd.)): 0.19 parts Silane coupling agent (0.9% cyclohexanone solution of KBM-602 (manufactured by Shin-Etsu Chemical Co., Ltd.)): 10.8 parts PGMEA: 14.3 parts Cyclohexanone: 6.4 parts Fluorine-based surfactant (0.2% cyclohexanone solution of the following mixture (Mw=14,000)): 4.2 parts

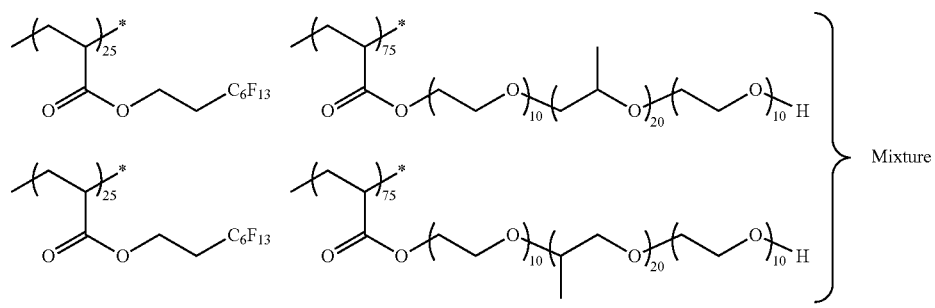

TABLE 5

| | Halogenated phthalocyanine pigment dispersion liquid | | | Yellow pigment dispersion liquid | | | | | Evaluation results | | |
|---|---|---|---|---|---|---|---|---|---|---|---|
| | Type | Dispersant | Acid value (mgKOH/g) of dispersant | Type | Yellow pigment | Coating resin | Dispersant | Acid value (mgKOH/g) of dispersant | Light fastness 1 | Light fastness 2 | Acicular crystal |
| Example 1 | DG-1 | D-1 | 45 | DY-1 | PY185 | A-1 | D-1 | 45 | 5 | 4 | 5 |
| Example 2 | DG-1 | D-1 | 45 | DY-2 | PY185 | A-2 | D-1 | 45 | 5 | 4 | 5 |
| Example 3 | DG-1 | D-1 | 45 | DY-3 | PY185 | A-3 | D-1 | 45 | 5 | 5 | 5 |
| Example 4 | DG-1 | D-1 | 45 | DY-4 | PV185 | A-4 | D-1 | 45 | 5 | 5 | 5 |
| Example 5 | DG-1 | D-1 | 45 | DY-5 | PY185 | A-5 | D-1 | 45 | 5 | 5 | 5 |
| Example 6 | DG-1 | D-1 | 45 | DY-6 | PY185 | D-1 | D-1 | 45 | 4 | 4 | 5 |
| Example 7 | DG-1 | D-1 | 45 | DY-7 | PY185 | D-2 | D-1 | 45 | 4 | 4 | 5 |
| Example 8 | DG-1 | D-1 | 45 | DY-8 | PY138 | A-1 | D-1 | 45 | 4 | 3 | 4 |
| Example 9 | DG-1 | D-1 | 45 | DY-9 | PY138 | A-2 | D-1 | 45 | 4 | 3 | 4 |
| Example 10 | DG-1 | D-1 | 45 | DY-10 | PY150 | A-1 | D-1 | 45 | 4 | 3 | 4 |
| Example 11 | DG-1 | D-1 | 45 | DY-11 | PY150 | A-2 | D-1 | 45 | 4 | 3 | 4 |
| Example 12 | DG-1 | D-1 | 45 | DY-12 | PY129 | A-1 | D-1 | 45 | 4 | 3 | 4 |
| Example 13 | DG-1 | D-1 | 45 | DY-13 | PY129 | A-2 | D-1 | 45 | 4 | 3 | 4 |
| Example 14 | DG-1 | D-1 | 45 | DY-14 | PY139 | A-1 | D-1 | 43 | 5 | 4 | 4 |
| Example 15 | DG-1 | D-1 | 45 | DY-15 | PY139 | A-2 | D-1 | 45 | 5 | 4 | 4 |
| Example 16 | DG-2 | D-2 | 75 | DY-16 | PY185 | A-2 | D-2 | 75 | 5 | 4 | 5 |
| Example 17 | DG-5 | D-1 | 45 | DY-1 | PY185 | A-1 | D-1 | 45 | 5 | 4 | 5 |
| Example 18 | DG-6 | D-1 | 45 | DY-8 | PY138 | A-1 | D-1 | 45 | 4 | 3 | 4 |
| Example 19 | DG-7 | D-1 | 45 | DY-10 | PY150 | A-1 | D-1 | 45 | 4 | 3 | 4 |
| Example 20 | DG-8 | D-1 | 45 | DY-11 | PY150 | A-2 | D-1 | 45 | 4 | 3 | 4 |
| Example 21 | DG-9 | D-1 | | DY-12 | PY129 | A-1 | D-1 | 45 | 4 | 3 | 4 |
| Example 22 | DG-10 | D-1 | 45 | DY-13 | PY129 | A-2 | D-1 | 45 | 4 | 3 | 4 |
| Comparative Example 1 | DG-3 | D-3 | 20 | DY-17 | PY185 | A-2 | D-3 | 20 | 1 | 1 | 3 |
| Comparative Example 2 | DG-4 | D-4 | 30 | DY-18 | PY185 | A-2 | D-4 | 30 | 1 | 1 | 3 |
| Comparative Example 3 | DG-1 | D-1 | 45 | DY-19 | PY185 | — | D-1 | 45 | 2 | 1 | 2 |
| Comparative Example 4 | DG-1 | D-1 | 45 | — | — | — | — | — | 3 | 1 | 1 |

From the results, in Examples, the light fastness was excellent. Further, it was difficult for the acicular crystals to be generated.

In contrast, in Comparative Examples, the light fastness was deteriorated. In particular, the sealing light fastness (light fastness 2) was deteriorated.

What is claimed is:

1. A coloring composition comprising:
   a coated pigment in which at least a portion of a surface of a yellow pigment is coated with a resin;
   a halogenated phthalocyanine pigment;
   a dispersant having an acid value of 40 mgKOH/g or more;
   a curable compound; and
   a photopolymerization initiator which contains an oxime compound,
   wherein the yellow pigment is an azomethine-based yellow pigment which is C. I. Pigment Yellow 129,
   a surface of the halogenated phthalocyanine pigment is not coated with a resin,
   the coloring composition contains the halogenated phthalocyanine pigment in the amount of 100 to 600 parts by mass with respect to 100 parts by mass of the coated pigment,
   the acid value of the resin coating the surface of the yellow pigment is 40 to 200 mgKOH/g,
   the difference between the acid value of the resin coating the surface of the yellow pigment and the acid value of the dispersant is 100 mgKOH/g or less,
   the weight-average molecular weight of the resin coating the surface of the yellow pigment is 5,000 to 40,000, and
   the curable compound contains a trifunctional to pentadecafunctional (meth)acrylate compound.

2. The coloring composition according to claim 1, wherein the halogenated phthalocyanine pigment is a halogenated zinc phthalocyanine pigment.

3. The coloring composition according to claim 1, further comprising a pigment derivative having a basic group.

4. The coloring composition according to claim 3, wherein the basic group is an amino group.

5. A color filter using the coloring composition according to claim 1.

6. A solid-state imaging device comprising the color filter according to claim 5.

7. An image display device comprising the color filter according to claim 5.

8. A pattern forming method comprising:
   forming a coloring composition layer on a support, using the coloring composition according to claim 1; and
   forming a pattern on the coloring composition layer by a photolithographic method or a dry etching method.

* * * * *